United States Patent [19]

Lipovski et al.

[11] Patent Number: 5,777,608
[45] Date of Patent: Jul. 7, 1998

[54] APPARATUS AND METHOD FOR IN-PARALLEL SCAN-LINE GRAPHICS RENDERING USING CONTENT-SEARCHABLE MEMORIES

[75] Inventors: G. Jack Lipovski; David M. Mielke, both of Austin, Tex.

[73] Assignee: Board of Regents, The University of Texas System, Austin, Tex.

[21] Appl. No.: 203,898

[22] Filed: Mar. 1, 1994

Related U.S. Application Data

[63] Continuation-in-part of Ser. No. 987,008, Dec. 7, 1992, which is a continuation-in-part of Ser. No. 577,991, Sep. 5, 1990, Pat. No. 5,184,325, which is a continuation-in-part of Ser. No. 321,847, Mar. 10, 1989, Pat. No. 4,989,180.

[51] Int. Cl.$^6$ .................................................. G09G 5/36
[52] U.S. Cl. ........................................ 345/189; 345/190
[58] Field of Search ............................. 345/185, 187, 345/189, 201, 200, 196, 119, 120, 121, 122, 124, 125, 126; 365/49

[56] References Cited

U.S. PATENT DOCUMENTS

| | | | |
|---|---|---|---|
| 3,508,220 | 4/1970 | Stampler | 340/174 |
| 3,810,108 | 5/1974 | Krewson et al. | 340/172.5 |
| 3,997,882 | 12/1976 | Goyal | 340/173 AM |
| 4,065,756 | 12/1977 | Panigrahi | 365/49 |
| 4,172,282 | 10/1979 | Aichelmann et al. | 364/200 |

(List continued on next page.)

OTHER PUBLICATIONS

Bush, "As We May Think," *Atlantic Monthly*, pp. 101–108 (Jul. 1947).

Lee, "Intercommunicating Cells, Basis for a Distributed Logic Computer," *Proc. FJCC*, pp. 130–136 (1962).

Lee et al., "A Content Addressable Distributed Logic Memory with Applications to Information Retrieval," *Proceedings of the IEEE*, vol. 51, pp. 924–932 (Jun. 1963).

(List continued on next page.)

*Primary Examiner*—Chanh Nguyen
*Attorney, Agent, or Firm*—Louis J. Hoffman

[57] ABSTRACT

Less-expensive, faster graphics display can be achieved by an in-parallel scan-line rendering system using a content-searchable memory based on a modified DRAM requiring periodic refresh that includes logical operation circuitry within the refresh circuitry. Data at individual storage locations of the DRAM are periodically read by a refresh amplifier, then a logical operation is performed on the refresh data before application to the write amplifier, allowing searching by data compare and mathematical operations. The data words of the content-searchable memory are loaded with data defining the multi-axis location of each of the vertices of a polygonal facet of an object in the scene and display information concerning the facet, such as color or texture. Data representing out-of-view objects can be culled, and the remaining objects projected onto a viewport, all through in-parallel manipulations in the content-searchable memory. For each span along the scan line, a span processor selects the facet closest to the viewport, and data from the selected facet is applied to an electronic display.

25 Claims, 27 Drawing Sheets

U.S. PATENT DOCUMENTS

| | | | |
|---|---|---|---|
| 4,185,323 | 1/1980 | Johnson et al. | 365/222 |
| 4,232,376 | 11/1980 | Dion et al. | 365/222 |
| 4,277,838 | 7/1981 | Chambers | 365/222 |
| 4,450,520 | 5/1984 | Hollaar et al. | 364/200 |
| 4,507,748 | 3/1985 | Cotton | 364/749 |
| 4,590,465 | 5/1986 | Fuchs | 340/723 |
| 4,598,400 | 7/1986 | Hillis | 370/60 |
| 4,636,982 | 1/1987 | Takemae et al. | 365/230.06 |
| 4,646,306 | 2/1987 | Davis et al. | 371/49.2 |
| 4,677,592 | 6/1987 | Sakurai et al. | 365/222 |
| 4,701,879 | 10/1987 | Scarr | 365/49 |
| 4,706,221 | 11/1987 | Satoh et al. | 365/222 |
| 4,709,327 | 11/1987 | Hillis et al. | 364/200 |
| 4,710,935 | 12/1987 | Kim et al. | 371/49.2 |
| 4,716,552 | 12/1987 | Maltiel et al. | 365/222 |
| 4,718,041 | 1/1988 | Baglee et al. | 365/185 |
| 4,747,072 | 5/1988 | Robinson et al. | 364/900 |
| 4,748,439 | 5/1988 | Robinson et al. | 340/146.2 |
| 4,749,887 | 6/1988 | Sanwo et al. | 371/49.2 |
| 4,775,810 | 10/1988 | Suzuki et al. | 371/49.2 |
| 4,783,649 | 11/1988 | Fuchs et al. | 340/747 |
| 4,794,559 | 12/1988 | Greenberger | 365/49 |
| 4,799,192 | 1/1989 | Wade et al. | 365/49 |
| 4,831,585 | 5/1989 | Wade et al. | 365/49 |
| 4,833,642 | 5/1989 | Ooi | 365/49 |
| 4,835,733 | 5/1989 | Powell | 264/900 |
| 4,931,994 | 6/1990 | Matsui et al. | 365/205 |
| 4,989,180 | 1/1991 | Lipovski | 365/189.07 |
| 4,991,136 | 2/1991 | Mihara | 365/49 |
| 5,184,325 | 2/1993 | Lipovski | 365/189.07 |
| 5,214,715 | 5/1993 | Carpenter et al. | 382/15 |
| 5,285,411 | 2/1994 | McAulay | 365/49 |
| 5,363,476 | 11/1994 | Kurashige et al. | 395/119 |
| 5,412,763 | 5/1995 | Knoplioch et al. | 395/120 |
| 5,465,323 | 11/1995 | Mallet | 395/123 |

OTHER PUBLICATIONS

Crane et al., "Bulk Processing in Distributed Logic Memory," *IEEETC*, Vol. EC–14, pp. 189–196 (Apr. 1965).

Slotnick, "Logic Per Track Devices," *Advances in Computers*, pp. 291–296 (1971).

Batcher, "The Flip Network in Staran," *Proc 1976 Int. Conf. on Parallel Processing*, pp. 65–71 (Aug. 1976).

Lipovski, "Architectural Features of CASSM: A Context Addressed Segment Sequential Memory," *Proceedings of the 5th ISCA*, pp. 31–38 (Apr. 3–5, 1978).

Bray et al., "Data Base Computers," pp. 106–120 (D.C. Heath & Co. 1979).

Hollaar, "Text Retrieval Computers," *Computer*, vol. 12, No. 3, pp. 40–52 (1979).

Fuchs et al., "Developing Pixel–Planes, A Smart Memory–Based Raster Graphics System," 1982 Conference on Advanced Research in VLSI, pp. 371–380 (MIT Jan. 27, 1982).

"Graphics Interface '82," pp. 376–380 (1982, author and source unknown).

Clark, "The Geometry Engine: A VLSI Geometry System for Graphics," *Computer Graphics*, pp. 127–133 (vol. 16, No. 3, Jul. 1982).

*IC Memories Data Book*, pp. 356–363 (Hitachi Mar. 1987).

Hodges et al., "Semiconductor Memories," *Analysis and Design of Digital Integrated Circuits*, Sec. 9.3, pp. 372–380 (McGraw–Hill, 2nd ed. 1988).

Lineback, "SEEQ's 512–KBIT Flash EEPROMs Support In–System Programming on 12–v Supply" (1988).

Akeley, et al., "High–Performance Polygon Rendering," *Computer Graphics*, pp. 239–246 (vol. 22, No. 4, Aug. 1988).

Deering, et al., "The Triangle Processor and Normal Vector Shader: A VLSI System for High Performance Graphics," *Computer Graphics*, pp. 21–30 (vol. 22, No. 4, Aug. 1988).

Gharachorloo et al., "Subnanosecond Pixel Rendering with Million Transistor Chips," *Computer Graphics*, pp. 41–49 (vol. 22, No. 4, Aug. 1988).

Johnson, "Design and Analysis of Fault–Tolerant Digital Systems," pp. 63–65 (Addison–Wesley 1989).

Rbinson, "Chameleon: A Pattern Matching Memory System," Technical Report HPL–SAL–89–24 (Hewlett Packard Co. Apr. 19, 1989).

Akeley, "Superworkstation, The Silicon Graphics 4D/240GTX Superworkstation," *IEEE Computer Graphics & Applications*, pp. 71–83 (Jul. 1989).

Fuchs, et al., "Pixel–Planes 5: A Heterogeneous Multiprocessor Graphics System Using Processor–Enhanced Memories," *Computer Graphics*, pp. 79–88 (vol. 23, No. 3, Jul. 1989).

Grimes, "The Intel i860 64–Bit Processor: A General–Purpose CPU with 3D Graphics Capabilities," *IEEE Computer Graphics & Applications*, pp. 85–88 (Jul. 1989).

Potmesil et al., "The Pixel Machine: A Parallel Image Computer," *Computer Graphics*, pp. 69–78 (vol. 23, No. 3, Jul. 1989).

Kirk, et al., "The Rendering Architecture of the DN10000VS," *Computer Graphics*, pp. 299–307 (vol. 24, No. 4, Aug. 1990).

Lipovski, G. J., "A Four Megabit Dynamic Systolic Associative Memory Chip," Dept. of Elec. and Computer Engr., Univ. of Texas, Austin, Texas (Sep. 4, 1990).

Thompson, Karl Kelvin, "Ray Tracing with Amalgams," Dissertation, University of Texas at Austin (May 1991).

Loveria, "New 3–D Graphics Engines Give PCs Workstation Power," *BYTE*, pp. 313–318 (Nov. 1991).

Molnar, et al., "PixelFlow: High–Speed Rendering Using Image Composition," *Computer Graphics*, pp. 231–240 (vol. 26, No. 2, Jul. 1992).

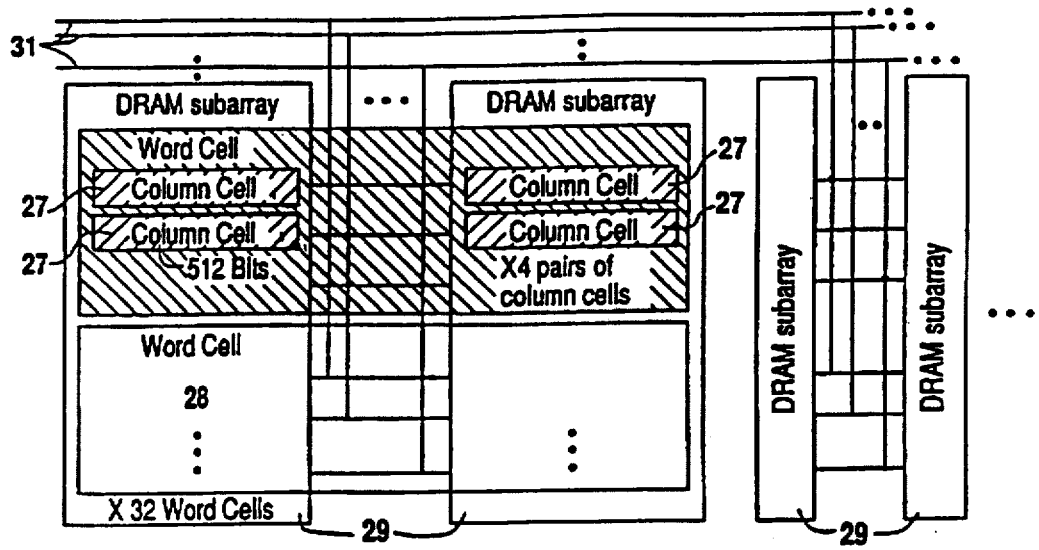
Fig. 6
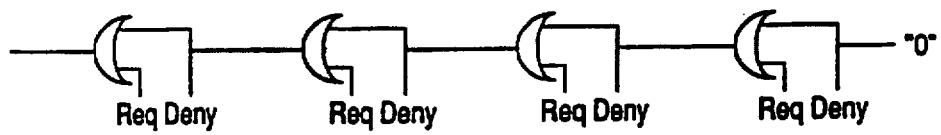
Fig. 8
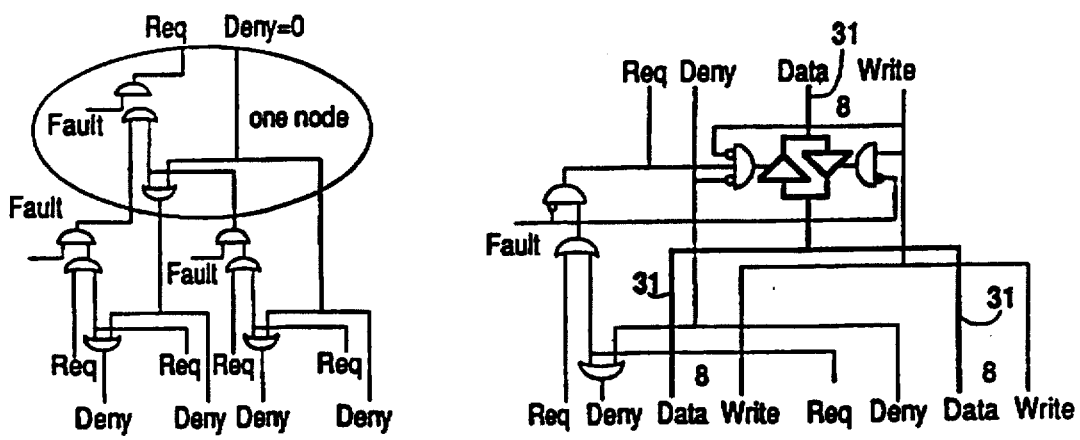
Fig. 9
Fig. 10

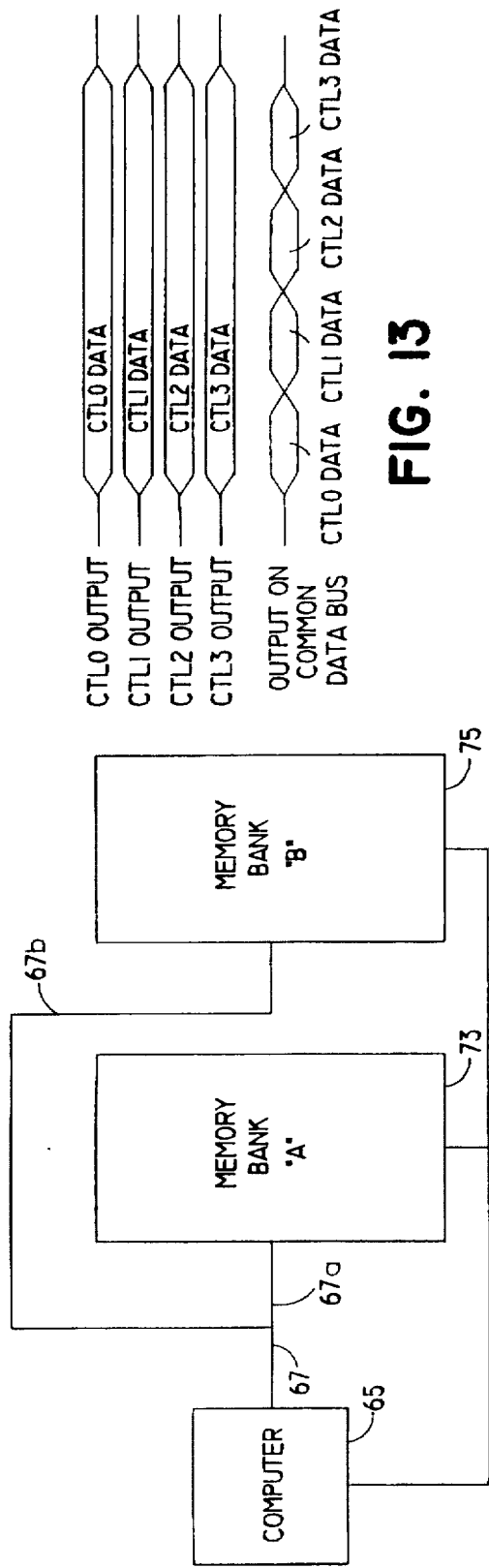
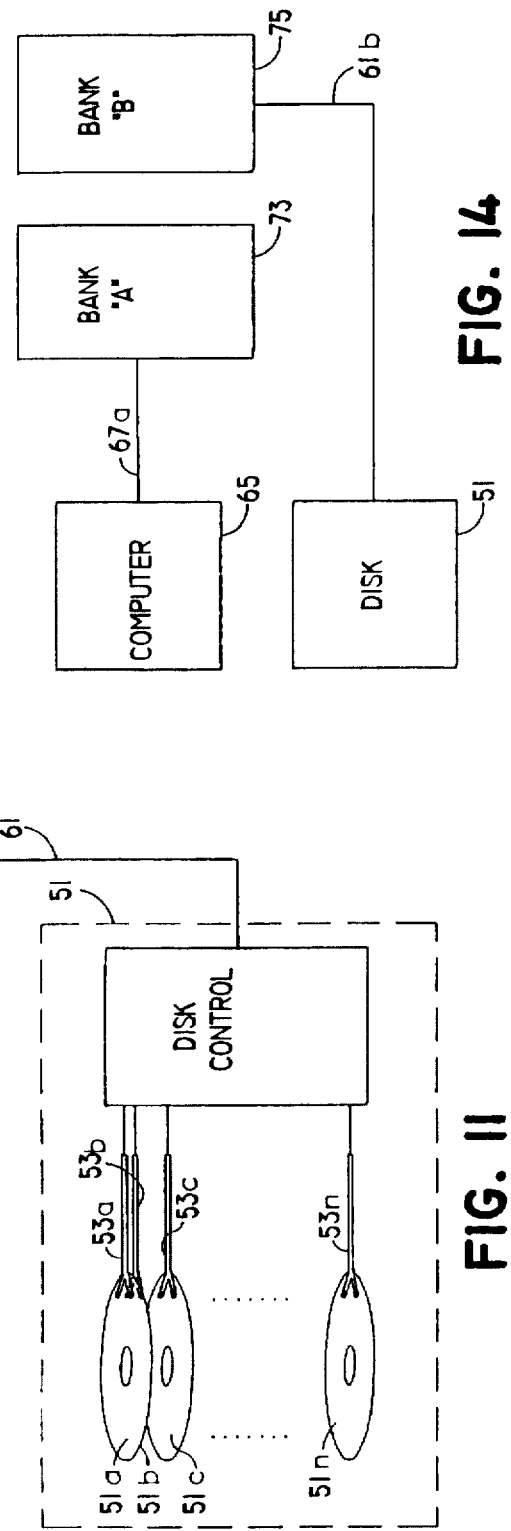

```
C     %1xxxxxxx    if carry set
MW    %0xxxxxxx    clear the carry
C     %xxxx1xx0    if a0 is 1 and b0 is 0
MW    %0xxxxxx1    make the carry 0 and make b0 1
CNA   %xxxx1xx1    if a0 is 1 and b0 is 1 (but not if the byte
                       was changed in the previous instruction)
MW    %1xxxxxx0    make carry 1 and b0 0
C     %1xx0xx0x    if carry is 1 and a1 is 0 and b1 is 0
CO    %0xx1xx0x    or if carry is 0 and a1 is 1 and b1 is 0
MW    %0xxxxx1x    make carry 1 and b1 1
CNA   %0xx1xx1x    if a1 is 1 and b1 is 1 (but not if the byte
                       was changed in the previous instruction)
CO    %1xx0xx1x    or carry is 1, a1 is 0, and b1 is 1
MW    %11xxxx0x    make carry 1, mid carry 1, and b1 0
C     %1x0xx0xx    if carry is 1, a2 is 0, and b2 is 0
CO    %0x1xx0xx    or carry is 0, a2 is 1, and b2 is 0
MW    %0xxxx1xx    make carry 0 and b2 1
CNA   %0x1xx1xx    if carry is 0, a2 is 1, and b2 is 1 (but not if
                       the byte was changed in the previous instruction)
CO    %1x0xx1xx    or carry is 1, a2 is 0, and b2 is 1
MW    %1xxxx0xx    make carry 1 and b2 0
C     %1xxxxxxx    if carry is 1 (after the compare), read the byte
                       having b5,b4,b3,a5,a4,a3 into sense amps
MW    %1xxxxxxx    write 1 in carry of the newly read byte (this
                       transfers the previously computed carry to this byte)
******This begins similar operations on bits 3,4 and 5.
C     %1xxx0xx0    if carry is 1, a3 is 0, and b3 is 0
CO    %0xxx1xx0    or carry is 0, a3 is 1, and b3 is 1
MW    %0xxxxxx1    make carry 0 and b3 1
CNA   %0xxx1xx1    if carry is 0, a3 is 1, and b3 is 1 (but not if the
                       byte was changed in the previous instruction)
CO    %1xxx0xx1    or if carry is 1, a3 is 0, and b3 is 1
MW    %1xxxxxx0    make carry 1 and b3 0
C     %1xx0xx0x    if carry is 1, a4 is 0, and b4 is 0
CO    %0xx1xx0x    or carry is 0, b4 is 1, and a4 is 0
MW    %0xxxxx1x    make carry 0 and b4 1
CNA   %0xx1xx1x    if carry is 0, a4 is 1, and b4 is 1 (but not if the
                       byte was changed in the previous instruction)
```

FIG. 21a

```
CO    %1xx0xx1x    or carry is 1, a4 is 0, and b4 is 1
MW    %11xxxx0x    make carry 1, mid carry 1, and b4 0
C     %1x0xx0xx    if carry is 1, a5 is 0, and b5 is 0
CO    %0x1xx0xx    or carry is 0, a5 is 1, and b5 is 0
MW    %0xxxx1xx    make carry 0 and b4 1
CNA   %0x1xx1xx    if carry is 0, a5 is 1, and b5 is 1 (but not if the
                    byte was changed in the previous instruction)
CO    %1x0xx1xx    or carry is 1, a5 is 0, and b5 is 1
MW    %1xxxx0xx    make carry 1 and b5 0
C     %1xxxxxxx    if carry is 1 (after the compare), read the byte
                    having b8, b7, b6, a5, a7, a6 into sense amps
MW    %1xxxxxxx    write 1 in carry of the newly read byte (this transfers
                    the previously computed carry to this byte)
****** This begins similar operations on bits 6, 7 and 8.
C     %1xxx0xx0    if carry is 1, a6 is 0, and b6 is 0
CO    %0xxx1xx0    or carry is 0, a6 is 1, and b6 is 1
MW    %0xxxxxx1    make carry 0 and b6 1
CNA   %0xxx1xx1    if carry is 0, a6 is 1, and b6 is 1 (but not if the
                    byte was changed in the previous instruction)
CO    %1xxx0xx1    or if carry is 1, a6 is 0, and b6 is 1
MW    %1xxxxxx0    make carry 1 and b6 0
C     %1xx0xx0x    if carry is 1, a7 is 0, and b7 is 0
CO    %0xx1xx0x    or carry is 0, b7 is 1, and a7 is 0
MW    %0xxxxx1x    make carry 0 and b7 1
CNA   %0xx1xx1x    if carry is 0, a7 is 1, and b7 is 1 (but not if the byte
                    was changed in the previous instruction)
CO    %1xx0xx1x    or carry is 1, a7 is 0, and b7 is 1
MW    %11xxxx0x    make carry 1, mid carry 1, and b7 0
C     %1x0xx0xx    if carry is 1, a8 is 0, and b8 is 0
CO    %0x1xx0xx    or carry is 0, a8 is 1, and b8 is 0
MW    %0xxxx1xx    make carry 0 and b8 1
CNA   %0x1xx1xx    if carry is 0, a8 is 1, and b8 is 1 (but not if the
                    byte was changed in the previous instruction)
CO    %1x0xx1xx    or carry is 1, a8 is 0, and b8 is 1
MW    %1xxxx0xx    make carry 1 and b8 0
```

FIG. 21b

APPARATUS AND METHOD FOR IN-PARALLEL SCAN-LINE GRAPHICS RENDERING USING CONTENT-SEARCHABLE MEMORIES

This is a continuation-in-part of application Ser. No. 987,008, filed Dec. 7, 1992, pending, which is a continuation-in-part of application Ser. No. 577,991, filed Sep. 5, 1990, now U.S. Pat. No. 5,184,325, which is a continuation-in-part of application Ser. No. 321,847, filed Mar. 10, 1989 now U.S. Pat. No. 4,989,180.

FIELD OF INVENTION

The invention relates to refreshable dynamic associative memory storage devices and systems incorporating such devices, particularly in the field of systems for rendering and displaying computer graphics.

BACKGROUND OF THE INVENTION

Referring to FIG. 1, a schematic of a typical construction of a dynamic random access memory (DRAM) is shown. During the write mode, data to be written into the DRAM is applied to the input and amplified by write amplifier WR. Switches S2 and S3 are open, switches S1 and S4 are closed, and capacitor C is either charged or discharged according to the status of the input data, and amplified by write amplifier WR. During the read mode, switches S1, S3 and S4 are open, and switch S2 is closed so that the voltage on capacitor C is compared to a reference voltage Vref by read amplifier RE. According to the difference determined by read amplifier RE, either a binary "one" or "zero" is transmitted to the output of the DRAM. When in the data-hold mode, all the switches S1, S2, S3 and S4 remain open so that the stored charged remains in capacitor C. However, due to the unavoidable presence of leakage resistance R, the capacitor charge will gradually dissipate. To compensate for this, a process called refreshing must be periodically used in the DRAM. To achieve refreshing, all three switches S1, S2 and S3 are closed, switch S4 is open, and the binary state detected by read amplifier RE is amplified by write amplifier WR and reapplied to storage capacitor C. Switches S3 and S4 thus form a multiplexer which selects either input data or refresh data for application to write amplifier WR. The dashed line in FIG. 1 represents the boundary of an integrated circuit chip. Elements within the dashed line are typically integrated on a single chip.

In practice, a DRAM includes a great number of storage capacitors C arranged in matrix of array form along with row decoder and column decoder circuitry. The storage elements of the array must be periodically refreshed, and are typically refreshed on a row-by-row basis. The row decoder and column decoder circuitry, as well as the read amplifiers and write amplifiers, are typically integrated within the same semiconductor chip with the individual storage elements of the array. FIG. 2 is a block diagram of a type HM 511000 dynamic RAM available from Hitachi America, Ltd., which includes eight 128k memory cell arrays 10 connected through read/write amplifiers 11 to I/O bus 12. Individual rows and columns of the cell arrays 10 are selected by row decoder 13 and column decoder 14, under control of address data contained on address bus 15 via row address buffer 16 and column address buffer 17, and under control of row access strobe signal RAS, and column access strobe signal, CAS. Reading and writing is controlled by read/write input, WE, and serial input and output data is buffered in I/O buffer 18. Once again, elements within the dashed line in FIG. 2 are integrated together on a single chip.

When logical operations are required to be performed on data stored in a DRAM, data must be read from the desired storage elements of the array and applied to the single-bit serial output of the DRAM for application to logic circuitry external to the integrated circuit chip. After the logic function is performed, the result is applied to the single-bit input of the DRAM for buffering and storage in desired storage elements of the array. Such operation of a dynamic RAM is found, for example, in single-instruction-multiple-datastream (SIMD) computers wherein a single logical operation is performed on a plurality of data elements. Such SIMD operations may be performed cyclically in order to trade off cost for speed. During cyclic operation, the same operation is performed in one or more data cells, and within each data cell, the operation is performed identically on one or more data words which are processed sequentially. However, as mentioned above, periodic refreshing of the dynamic RAM is necessary to avoid dissipation of the data indicating charge on the storage capacitor. This refreshing is generally interleaved with any logical operations performed on the data, which necessarily limits the speed at which cyclic logical operations can be performed on data stored in a dynamic RAM.

SUMMARY OF THE INVENTION

The present invention avoids the drawbacks of the prior art by incorporating logic circuitry within the refresh circuitry of a dynamic RAM which allows performance of cyclic logical operations on stored volatile data, concurrent with the periodic refresh of the volatile data. Thus, all data being refreshed is processed by a simple logical unit in the refresh circuit. This combination of refresh with logical operation eliminates the need for a separate refresh cycle by performing the logical operation during the refresh cycle, and greatly improves the cyclic processing speed of logical operations performed on stored data.

The present invention has particular application in data base or associative systems wherein all stored data is accessed and tested, for example, when conducting data string searches. In such a data base searching system, a data comparator is inserted into the refreshing loop, and is used to compare target data with data being cyclically refreshed in order to simultaneously perform data refresh and target data searching.

The inventive memory circuit can be used as a buffer for other, non-volatile storage devices, such as hard disks, thereby allowing parallel searching of the stored data.

Further, the inventive memory circuit can be used for storage and calculation functions associated with graphics displays. Current systems of graphics rely heavily on pipelined processing, and as a consequence generally have bottlenecks due to inadequate or unduly expensive floating-point calculation capabilities for geometry processing and insufficient or expensive bandwidth between rasterization processing and frame-buffer memory. A system formulated with the inventive memory circuit can reduce or eliminate those bottlenecks by taking advantage of the expanded parallelism and intrinsic search and comparison capabilities available on the inventive memory circuit, thereby permitting real-time graphics processing of complicated images at low cost, and without the need for the memory costs of a frame buffer.

The invention achieves those results in one embodiment, through the use of a scan-line processing systems that uses the calculation capabilities of the inventive memory circuit to perform the mathematical calculation in a highly parallel manner, as described in more detail below.

3

In one embodiment of the invention, it is possible to accelerate logic and arithmetic operations by holding certain bits in the sense amplifiers of a DRAM, rather than in the dynamic memory storage locations. Frequently, in performing arithmetic, bit-serial operations in parallel on every word of a data set stored in memory (SIMD type of parallel operation), it is desired to operate only on particular data stored in several consecutive columns, representing a field of the far wider "word." In that case, one embodiment of the invention is suited to read data from those particular fields into the sense amplifiers and leave the data bits there for a period of time before re-storing them. During the time interval, the inventive circuit can perform arithmetic operations on the data in the sense amps, which operations proceed more rapidly, by eliminating the need to access the bit cells each cycle. DRAMs use "page mode" access to read and write data in the sense amps more quickly, and that mode of access can permit faster searches or modifications of the data held in the sense amps. By contrast, without the improvement of that embodiment, SIMD operations would proceed by scanning data through the sense amps sequentially from throughout the word, the basic operation used in full-text retrieval, and operating on the data under programmed control.

Thus the proposed embodiment of the invention allows both for faster searching and for faster arithmetic on designated fields, which combination allows for use of the embodiment in a wider range of applications without alteration of the basic hardware.

BRIEF DESCRIPTION OF THE DRAWINGS

FIG. 6 is another block diagram of a dynamic random access memory employing logic in refresh circuitry according to another embodiment of the present invention.

FIG. 8 is a chain priority circuit usable in the present invention.

FIG. 9 is a priority tree circuit usable in the present invention.

FIG. 10 is a node in a data bus and priority tree usable in the present invention.

FIG. 11 is a block diagram of a module of a system according to the present invention that uses several dynamic associative addressable memories as disk buffer.

FIG. 13 is an example timing diagram for the transfer of data from disk to memory in the embodiment shown in FIG. 12.

FIG. 14 is an example block diagram showing the bus contacts of the system in a particular state.

4

Figure 12:
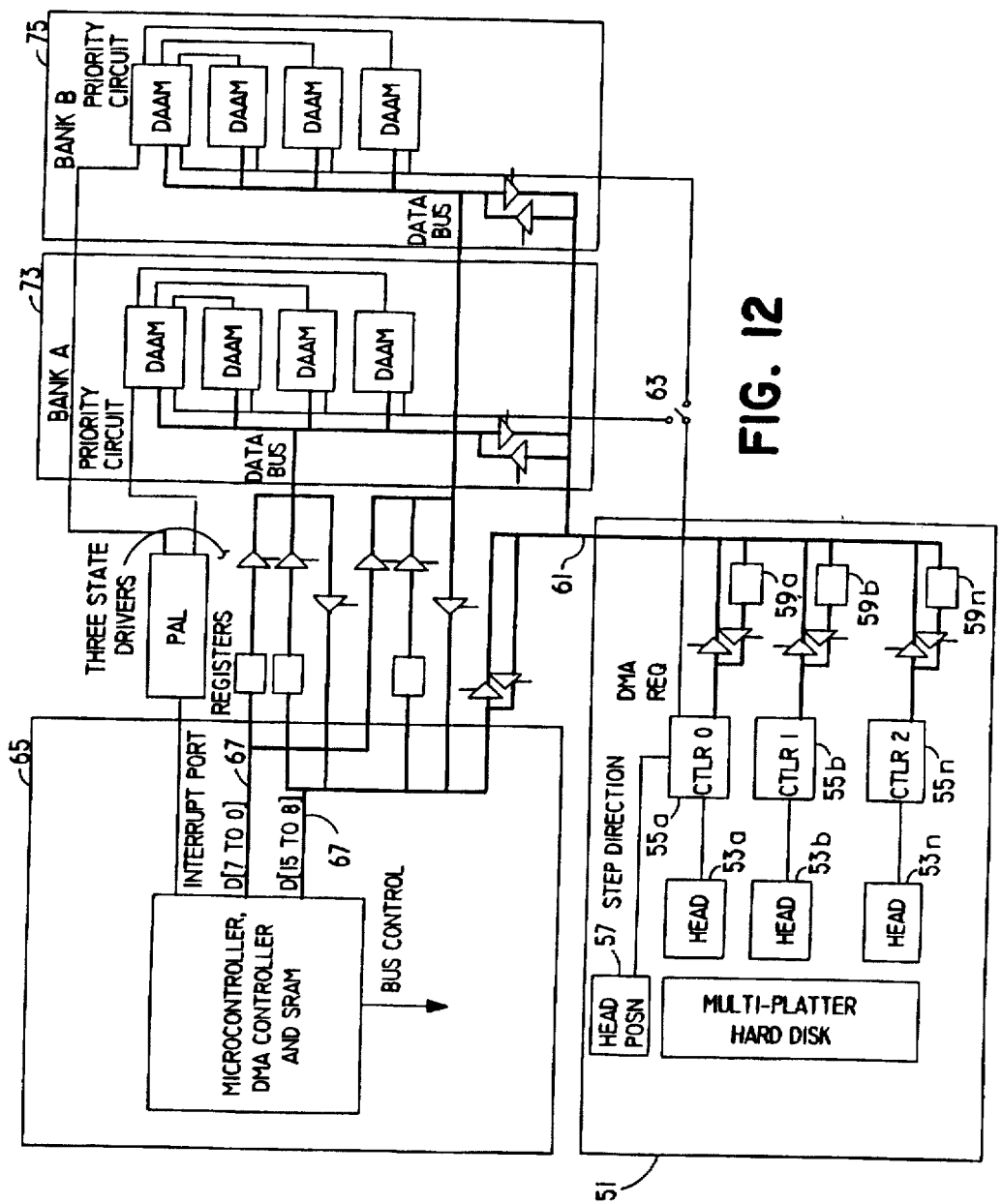
FIG. 12 is an example block diagram of an embodiment of the module of FIG. 11.
Figure 16B:
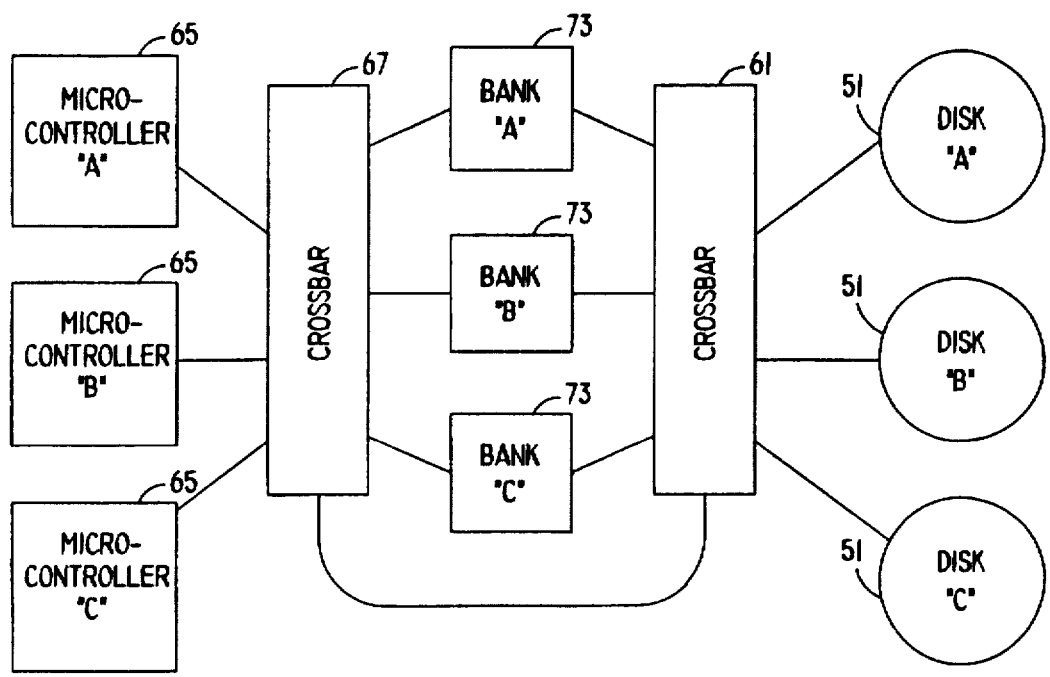
Figure 16A:
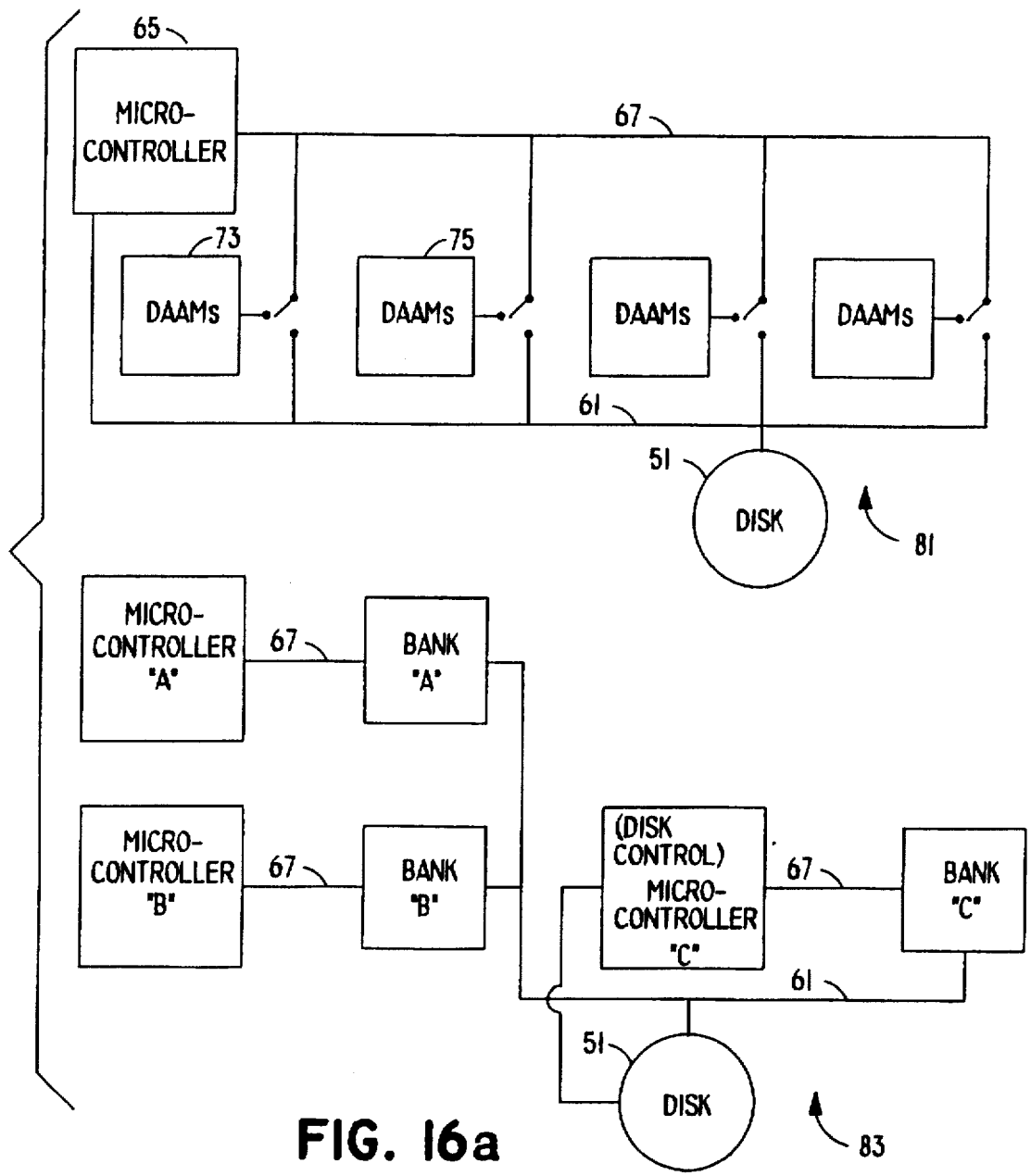

FIGS. 16a and b illustrate three alternative systems, each of which contains several modules that can consist of the embodiment of FIG. 12 or another system in accordance with the invention, arranged with alternative connecting mechanisms.

Figure 17:
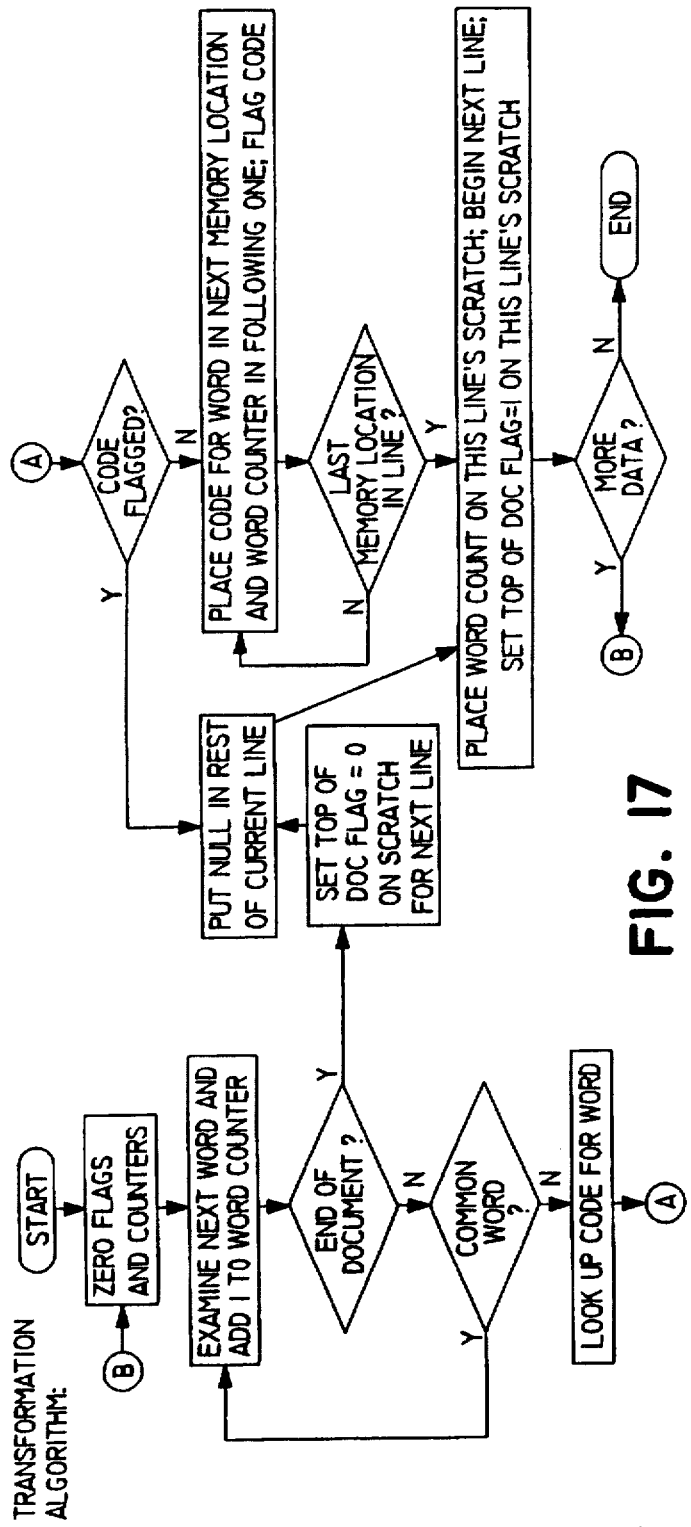

FIG. 17 is a diagram illustrating one possible storage structure within the memory of the invention.

Figure 18:
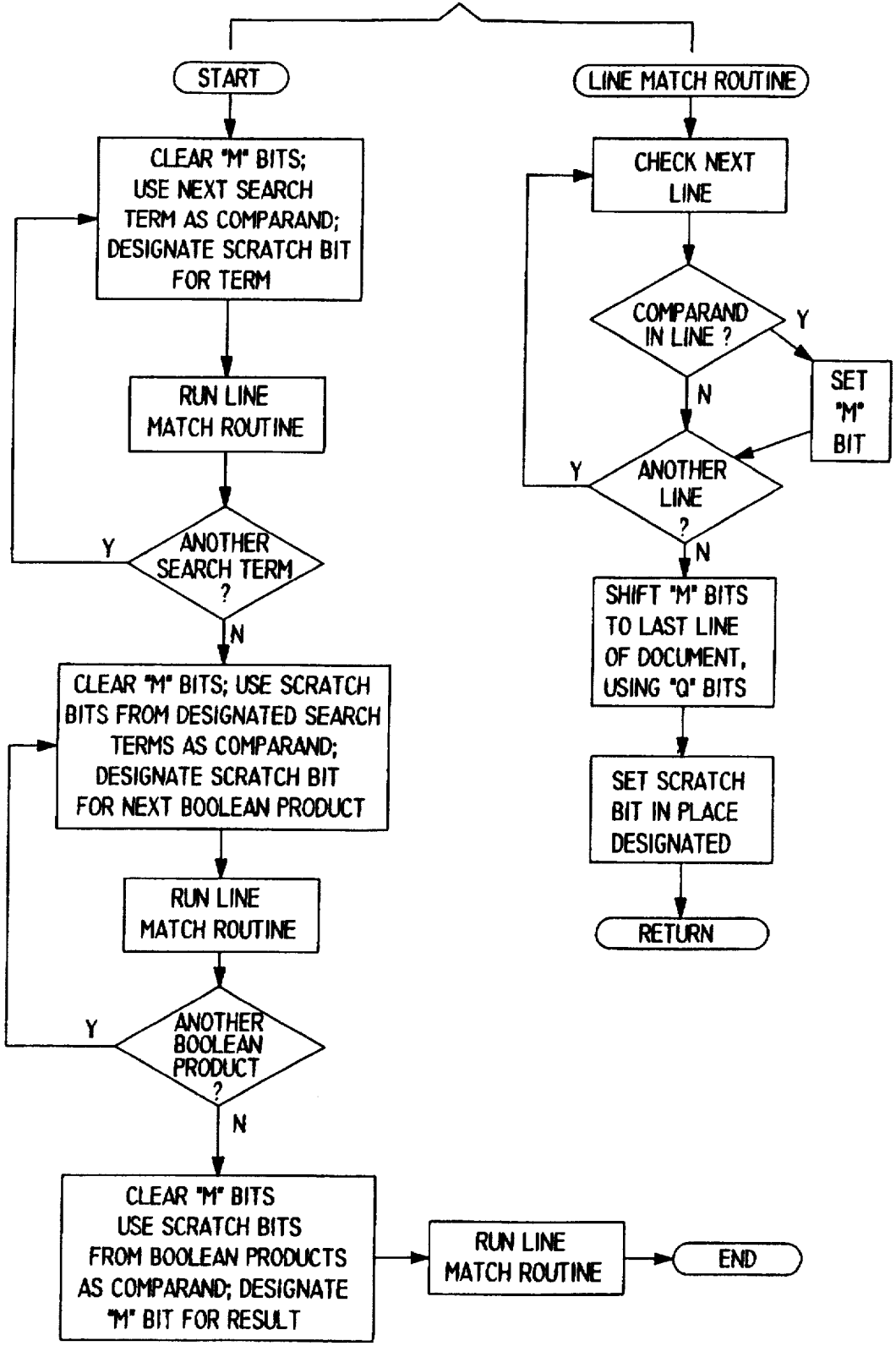

FIG. 18 is an example flowchart illustrating a program for implementing a Boolean search using the embodiment of the invention described in FIG. 17.

Figure 19:
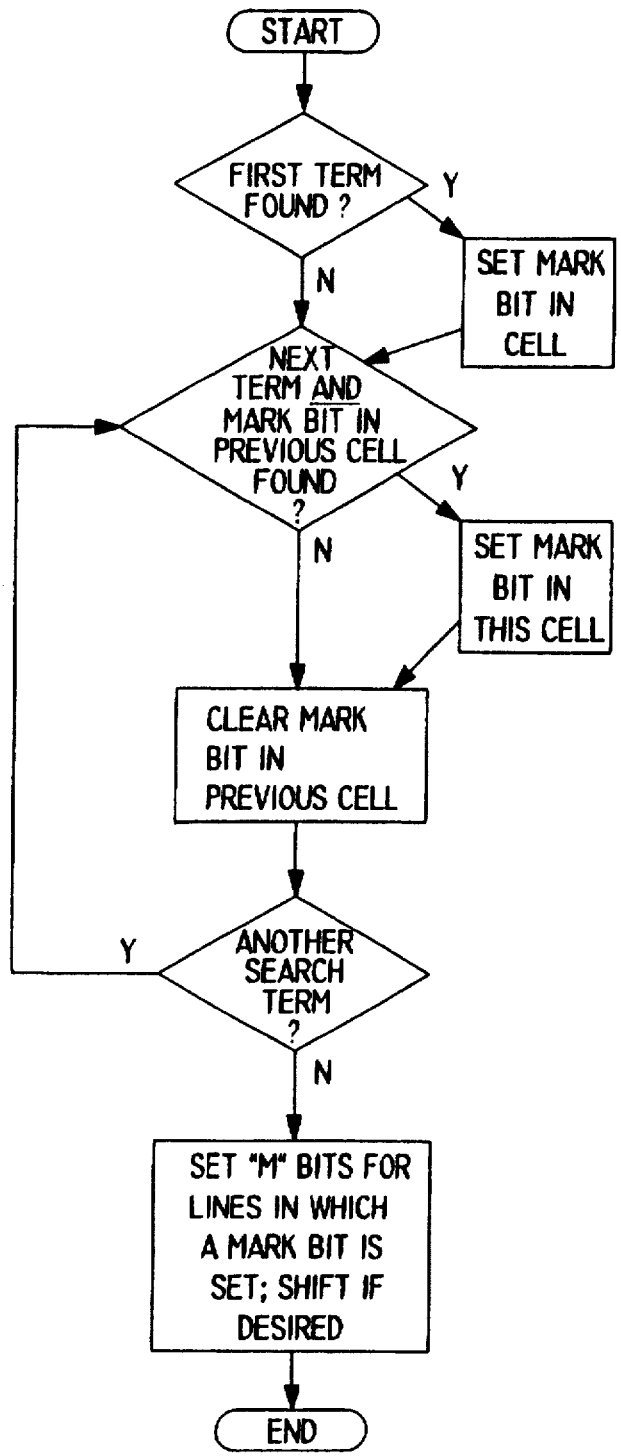

FIG. 19 is an example flowchart illustrating a program for implementing a string search using the embodiment of the invention described in FIG. 17.

Figure 20:
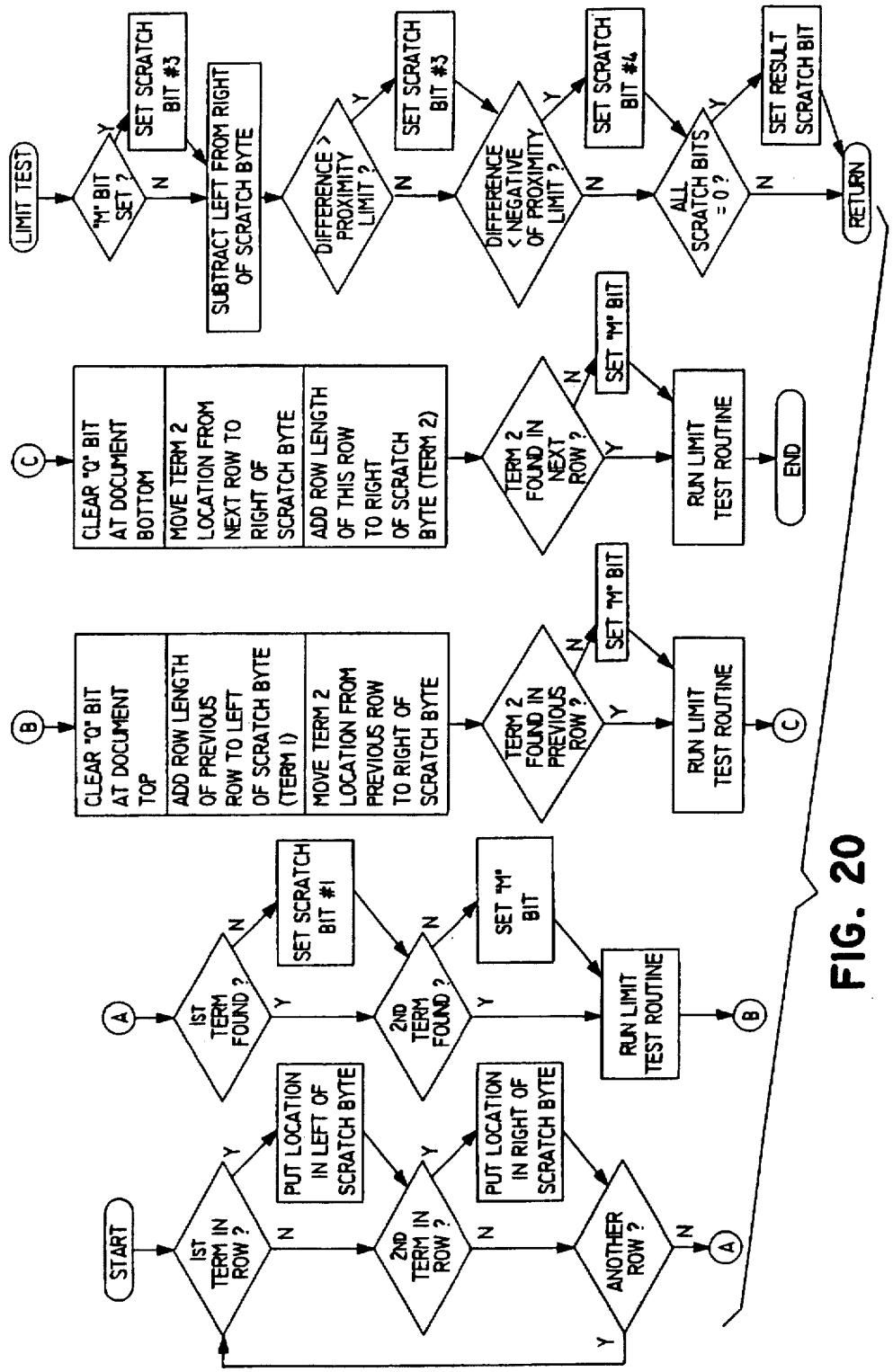

FIG. 20 is an example flowchart illustrating a program for implementing a proximity search using the embodiment of the invention described in FIG. 17.

FIGS. 21a and b show a sample program illustrating an efficient way of performing Boolean arithmetic in the memory of the invention.

Figure 22:
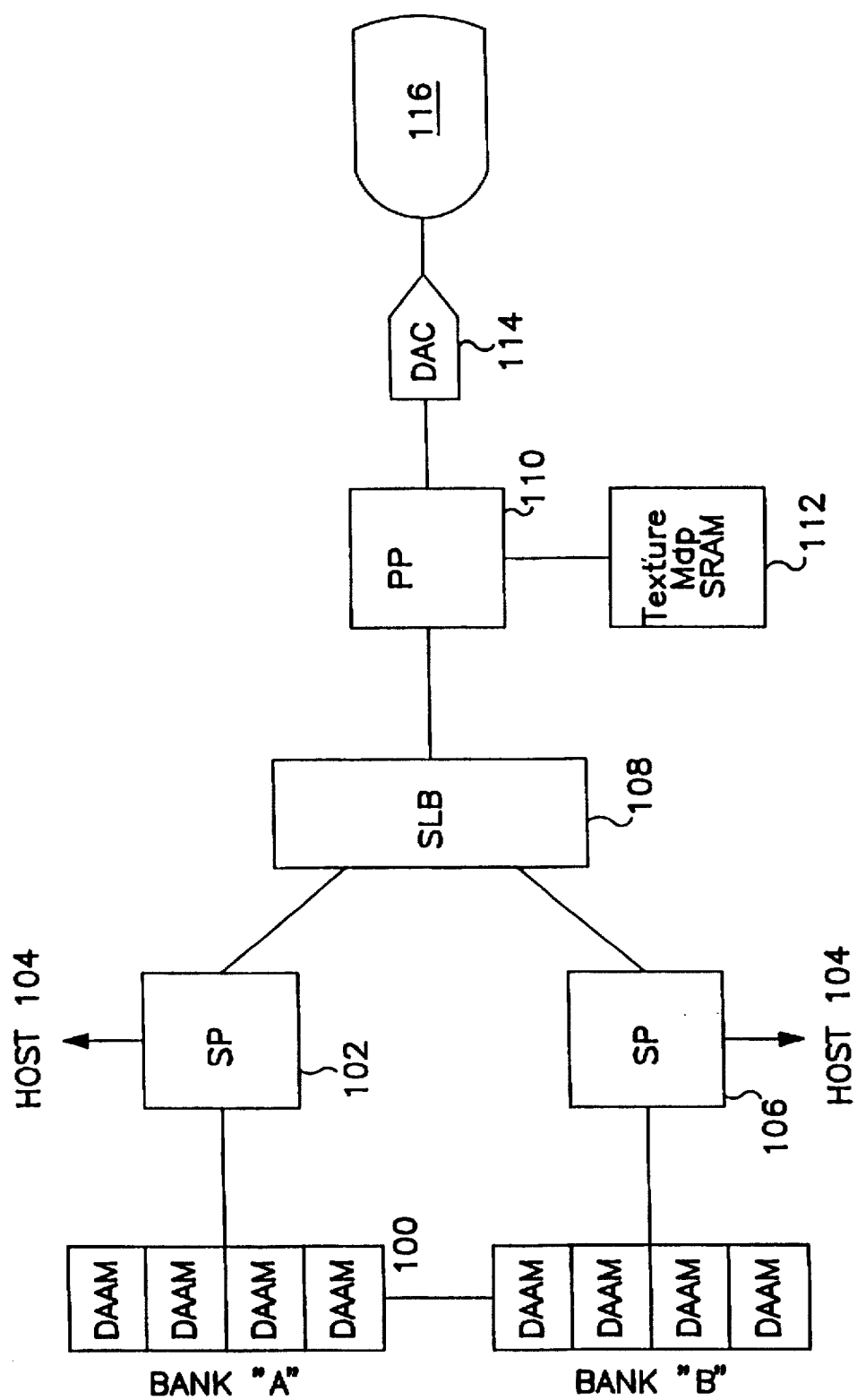

FIG. 22 is a block diagram showing the general arrangement of a system according to the present invention that uses several dynamic associative addressable memories in a graphics rendering application.

Figure 23:
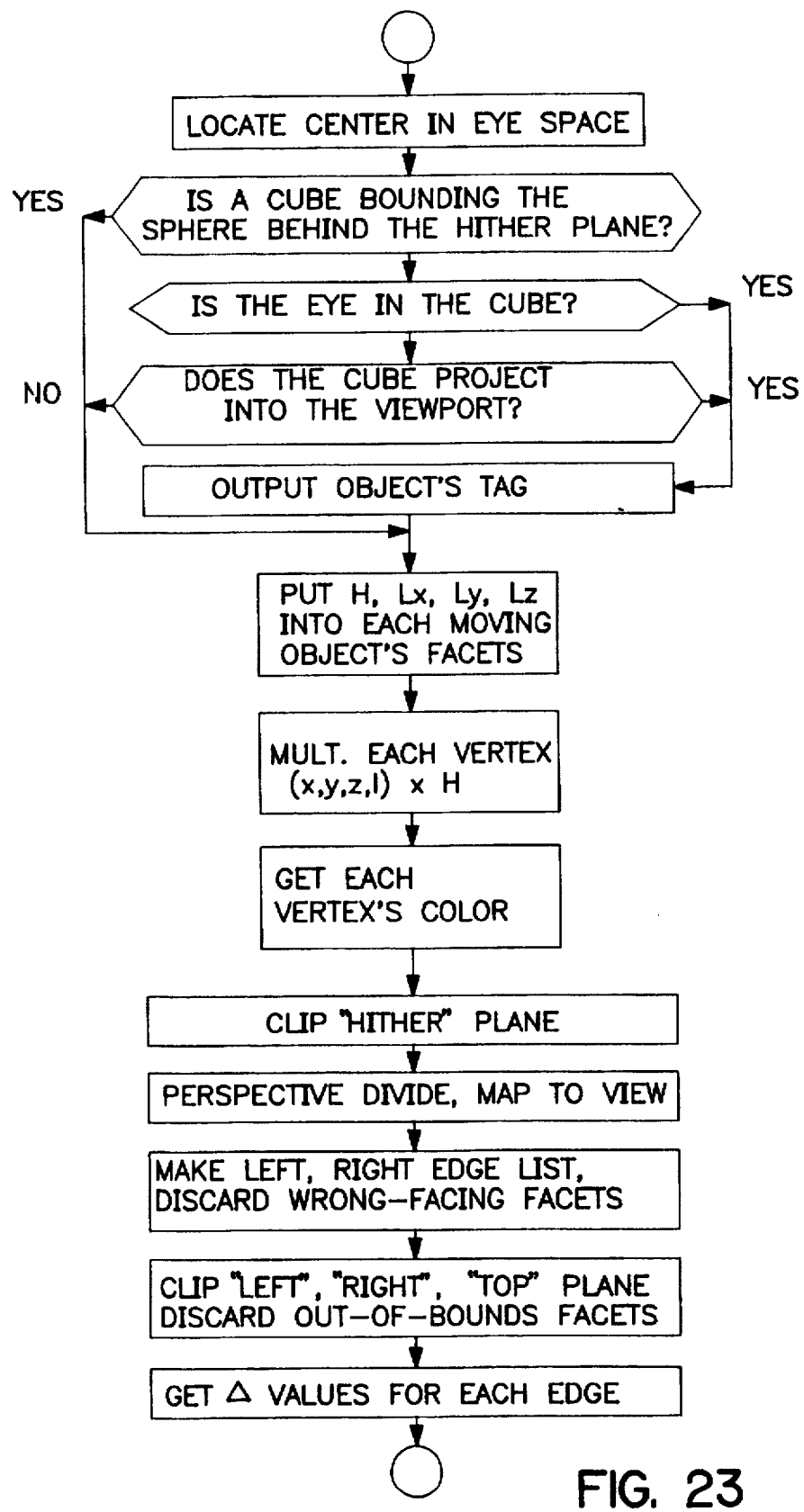

FIG. 23 is a flowchart of an example rendering process that may be performed by the embodiment of the invention described in FIG. 22.

Figure 24:
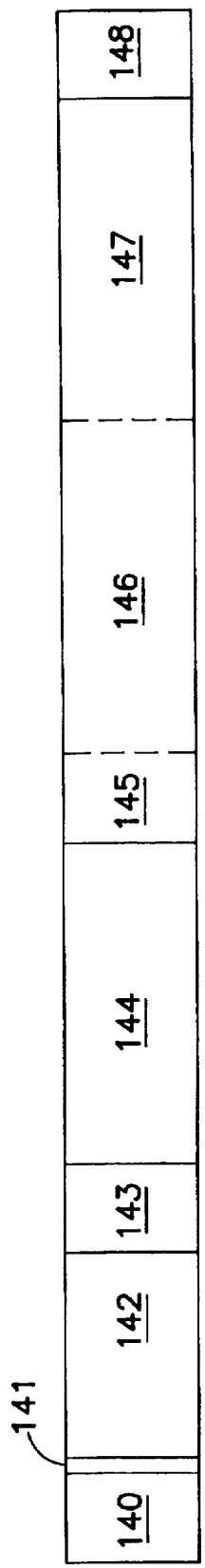

FIG. 24 is an example data structure of an associative memory word, each word representing a facet of an object in the scene being rendered.

Figure 25:
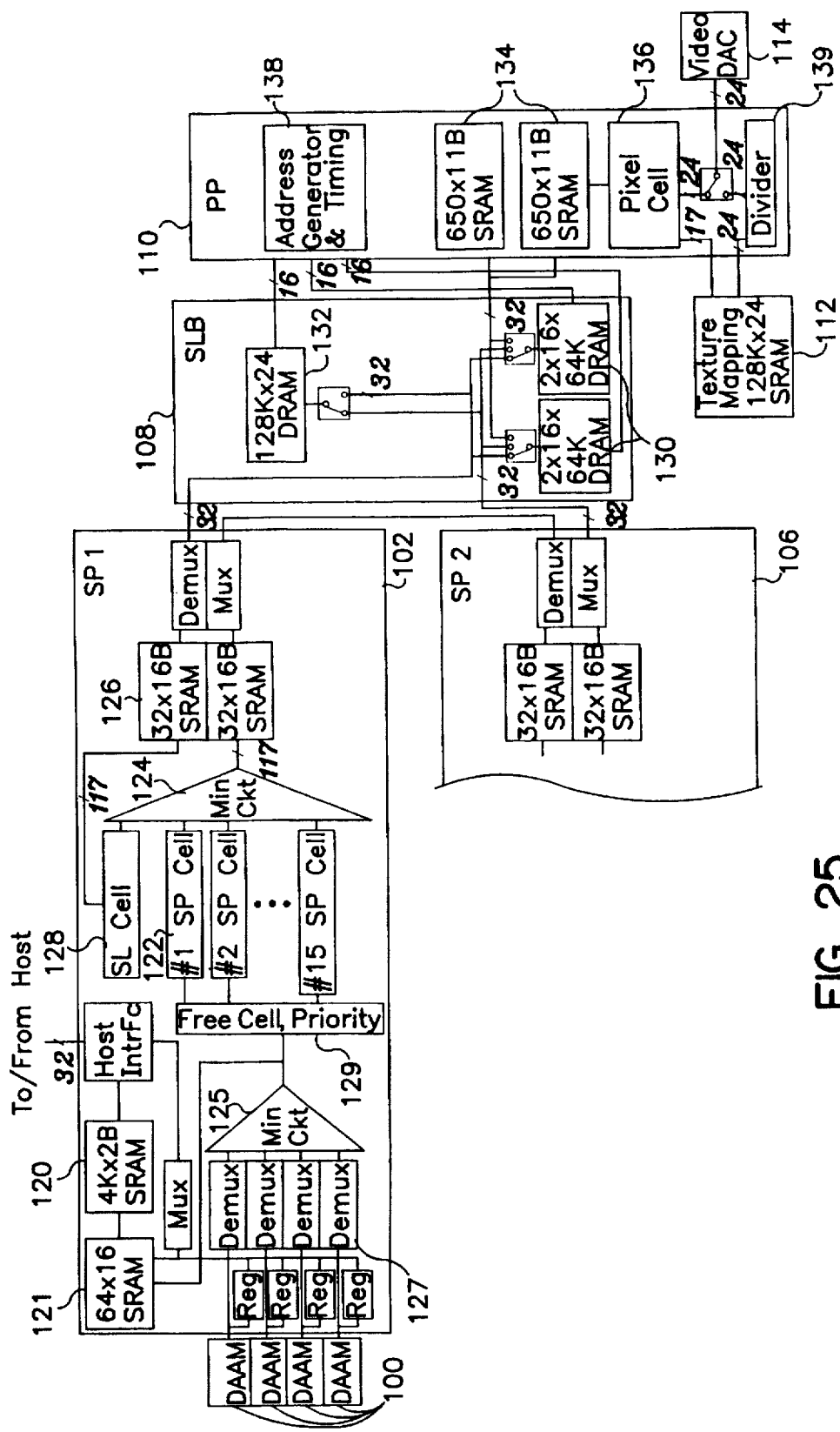

FIG. 25 is a more detailed block diagram showing a data path useful in implementing the system described in FIG. 22.

Figure 7:
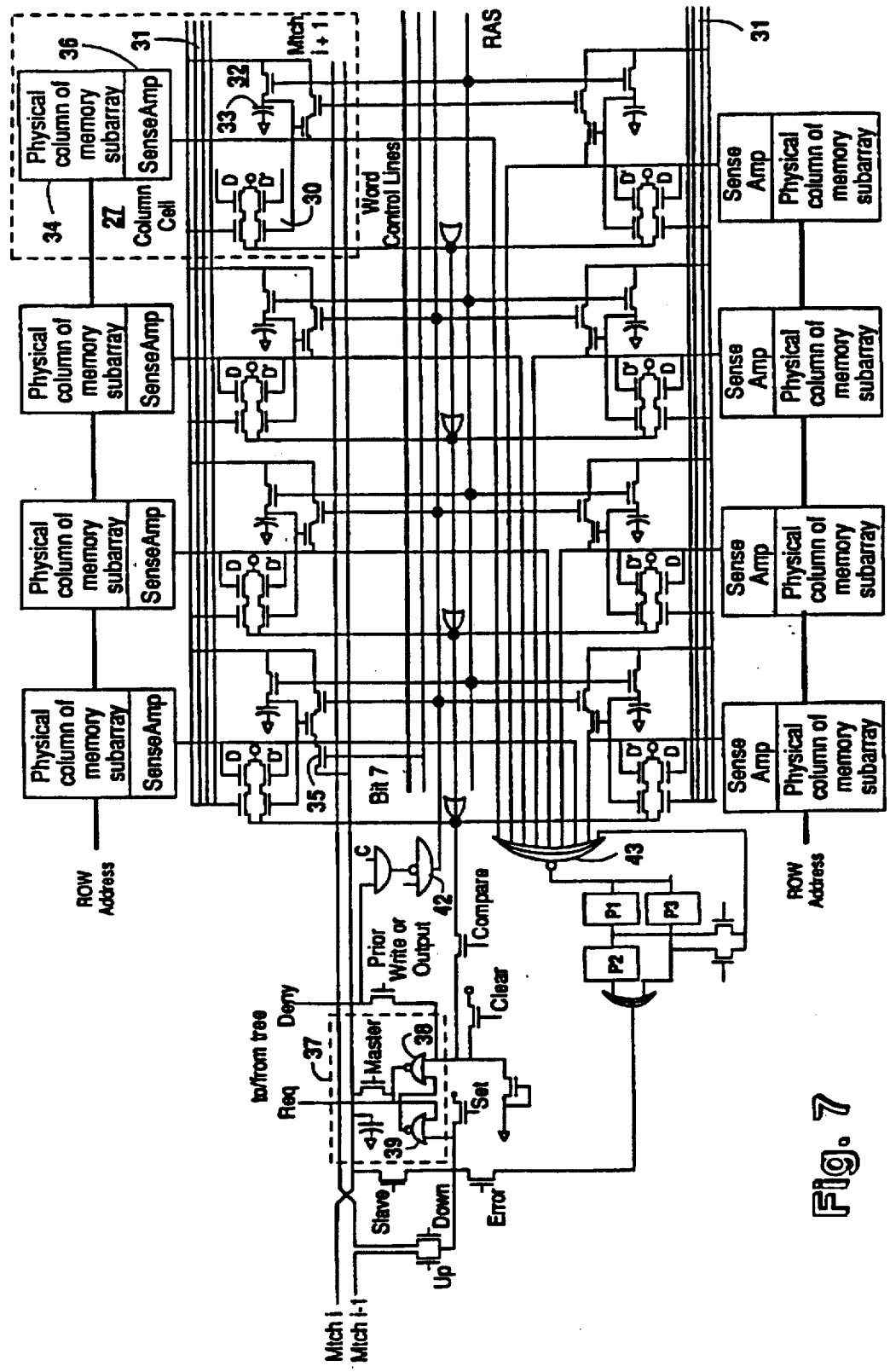
FIG. 7 is a detailed block diagram of a word cell of FIG. 6.
Figure 26:
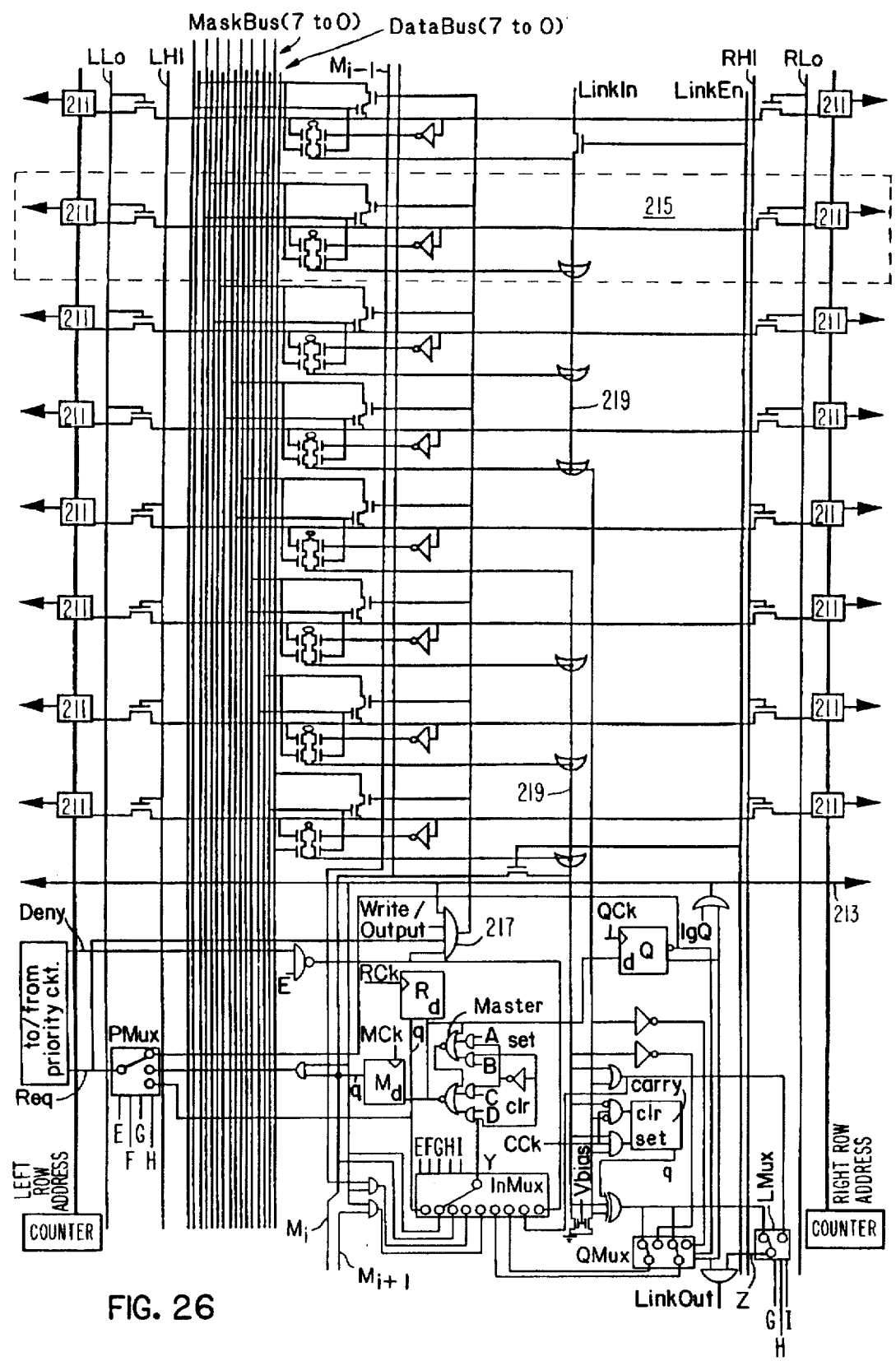

FIG. 26 is a detailed schematic of a word cell, representing another, more complex embodiment of the cell shown in FIG. 7, an embodiment that is capable of performing arithmetic in the hardware of the word cell, as well as improved forms of data output.

Figure 27:
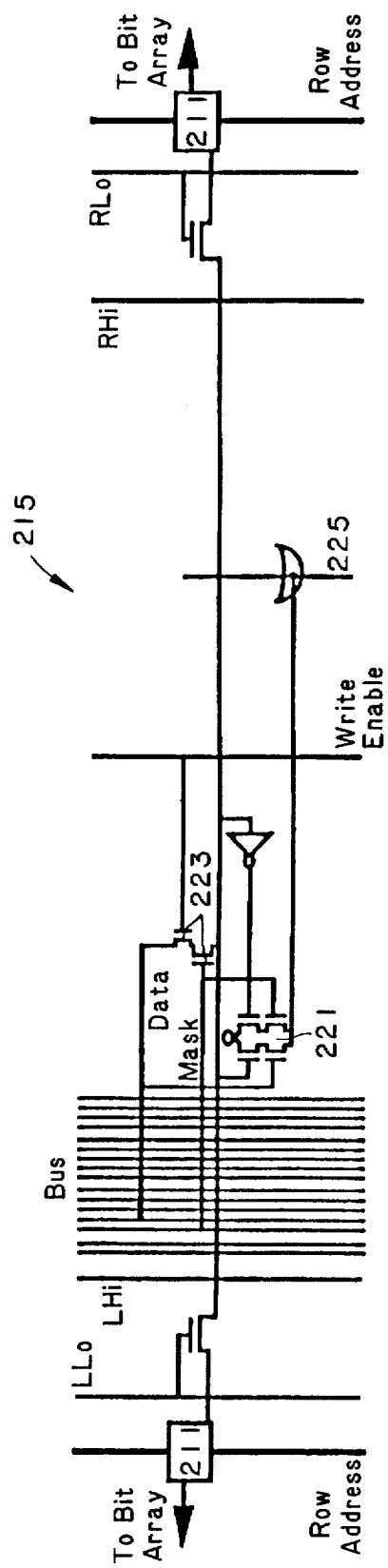

FIG. 27 is a close-up view of a bit cell, part of the schematic of FIG. 26.

Figure 28:
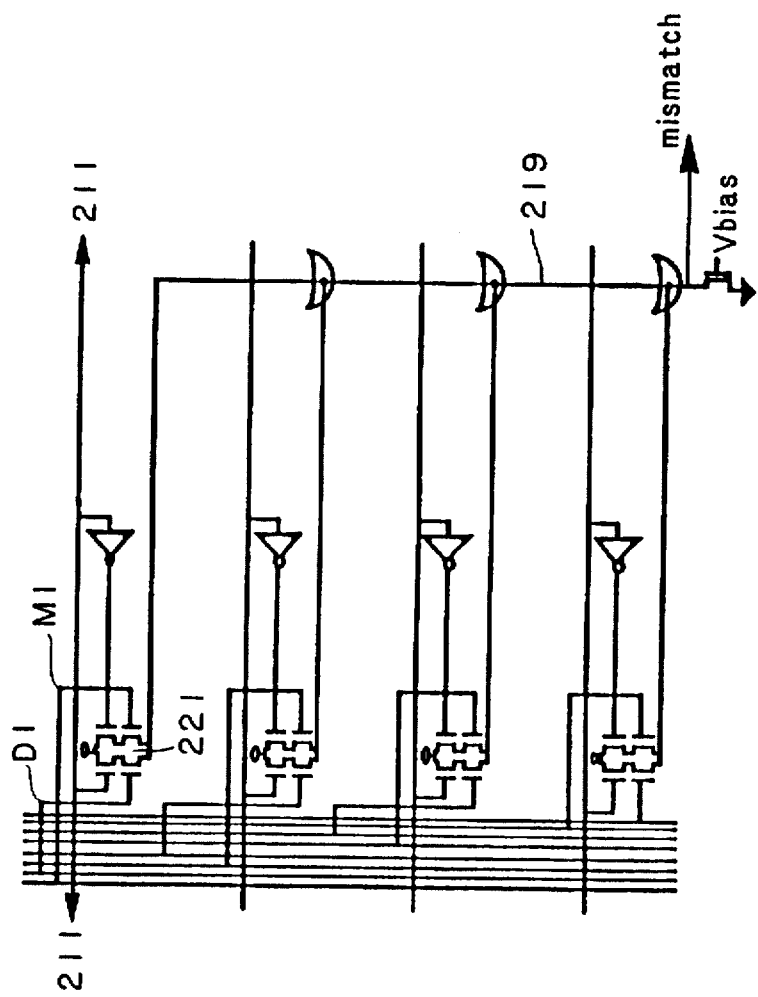

FIG. 28 is a portion of the schematic of FIG. 26, showing the circuitry that makes up one of the four-bit hardware comparators implemented therein.

Figure 29:
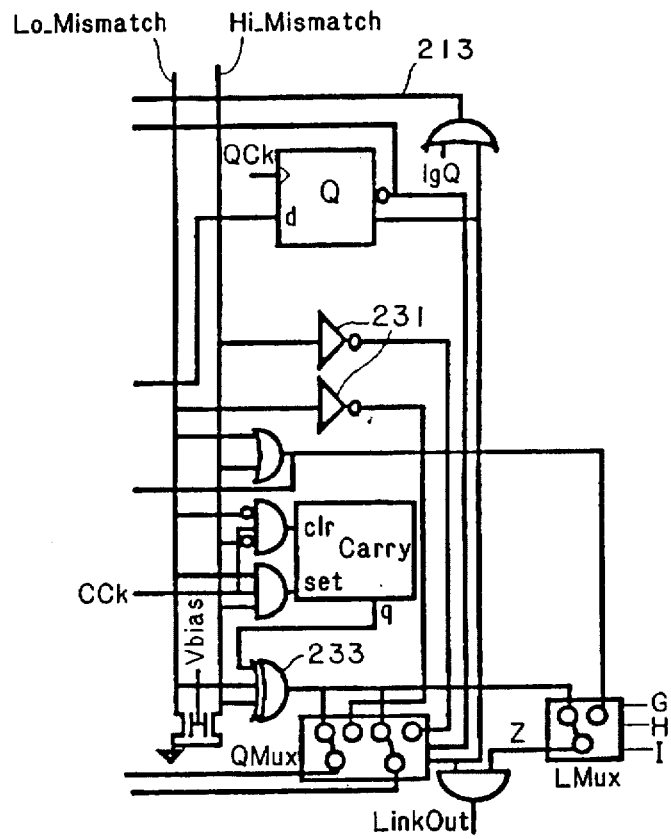

FIG. 29 is another portion of the schematic of FIG. 26, showing the circuitry that makes up the hardware serial adder implemented therein.

Figure 30:
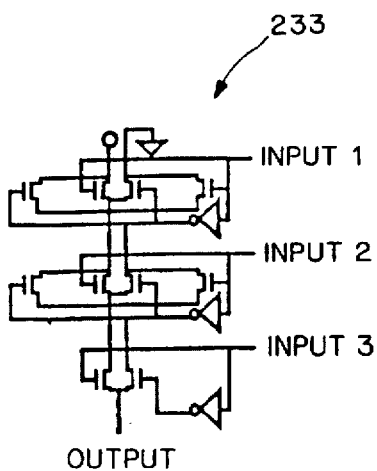

FIG. 30 is a detail of the schematic of FIG. 29, specifically the implementation of a three-input exclusive-OR gate.

Figure 31:
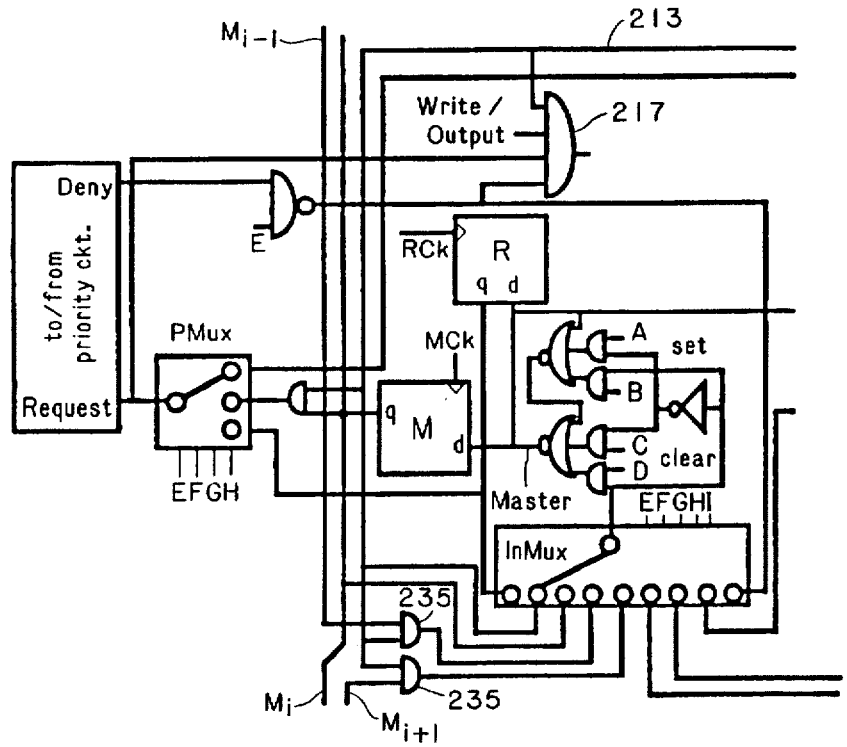

FIG. 31 is another portion of the schematic of FIG. 26, showing the circuitry that makes up the control logic flow implemented therein.

Figure 32:
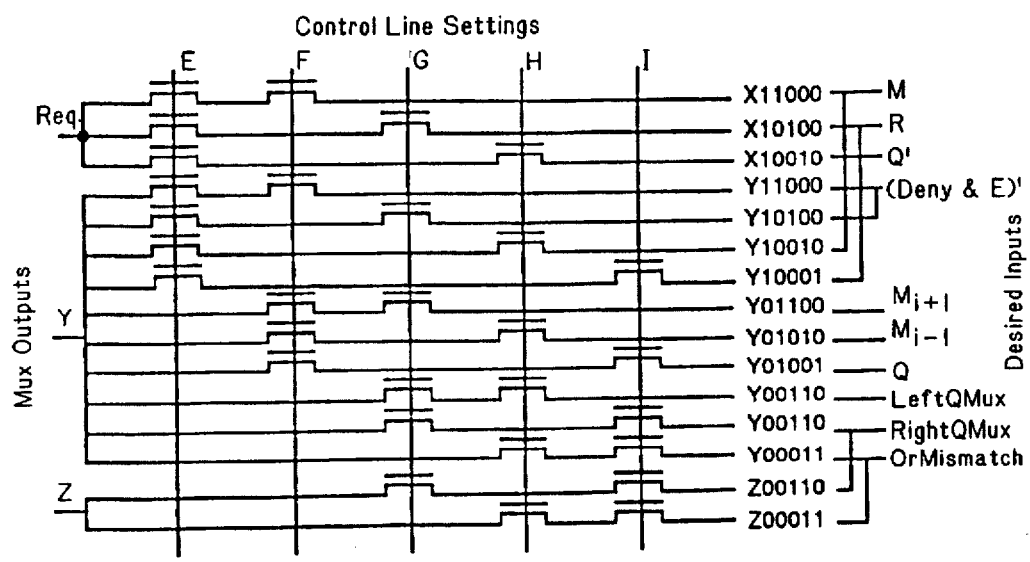

FIG. 32 is a summary diagram showing the control signals needed to switch the multiplexers in the circuitry shown in the schematic of FIG. 26.

Figure 33:
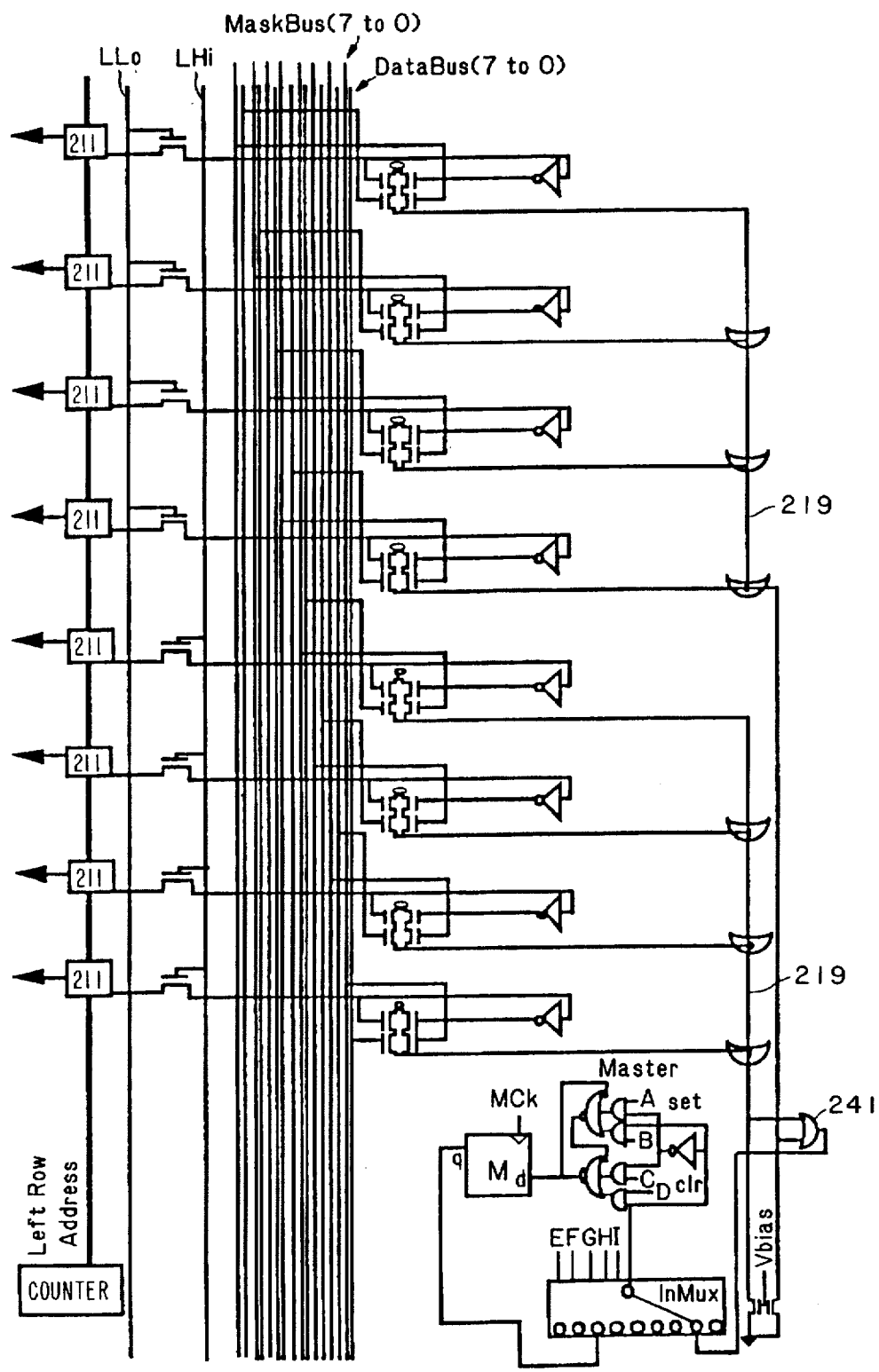

FIG. 33 is a subset of the schematic of FIG. 26, useful in illustrating the logical comparison operations possible using that embodiment of the circuit.

Figure 34:
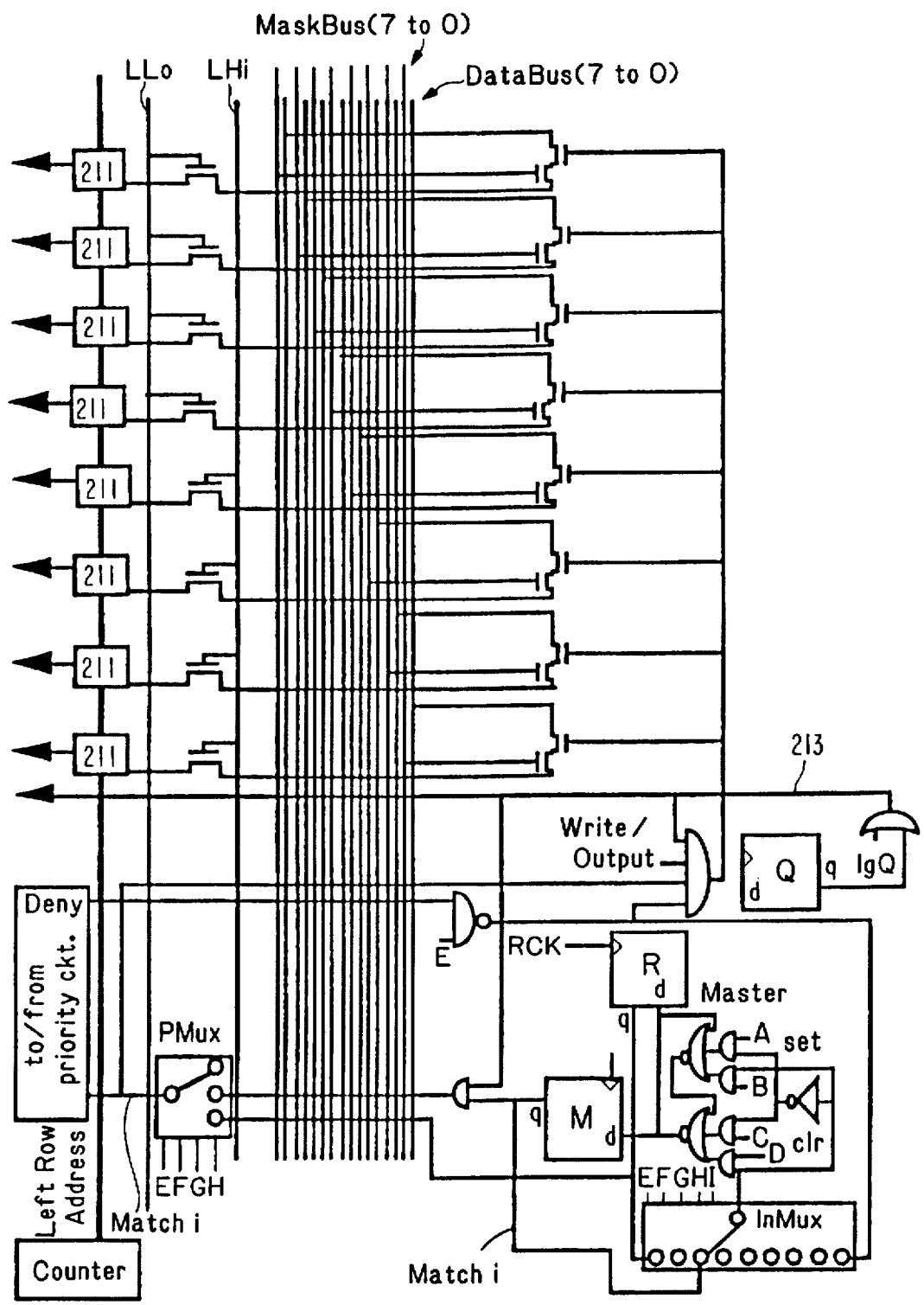

FIG. 34 is another subset of the schematic of FIG. 26, useful in illustrating various input and output operations possible using that embodiment of the circuit.

Figure 35:
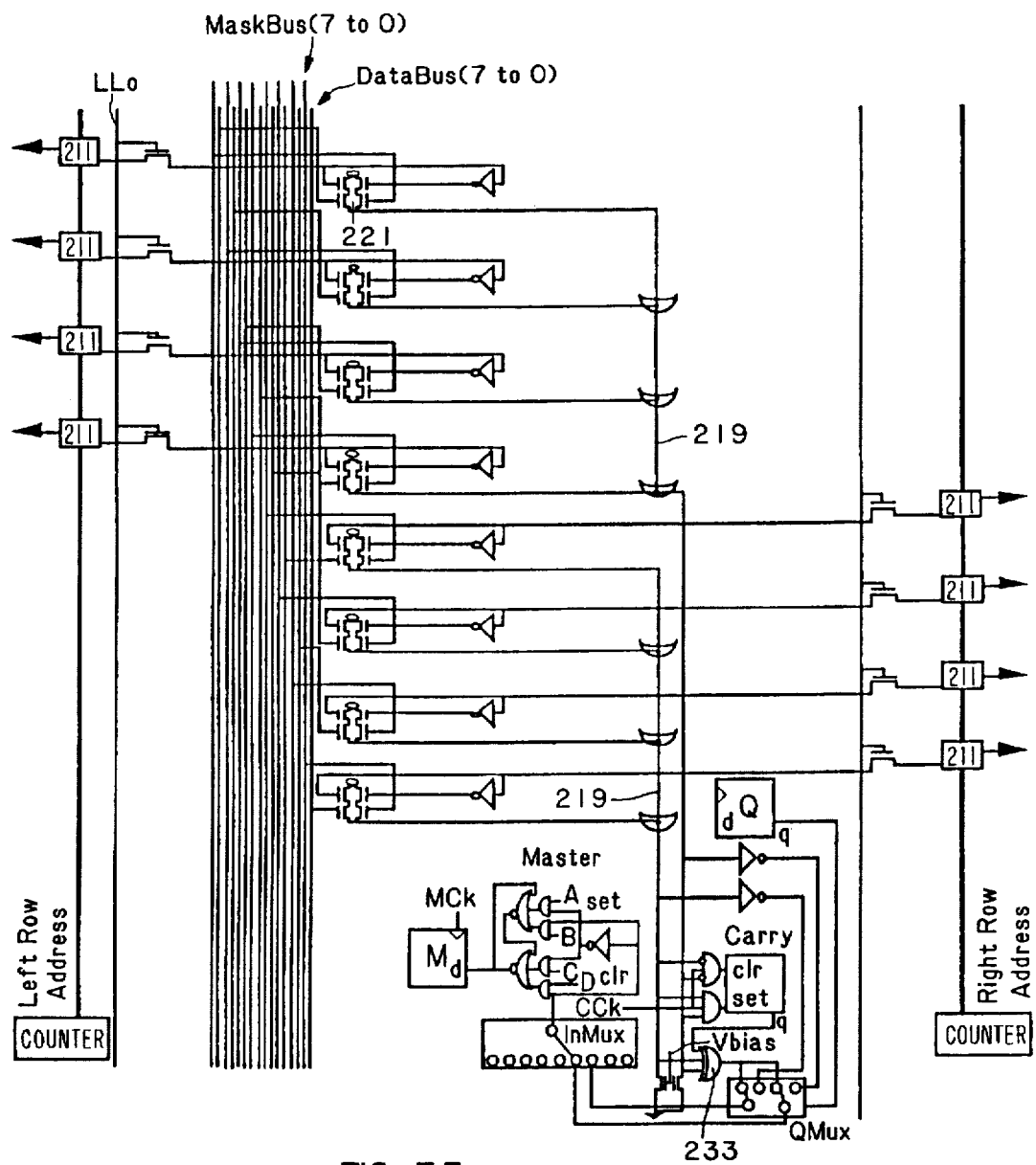

FIG. 35 is another subset of the schematic of FIG. 26, useful in illustrating arithmetic operations possible using that embodiment of the circuit.

DETAILED DESCRIPTION OF THE PREFERRED EMBODIMENTS

Figure 3:
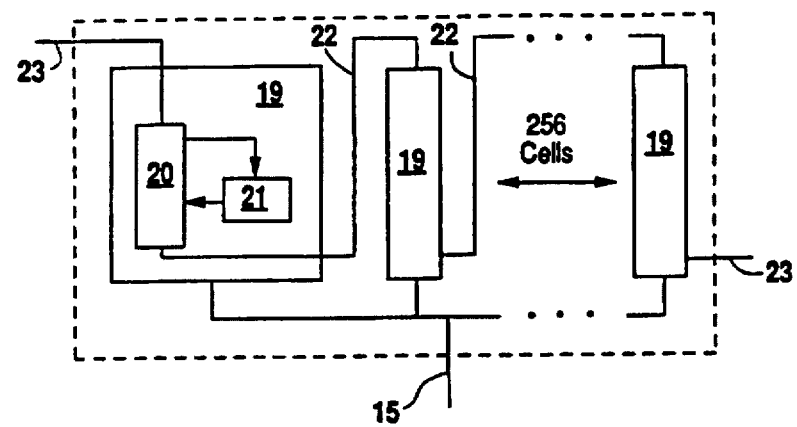
FIG. 3 is a dynamic random access memory employing logic in refresh circuitry, according to the present invention.

Referring to FIG. 3, a one-megabit volatile memory employing logic-in-refresh according to the present invention is disclosed. The memory is organized within the chip as a 512-row, 2048-bit-per-row memory in which an entire 2048-bit row is read, one after another, in each refresh cycle. The refresh row unit length might be different from the length of the associative memory word unit that can be searched or output as a unit. Either the entire 2048-bit row, or a fraction of the 2048-bit row, can be considered a single word in an associative memory. For example, referring to FIG. 3, if an eight-bit byte is chosen as the length of the associative memory word in a one-megabit memory, 256 cells 19 result, each having a 512-word memory array 20, eight-bits-per-word. Herein, a "word" is a unit of data that is considered by the user as a whole, a "row" refers to a unit of data read or written as a whole, and a "byte" is that portion of a row contained in a word.

According to the present invention, each cell 19 includes logic circuitry, such as comparator 21, to operate on the data as it is sequentially and cyclically read out, refreshed and written back into memory. During a refresh operation, a nine-bit counter, either external or internal to the chip, provides 512 consecutive row addresses, one address per memory refresh cycle. Thus, all words of each cell 19 of the memory are read in 512 memory refresh cycles and are searched during that time. For one mode of operation, the bottom byte of each cell 19 is logically linked to the top byte of the next cell 19 within a single chip by bus 22. In another mode of operation, each word, as a sequence of 512 bytes, is considered separately. Elements within the dashed line are integrated together in a single semiconductor material integrated circuit chip. A plurality of chips can be cascaded by logically linking the bottom word of the last cell in one chip to the top of the next cell in the neighboring chip by bus 23.

Figure 4:
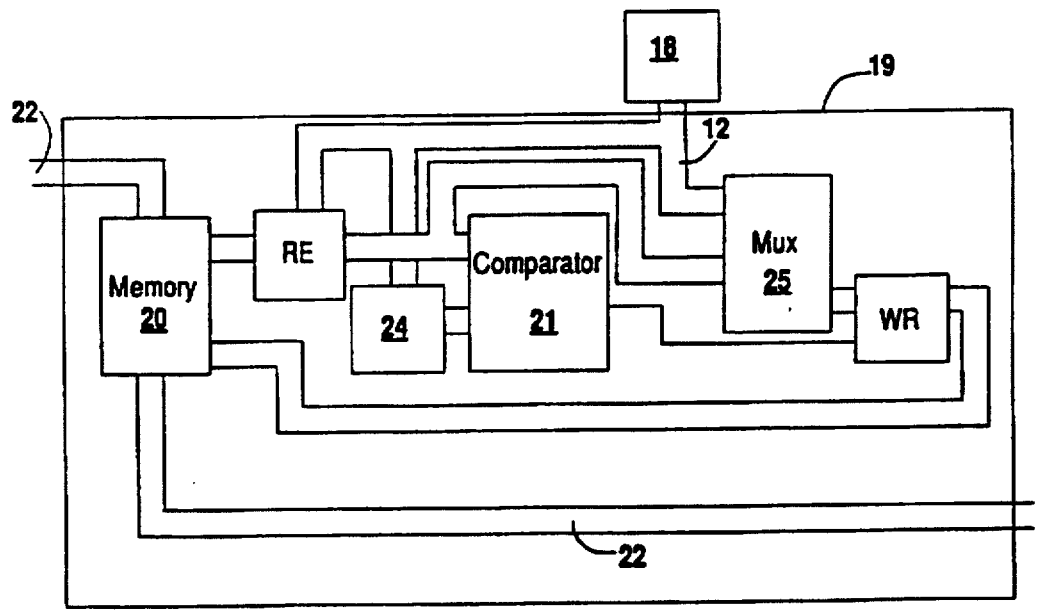
FIG. 4 is a dynamic random access memory employing search logic in the refresh circuitry, according to the present invention.

The configuration of each cell 19 is shown in more detail in FIG. 4. Referring to FIG. 4, data stored in each byte can be, for example, ASCII characters in text streams, which are each seven bits wide together with a mark bit, which is the 8th bit. Initially, all mark bits are cleared, and are subsequently set and cleared to mark the results of a search. Each byte is sequentially read by the eight-bit wide read amplifier, RE, and the seven data bits are applied to comparator 21 where the read seven-bit byte is compared with the seven-bit comparand stored in comparand register 24. A comparand is loaded into comparand register 24 through I/O bus 12.

Figure 1:
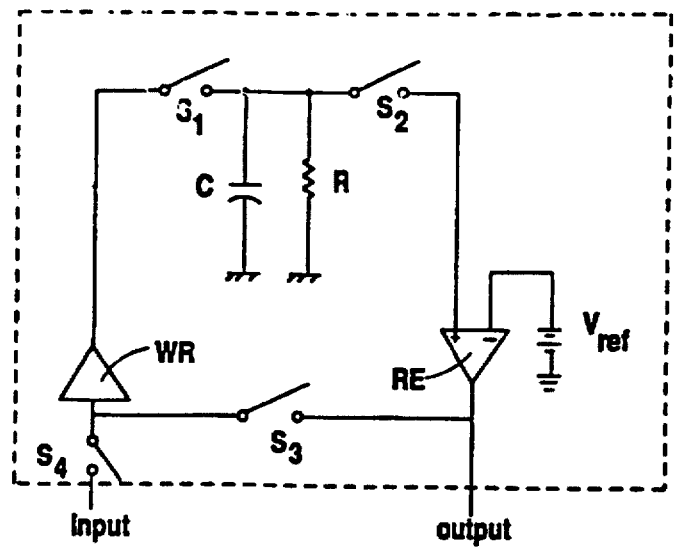
FIGS. 1 and 2 are schematic representations of prior art dynamic random access memories.

The output of read amplifier, RE, is also applied to multiplexer 25 along with data from I/O buffer 18 through I/O bus 12. The output of multiplexer 25 is applied to 8-bit write amplifier, WR, along with the single-bit (mark bit) output of comparator 21. Read amplifier, RE, is also connected to I/O bus 12 in a known manner through tri-state buffers, or the like, to enable outputting of data. Thus, according to the present invention, comparator 21 and comparand register 24 are added to the preexisting refresh circuitry of a DRAM illustrated schematically in FIG. 1 (note that switches S3 and S4 illustrate the function of multiplexer 25). All components are integrated on the same semiconductor material integrated circuit chip.

In operation, to search-and-mark byte, a byte-wide comparand is simultaneously broadcast to all cells 19, and stored in respective comparand registers 24. Then, the 512 bytes in memory array 20 of each cell 19 are each cyclically read, refreshed and rewritten. The eighth bit of each byte stores the result of any match with the comparand in comparand register 24. The results of the match are stored in eighth bit of the next byte in memory array 20 adjacent and below the one that the comparand matches. This is repeated for all 512 bytes in each cell 19. The result of a search on the last byte of a cell is effectively stored in the first byte of the adjacent cell through bus 22.

If all mark bits are cleared, and the comparand searches for a seven-bit character and a zero as the eighth bit, an unconstrained search for a character is done. If the comparand searches for a character and a "1" in the eighth bit, a search for the character will then match the comparand only if the previous byte stored in memory array 20 matched the previous comparand searched. Thus, a string of characters can be searched for, one character in each successive refresh operation.

A variation of this operation is to continue to mark bytes in memory until a match is found. In this variation, once the eighth bit (mark bit) of a byte has been set, as bytes continue to rotate through the refresh circuitry, the eighth bit of all subsequent bytes are set until a match for the next comparand (for example, an end-of-text character) is found. This variation is used to mark the remainder of a target string of characters, once a character within the target string is found, and facilitates output of or rewriting the target string.

The output of the result of a search from a single cell can simply be read out as the character into I/O buffer 18 if the eighth bit is set. As a byte passes the refresh logic, if the eighth bit is set, the byte is presented by read amplifier, RE, to I/O buffer 18, and the eighth bit will then be cleared. In a multiple cell system, if two cells have the eighth bit set in the same word in each cell, a priority circuit connected to the cells will prevent all but one of the outputs from feeding I/O buffer 18, and clearing the eighth bit. Only one byte will be output at a time, and remaining bytes will be output in later refresh cycles.

After power is applied, a means to fill memory with identical bytes is used to empty the memory. To fill an empty memory with a string of characters, a ripple priority mechanism can be used to modify the basic search and match mechanism so that only the first byte that satisfies the search part is modified, but no other bytes that satisfy the search are altered. Within a single cell, a flip-flop is set as the bytes in the cell are being searched, and is cleared after a successful search is detected. The byte is modified in a successful search only if the flop-flop output is "1". One byte can be written in each refresh cycle by this means. In a multiple cell system, a ripple priority circuit is also used between cells. The priority circuit causes all flip-flops except the flip-flop in the prior cell to be cleared. This prioritized context-addressing mechanism is needed to fill memory with different data in each byte.

Figure 5:
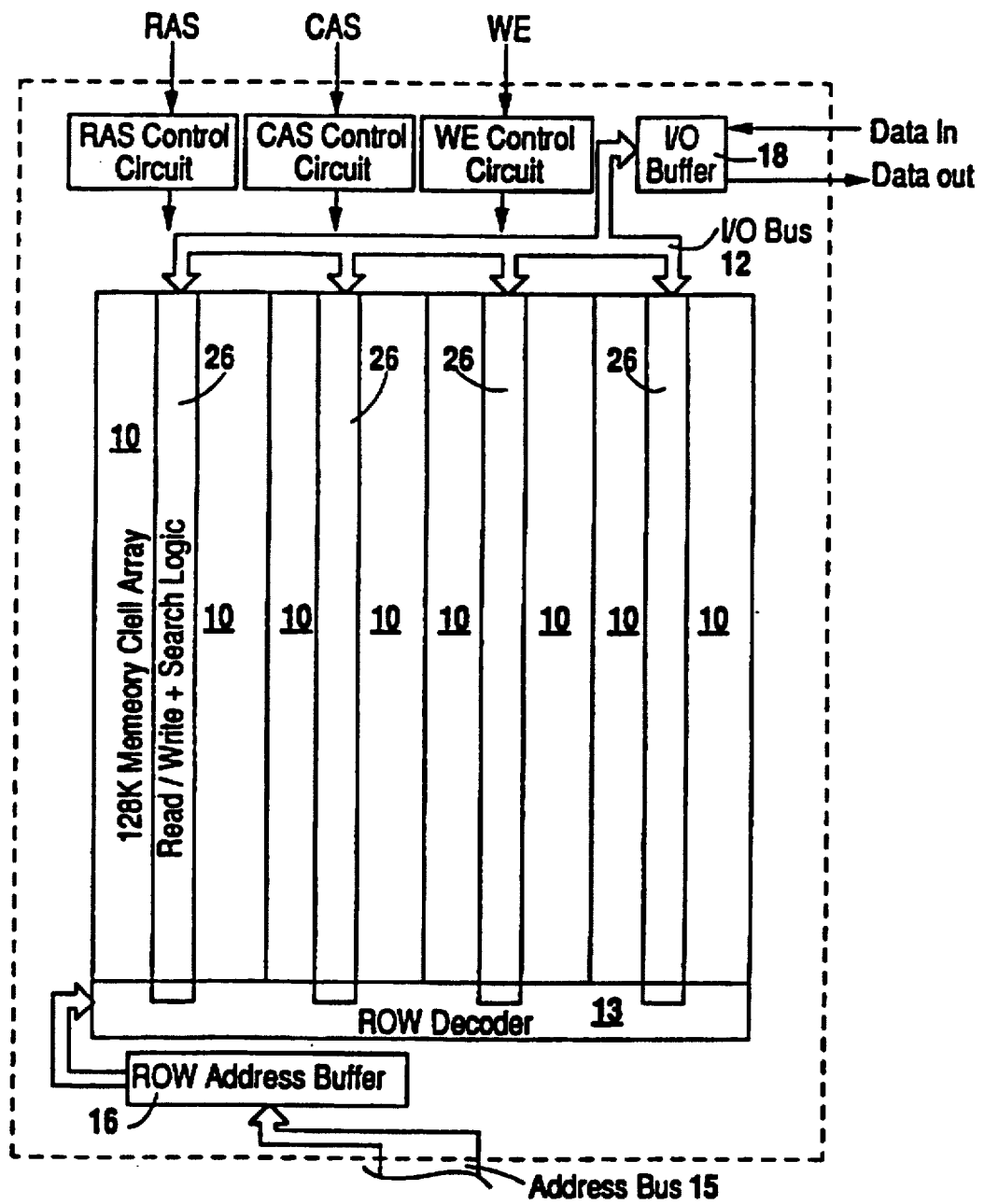
FIG. 5 is a block diagram of a one-megabit dynamic random access memory employing logic in refresh circuitry according to the present invention.

The above-disclosed additional search logic can be easily implemented in existing dynamic random access memories by using preexisting memory cells, row decoders, read amplifiers, write amplifiers and multiplexers but removing the column decoders and inserting search logic including the comparator and comparand register into the read/write circuits. If this is done, for example in the Hitachi HM511000 (a one-megabit DRAM), the entire memory can be read, searched and rewritten in approximately 60 microseconds (the time required to refresh the entire memory). Such a memory is shown in FIG. 5 and illustrates placement of search logic 26. If a system incorporates a number of memory chips, and a string of characters is searched, the time required to search all data in memory will remain 60 microseconds per character searched.

Although content search and update, input and output are the logical operations herein disclosed, it will be understood that other logical techniques can also be implemented. For example, the various techniques used for searching and updating a data base, such a relational data base, as disclosed in "Architectural Features of CASSM: A Context Addressed Segment Sequential Memory," Proc. 5th ISCA. pp. 31-38. Apr. 1978. authored by the present inventor, and related work on the CASSM system cited in that paper, can be implemented. Other modifications, additions, or deletions can also be made without departing from the scope of the invention. For example, the present invention is equally applicable to memories, only a portion of which is dynamic memory.

The invention thus allows associative searching of a dynamic memory integrated circuit with a redesign of only a small part (removing column decoders, and adding comparators and comparand registers to the refresh circuitry) of a preexisting chip memory. This results in low development cost, little if any increase in manufacturing cost, and utilization of existing DRAM facilities without the need for extensive retooling. Use of the invention will allow associative searching of very large data bases stored entirely in fast dynamic memory with very little increase in cost over an unmodified dynamic random access memory.

FIGS. 6 and 7 illustrate the organization of a semiconductor chip incorporating another embodiment of the present invention. As mentioned above, it is important to only slightly modify the architecture of an existing DRAM chip (FIG. 1), keeping the memory array intact, so that the cost of modifying the design of an existing DRAM chip to produce the present invention will be small relative to the cost of designing a full chip.

Referring to FIG. 6, in a refresh operation, one column is refreshed sequentially, one bit after another, using one sense amplifier. The data in the column, stored in column cells 27, are collected together in groups of four pairs of column cells each to form word cells 28. Thirty-two word cells are arranged within a pair of existing DRAM subarrays 29, and the chip includes eight pairs 29 of DRAM subarrays. Thus, in a one-megabit memory, each column cell includes 512 bits.

As explained above, in a refresh operation, one column is refreshed sequentially, one bit after another, by one sense amplifier. For simplicity, as shown in FIG. 6, the eight column cells 27 forming each word cell 28 can be considered as four columns in each of two neighboring DRAM subarrays, thereby forming the four-column, two-row rectangle shown to read or write one byte at a time. Of course, any number of column cells per word cell can be used. Connecting each of the column cells is a data bus 31.

Referring to FIG. 7, a detailed block diagram of a word cell used in FIG. 6 is shown. In FIG. 7, eight identically configured column cells 27 are presented. For clarity, only the upper left column cell 27 in FIG. 7 is described. However, it is understood that each of the other seven column cells in FIG. 7 are configured identically. Each column cell 27 includes a mask flip-flop 32 including storage capacitor 33 which stores a mask bit for each refresh cycle. Also included in each column cell 27 is a physical 512-bit memory subarray 34 and dedicated sense amplifier 36. In this embodiment, each column cell 27 also includes a four transistor comparator 30. The output of each word cell is commonly connected in a wire-OR configuration to a dual-rank (master slave) set-clear match flip-flop 37 which includes two NOR gates 38 and 39 whose inputs are set and clear inputs of flip-flop 37. Capacitor 41 within flip-flop 37 is the slave of dual-rank flip-flop 37.

As noted earlier, a refresh cycle is a period of time required to refresh one bit of one column with one sense amplifier, and is performed simultaneously for each column in the memory. A refresh cycle is divided into a row address strobe time (TRAS), where row address strobe is asserted, and a column address strobe time (TCAS), where column address strobe is asserted. TCAS is distinct from and after TRAS. Also as noted earlier, a refresh operation is the period of time required to refresh all bits within a single column.

According to the present invention, during TRAS, a mask is sent on data bus 31 and is stored in mask flip-flop 32, and during TCAS, data is sent on data line 31. This is directly analogous to the time-multiplexing of row address and column address in a convention DRAM. In a refresh operation, the large (4096-bit) data and mask values are time-multiplexed on 8-bit data bus 31. For example, if in a refresh operation, the data value is a 4096 hexadecimal bit value of the form, for example, 1234. . . , and the mask value is a 4096 hexadecimal bit value, for example, 5678. . . , then in the first refresh cycle in the refresh operation, hexadecimal 56 is sent during TRAS, and hexadecimal 12 is sent during TCAS. In the second refresh cycle of the refresh operation, hexadecimal 78 is sent during TRAS, and hexadecimal 34 is sent during TCAS, and so forth. In all, 512 pairs of bytes are sent sequentially as they are used to search or write data as it is being refreshed inside each word cell. In a write step, the pair of bits sent in the same position in the data and mask bytes during TCAS and TRAS will be "10" when the comparand value is a "0 ," "11" when the comparand value is a "1," and "00" when the comparand value is a "don't care." In a compare step, however, in order to reduce comparator logic, the pair of bits sent during TCAS and TRAS will be "01" when the comparand value is a "0," "10" when the comparand value is a "1," and "00" when the comparand value is a "don't care."

According to the present invention, when the circuitry of FIG. 7 is added to the refresh circuitry of a DRAM, an associative memory structure is presented that allows the associative searching of data within the memory as it is being refreshed.

Specifically, a No-op instruction, which does nothing but refresh the memory for one refresh operation, is accomplished by amplifying data with sense amplifier 36 and writing that data back into the memory cell 34 without modification. No data go to or from data bus 31.

During a Word Compare instruction, a data and mask value bit is used for each column, and each column is searched for all words in all memory chips during one refresh operation. A match bit for a word is set if, for each column that the mask bit is 1, the data bit is the same as the bit in the word and column. More specifically, for a Word Compare instruction, match flip-flop 37 is set to "1" at the beginning of the refresh operation. In each refresh cycle, the mask and data are sent, the left bit being sent first during TRAS and stored in mask flip-flop 32 in each bit cell, with the right bit being sent during TCAS. If the word has a "0" and the first bit is a "1," then match flip-flop 37 is cleared. If the word has a "1" and the second bit is a "1," then match flip-flop 37 is cleared. The control signal Compare is asserted at the end of the refresh cycle when comparator 30 has stabilized, to clear match flip-flop 37 if a mismatch is detected. Data in a cell are refreshed during a Word Compare instruction.

During a Word Write instruction, three-input AND gate 42 is utilized. The mask data stored in mask flip-flop 32 and sensed data are sent during TCAS and are used to rewrite data in the cell. If in a word cell the Mask and Match bits are both high, data are rewritten into the cell. Otherwise, data in the cell are refreshed. During a Word Output instruction, during TRAS, a high signals is sent on data bus 31 so as to output all bits. During TCAS, the Word Write instruction is asserted and data from sense amplifier 36 are applied to data bus 31 and are also refreshed in the cell.

For the next set of instructions, words are considered linearly ordered (top to bottom) and prioritized (higher words are considered to be of higher priority). In addition, the first of these instructions take advantage of the word structure mentioned earlier wherein the most significant bit in a word is a mark bit distinct from the character bits of a byte.

During a Character Compare instruction, the master of match flip-flop 37 is initially set and the Word Compare instruction is executed on the whole byte to clear match flip-flop 37 if there is a mismatch where the mask bits are "1." Then, the slave of match flip-flop 37 is written into the mark bit (high-order bit) of the next byte using extra transistor 35 (by delaying the signal from the slave match flip-flop 37 in one refresh cycle time), and finally, the master of match flip-flop 37 is copied into the saved flip-flop. Data are refreshed in a Character Compare step.

In a Word Compare Up instruction, the Word Compare instruction is executed during each refresh cycle of a refresh operation. The contents of the match bits are then shifted upward one bit logically at the end of the refresh operation. Similarly, a Word Compare Down instruction executes the Word Compare instruction during each refresh cycle of a refresh operation, and then, at the end of the refresh operation, the contents of the match bits are shifted downward one bit logically. A Word Compare Prior instruction executes the Word Compare instruction during each refresh cycle of a refresh operation, and then clears the match bits downward from the first one that is set at the end of the refresh operation.

To execute a Word Output instruction, for the prior word cell having the match bit set, one refresh operation is used to output one word, and at the end of each refresh operation, the match bit of the word ouputted is cleared. The Word Output instruction is repeated until all match flip-flops are cleared. To execute a Word Write instruction, for the prior word cell having the match bit set, for each refresh operation, a word is written and the match bit is cleared. The operation is repeated until all match flip-flops are cleared.

A typical instruction begins with the transmission of an appropriate instruction code on the data lines during a period of time that the memory executes a No-op cycle. As mentioned above, during each refresh operation, 512 refresh cycles occur, and the instruction is executed during each of the refresh cycles.

The memory requires comparand data to be supplied very rapidly. Data to and from the memory could be supplied by a video RAM, or by use of a technique known as "shuttle memory." wherein a pair of static RAMs are connected by multiplexers to the associative memory and a conventional host computer so that when one is connected to one the other is connected to the other. As the computer rewrites data in one static RAM, a fast counter addresses the other to read or write consecutive words in it to or from the associative memory during one refresh operation. At the end of the refresh operation, the pair are exchanged, thus shuttling the static memories to and from the associative memory and computer.

To facilitate multiple cell operations, particularly during execution of the Compare Prior, Write, and Output instructions, a priority line is required. Priority selection can be understood in a chain of OR gates, as illustrated in FIG. 8. A request causes a "1" to ripple through the OR gates leftward, causing any request there to be denied. This priority chain is implemented according to the preferred embodiment using a lookahead binary tree for speed and faulttolerance. FIG. 9 shows a two-level tree. A deny equals "0" is put into its root, and Request and Deny of the leaf nodes are connected to match flip-flops 37 (FIG. 7). The Compare Prior instruction can clear non-prior (denied) match flip-flops. The effective match value used in Write and Output instructions has to be true in only one cell, the prior cell. Three-input AND gate 42 cancels a match in non-prior cells in input C1 is asserted.

A priority network for data bus 31 is shown in FIG. 10 and is a binary tree of bidirectional bus drivers controlled by the priority tree of FIG. 9. The root of the priority tree of FIG. 10 is connected to an external controller having a shuttle memory, and the leaves are connected to word cells. When data is sent to the cells, all leaf-ward directed bus drivers are enabled and all root-ward directed bus drivers are disabled. When data are collected from the cells, the opposite is true. The match value determines the prior cell, which outputs data. Note that the priority tree of FIG. 10 can be used to guide data in data bus 31.

Referring once again to the circuit of FIG. 7, appearing in the lower, righthand corner thereof is a simple error-detection circuit, which uses one parity bit for all of the data bits in a word cell. All of the column cell data lines are connected and input to exclusive-OR gate 43. At the beginning of a refresh operation, dual-rank flip-flops P1 and P3 are initialized to zero, and early in a refresh cycle, flip-flop P3 is loaded with the exclusive-OR of all eight data bits that are read from memory along with the old value of P3. Later in the refresh cycle, flip-flop P1 is loaded with the exclusive-OR of all eight data bits that are written into memory along with the old value of flip-flop P1. At the end of a refresh operation, flip-flop P1 contains the parity of all the data bits that have just been stored in the cell's memory. The output of flip-flop P1 is stored in flip-flop P2. At the end of a refresh operation, flip-flop P3 contains the parity of all the data bits that have just been read back from the cell's memory. The parity computed and stored in flip-flop P2 should match the parity computed and stored in flip-flop P3. If the computed parity in P2 differs from the stored parity in P3, there is a parity error in the data. The error signal is applied to the master of match flip-flop 37 when the match bit is stored in the slave of match flip-flop 37 at the end of a refresh operation.

Faulty cells can be handled by pruning the trees used for next neighbor connection in the bus. By asserting the fault line (FIGS. 9 and 10), data bus 31 is pruned to isolate an error in a subtree, forcing open both tri-state drivers in the link above the subtree, and the priority tree is pruned in a node above the faulty tree, forcing a request of "0" into the rest of the tree.

It is believed that the cost of the modified associative DRAM chip according to the present invention will be similar to the cost of current DRAMs. A typical DRAM sense amplifier has six transistors, and its column address decoder has four transistors. Removing the column address decoder, as required by the present invention, and adding one bit of mask, a comparator, and a parity checking exclusive-OR gate (together implemented with approximately eleven transistors), slightly increases the sense amplifier size. According to the present invention, each word cell has a match flip-flop, parity checking flip-flops, and associated logic requiring approximately 35 transistors, and for each word cell there is a node of the priority tree, requiring approximately six transistors. Amortizing this word cell logic over the total number of sense amplifiers in the word cell, on the order of five additional transistors would be required per sense amplifier. Thus, the present invention would require approximately 24 transistors per sense amplifier, thereby only slightly increasing the required integrated circuit chip area. Moreover, since address pins are omitted, a chip embodying the present invention could be packaged in an 18-pin package (VDD, VSS, RAS and CAS clock and a signal to indicate the start of a refresh operation, a write signal to control the data bus direction, two shift pins, request-deny signals, and eight data lines). Thus, according to the present invention, searching of an associative DRAM is accomplished using circuitry integrated within the refresh circuitry on the same integrated circuit chip as the memory array. That results in highly parallel logical operations being performed on data in memory cell arrays, in addition to using the high-bandwidth data paths that exist in refresh circuitry.

The above-described circuit can be used in a storage system as a buffer to facilitate the searching of data that are read from a non-volatile storage device, such as a hard disk. Use of such a system permits parallel searching, shortening the time needed to access and locate information that had been read from the disk. Although the following description refers to one particular kind of hard-disk system, the invention has equal application with any kind of storage system, including tape drives, optical storage, other kinds of hard disks, floppy disks, so-called "flash" memories or any other kind of non-volatile storage device, presently existing or later developed, and whether or not buffered with intermediate volatile storage.

FIG. 11 illustrates a hard-disk embodiment of the storage system of the invention. Hard disk 51 contains a series of disk surfaces or platters 51a, 51b, through 51n, on which a series of heads 53a, 53b, through 53n record data on, and read data from, tracks and sectors arranged in any known design. Any number can be used for the subscript "n." One type of high-capacity disk 51 is the 1.5-gigabyte Winchester hard drive manufactured by Maxtor Corp., which has n=19 storage surfaces, but drives with greater or lesser capacity or number of platters and heads are suitable. Switchable bus 61 connects disk drive 51 to computer 65 and memory banks 73 and 75, which are described in more detail below. A second switchable bus 67 connects computer 65 to memory banks 73 and 75 and is also described below.

Heads 53 are controlled by hard disk controller circuitry 55a, 55b, through 55n, shown in FIG. 12. Controller 55a can comprise a disk controller of known design, which contains read-write logic and head-positioning control, often integrated onto a single chip. Controller 55a can make DMA requests and can control a stepper motor or other head-positioning device 57, which may also contain an indexing sensor. Thus, disk drives of standard design include platters 51, heads 53, controller 55a, and head motor 57.

By contrast, the system of the invention also includes additional controllers 55b through 55n, each of which is associated with and controls one of heads 53b through 53n. The additional controllers must be capable only of governing the read and write operations of their associated heads. The positioning and DMA-request functions of a standard controller are performed in the system of the invention entirely by controller 55a, and controllers 55b through 55n act as "slaves" to the master controller 55a. Controllers 55b through 55n need not include, therefore, all of the circuitry of master controller 55a, but it may be economically desireable to use mass-produced controllers for each of controllers 55, in which case the control signals outputted by controllers 55b through 55n can be disabled or ignored.

In sum, the disk portion of the invention utilizes a standard disk drive, modified to contain additional controllers 55b through 55n. Those controllers perform the added function of reading or writing data in parallel from a "cylinder," which for the purpose of this patent means the same track and sector located on the set of all of the platters 51a through 51n.

For purpose of the invention, it is preferable to store data on the disk in a "striped" fashion, in which adjacent elements, such as a byte, are recorded on adjacent platters within a cylinder. For example, byte number one would be located at a first address on platter one of a cylinder, byte two would be located at the same address on platter two of the same cylinder, byte n would be located at the same address on platter n of the same cylinder, byte n+1 would be located at the next address on platter one of the cylinder, etc. The elements can comprise a single bit, several bits, or several bytes, instead of the single byte of data as described above. Such "striped" data arrangements take full advantage of the parallel capabilities of the system of the invention.

FIG. 13 is a timing diagram showing an example timing for extracting data from disk 51. At the beginning of the cycle, controller 55a positions the head and each of controllers 55 read a byte's worth of data and store it in temporary registers 59a through 59n (shown in FIG. 12) for an entire cycle. Each byte is then placed on multi-line data bus 61 sequentially from those registers until the cycle is complete. Other arrangements are contemplated, including systems that utilize staggered reads. The process is simply reversed when the system is used to write data back onto disk 51.

Returning to FIG. 12, computer 65 controls switch 63 to direct the data on bus 61 to one of two memory banks, Bank A shown at numeral 73 or Bank B shown at numeral 75. Two memory banks are used in the embodiment shown to allow the system to fill the second bank with data while computer 65 interrogates the first bank. Although two banks are shown, the invention can be practiced in a simplified version with only a single bank or in a more complex version with more than two banks.

In the embodiment shown, computer 65 contains a microcontroller, a DMA controller, a suitable non-volatile program store, and a suitable memory such as a quantity of static RAM. Those elements are integrated in some devices, such as the "Business Card Computer" sold by Motorola, which contains a Motorola 68340, but other devices or combinations are suitable.

Computer 65 alternates contact between data bus 67a leading to memory bank A and data bus 67b leading to memory bank B. The arrangement is illustrated in FIG. 14, in which the system is illustrated in a particular state. Disk 51 in FIG. 14 is shown filling bank B 75 through bus 61b. Meanwhile, computer 65 interrogates bank A 73 through bus 67a.

Bus control is accomplished by altering the state of a number of tristate drivers, shown in FIG. 12 as small triangles. The following specific parts are suitable: the 244 unidirectional tristate bus driver, the 245 bidirectional tristate bus driver, and the 373 latch or register with tristate output. As one memory bank reaches its capacity, computer 65 switches buses 67 to contact the filled bank, flips switch 63 to connect controller 55a to the other bank, and switches bus 61 to permit data to begin filling the other bank.

Figure 15:
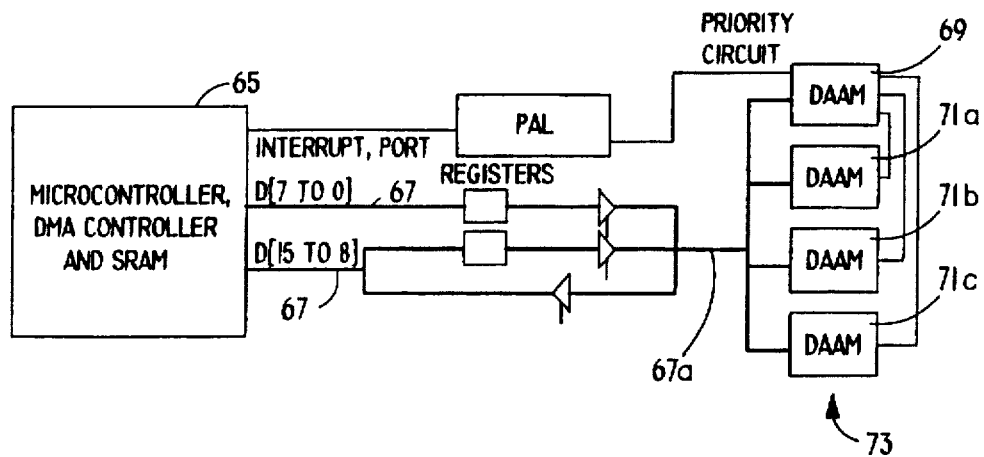
FIG. 15 is a block diagram illustrating a portion of the circuitry of FIG. 12, including principally the portion that relates to searching data in the memory of the invention.

FIG. 15 reproduces a portion of the circuitry of FIG. 12, isolating only one of the memory banks 73 and 75 and its associated bus, namely the bank and bus in contact with computer 65 at a particular time. The example illustrated in FIG. 15 shows computer 65 in contact with bank 73 along data bus 67a. The other memory bank and bus, and the disk elements and bus 61 loading it, are omitted in the simplified version of FIG. 15.

Each bank 73 and 75 contains one or more dynamic associative memory devices ("DAAM"), preferrably as described in detail in connection with FIGS. 3 through 10, above, or another form of content-addressable memory, in which the data may be searched for a match while in the memory. FIGS. 12 and 15 show four DAAMs per bank, labeled in FIG. 15 with numerals 69 and 71a through 71c. In the sample embodiment of FIG. 15, a tree topology connects the DAAM to implement a look-ahead priority circuit, where DAAM 69 serves as the root and acts as one leaf of a tree, with DAAMs 71 as other leaves. The tree structure has the same purpose and benefits as that used inside the DAAM chip, described in connection with the description of FIGS. 7 through 10, above. Also, the priority circuitry of FIGS. 12 and 15 serves the same function as the similar circuitry within the chip shown in FIGS. 7 through 10.

Figure 2:
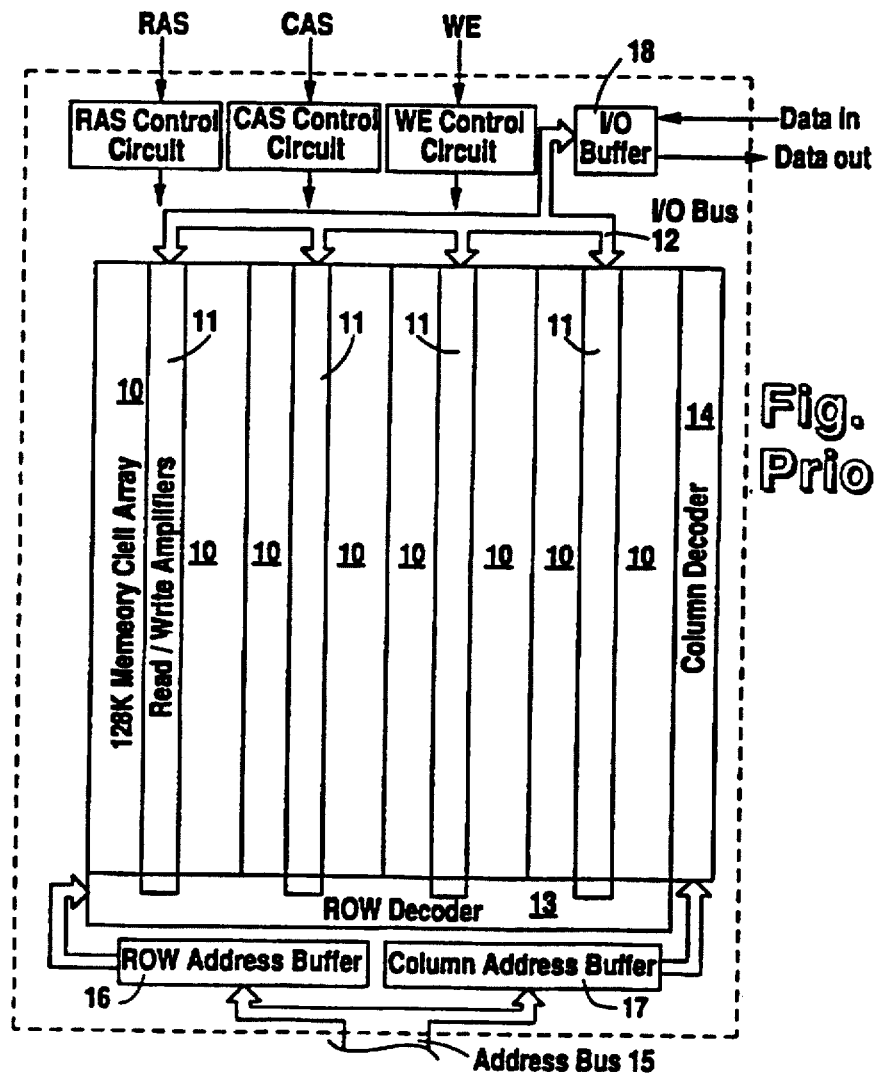

DAAMs 69 and 71 in FIGS. 12 and 15 can be replaced with a single DAAM device, depending on the access rates of disk 51 and DAAM 69 and the number of platters 51a through 51n. In particular, one DAAM chip such as that shown at numeral 69 can receive data from at most the number of controllers 55 equal to the integral portion of the ratio of the bandwidths of DAAM chip 69 to controller 55. For example, the one-megabit DAAM described above in connection with FIG. 2, which is designed to use the Hitachi chip as its base, has a cycle time of about 120 nanoseconds across an eight-bit bus, which results in a bandwidth of 8.3 Mbytes/sec. The controller on the Maxtor hard disk referred to above can read data at a rate of about 2.0 Mbytes/sec. Thus, each DAAM chip of the sort identified above can be fed by at most four controllers of the sort used in that kind of disk drive. Therefore, the 19-platter Maxtor drive would require at least five DAAM chips. A DAAM chip that operates 2.3 times as fast and uses a 16-bit bus, however, could be fed by all of the 19 platters on the Maxtor drive, without the need for a second DAAM device in the bank.

There is a second constraint, however, on reducing the number of DAAM chips, namely the desire to avoid slowdown of the system by having sufficient storage capacity. It is most efficient to read entire cylinders from the disk at once, but to do so requires that the bank contain sufficient storage capacity. Even if there is sufficient bandwidth available to fill the DAAMs, unless the DAAMs contain enough capacity, the system designer would likely wish to add extra DAAMs to each bank rather than slowing down the reading operations by reading only part of the cylinder into the bank on each step. For example, a preferred system design for the above-referenced Maxtor drive would require enough DAAMs in each bank to store the approximately seven megabits on each of the drive's cylinders, or eight units of a one-megabit DAAM. If those DAAMs operated only as fast as the ones described above using the Hitachi chips, however, the system would be bandwidth constrained. A preferred system design would be neither capacity constrained nor bandwidth constrained, allowing the user to upgrade the disk drive to one having somewhat faster output speed or somewhat larger cylinders, without replacing the DAAMs or associated circuitry.

If a number of DAAM chips are used in each bank, the data on disk 51 can be arranged in a staggered fashion across disk channels, where each disk channel is defined as one DAAM chip, the controllers to which it is connected, and the platters controlled by those controllers. In that alternative arrangement, data would be arranged with the first byte at a given position on platter one of a given cylinder, the second byte at the same position on platter five of the same cylinder, etc., where the system was arranged with one DAAM chip 69 or 71 controlling four controllers, such as 55a through 55d.

The system of the invention can constitute one of a number of modules, each of which can contain one of the modules as illustrated in FIG. 12 or otherwise in accordance with the system of the invention. FIGS. 16a and b illustrate several examples of such modular arrangements. In system 81, a larger number of banks containing one or more DAAMs are arranged in a parallel structure. In system 83 of FIG. 16a, two computers interrogate one bank of memory each while the disk fills a third bank. An arbitrary one of the microcontrollers, there controller "C," also acts as a disk controller. Any of the microcontrollers can be dynamically allocated to control the disk, but FIG. 16a shows only one possible connection, for clarity. Additional computer-memory pairs can be added, subject to disk access constraints. In system 85 of FIG. 16b, a number of computers, memory banks, and disks use a multistage interconnect network such as a one or more crossbar switches to implement buses 61 and 67 in FIG. 12. The interconnection network can be configured to permit any disk or any computer to access any memory bank. Any of the microcontrollers can control any of the disks by communicating through the bus connecting crossbar 67 to crossbar 61. System 85 can also include a configuration in which the multistage interconnect network is arranged in a hierarchical system.

The system of the invention can accomplish standard disk data and housekeeping operations. Data can be altered by computer 65 while located in DAAM 69 or 71 and written back onto disk 51 upon command, using the reverse of the disk-reading operation described above in connection with FIGS. 12 and 13. New data can be added to free space at the "bottom" of any of DAAM 69 or 71, and written to disk 51 at any free space on a cylinder. Data tagged for deletion can be deleted by sequentially reading and rewriting all of the data on the disk, such as at an off-hour. As the data are read, the garbage items are blocked from being placed into memory by issuing a NOP command to the DAAM when a tagged item is read from the disk. Next, the contents of the DAAM are written back onto the disk, overwriting the old data with only data not tagged for deletion, thereby condensing the data and deleting the garbage.

The memory of the invention can be readily used for full-text retrieval operations, particularly although not necessarily in conjunction with the disk-based embodiments shown in FIGS. 12 or 16. In such uses, it is desireable to arrange the data in a fashion that takes advantage of the parallel search capabilities of the memory.

Although other systems are possible, FIG. 17 illustrates an example arrangement of sample data within the memory of the invention. In the illustrative system, each word of memory is divided into a series of atoms, each of which contains one data word, such as an English word, and associated data. For simplicity and avoiding of terminological confusion, it is assumed in connection with the description of FIG. 17 that each row of memory stores one logical associative memory "word," although as noted above, that assumption is not a necessary one.

The number of atoms in each row is predetermined and set so as not to fill the entire row with the data, thus setting aside some additional storage in each row to serve as "scratch" locations at the end of each row. The example in FIG. 3 shows three atoms per word, but it is both feasible and desireable to use a greater number of atoms in a wider word.

Each atom contains a fixed number of bits for storing a data word, called a field, and another fixed number of bits for storing data associated with the data word in another field. In the example shown in FIG. 17, the associated data includes only the position of the word in the document, but other data can also be stored, some examples of which are described below.

In the coding system illustrated in FIG. 17, the memory is loaded by placing a unique code representing the data word in the first field of the atom, in which the code is determined from a table that contains all of the English words that are used in the document. The table can be pre-filled with likely words and additional words added when a new word is encountered. Although binary code words, not letter codes such as ASCII codes, are stored in the memory, the memory map in FIG. 17 uses letters for ease of display.

As each data word is encountered, the device avoids loading common "stop" words, such as "a" and "the." A counter is incremented, however, for all words, including stop words. For each loaded data word, the contents of the counter is placed in a field of the atom immediately after the loaded data word. The location counter is zeroed at the beginning of each row and copied into a predetermined scratch data field at the end of each row. In FIG. 17, the second column in the scratch field to the right of the double line indicating the start of the scratch data, is reserved for the number of data words in the row.

Thus, each atom contains both a data word and an indicator of the position of the word in the data. Because the count is restarted in each row, the position indicator specifies the position of the data word relative to the beginning of the row. The scratch field contains the total number of words in the row. It is also notable that the position indicator and the counter is different from the memory location, that is the atom number in the row, because of the deletion of stop words. In addition, the scratch field containing the total number of words can differ from the position indicator in the last atom storing a data word, if there are "stop words" after the last stored data word. For example, in the second line of FIG. 17, the last data word, "song," is at position four, but the stop word "a" follows it, resulting in the row counter being set at five.

Data words are loaded into the atoms of a row, in the example of FIG. 17, until the end of the row is reached, the end of the document is reached, or one of the data word codes is repeated, whichever comes first, at which point the device begins filling the next row. The embodiment of FIG. 17 prevents a row from containing more than one occurrence of any data word, which is useful in searches, as shown below.

A "document" can be defined as desired by the user. In one system, for example, a new document can be started at the beginning of each English sentence, and that method is illustrated in FIG. 17. In other embodiments, it may be desired to consider documents as actual text blocks, such as a newspaper article, memo, letter, page, or other unit, whether of fixed or variable length. In the embodiment of FIG. 17, a column of scratch data is reserved for a flag indicating the top of a document, illustrated in FIG. 17 as the first column to the right of the double line, which contains a zero for all rows that begin a new document.

The invention contains circuitry, which is described above, for comparing an associative memory data word with a comparand during a refresh operation, allowing for parallel searching of all data in a row. That circuitry can be used to match any portion of the contents of the atoms in a row. A related instruction searches for matching data words and, if a match is found, transfers data located an offset number of bits away to a specified location. That Compare and Transfer instruction greatly facilitates searching by locating a data word in a row, and if it is found, transferring the position of the data word in the document, relative to the beginning of the row, to a specified location in scratch.

FIGS. 18 through 20 show several examples of problems common to database manipulation and full-text retrieval, illustrating how the invention permits easier or faster solutions to those problems.

FIG. 18 illustrates a flowchart describing a sample program implementing a Boolean search using the embodiment of the invention described in FIG. 17. The problem is to determine if a series of terms (t1. . . tn) are located, in a predetermined logical relationship, in a document. The relationship may constitute any combination of Boolean logic, however complex. For example, the user may wish to query the database to find all documents discussing the relationship between music and mathematics but not dealing with computer music, by asking for all documents (whether sentences or memos) that contain the terms "song" or "music" and "mathematics" but not the term "computer."

First, the top of document flag is transferred to a single flip-flop associated with each row, known as the qualify bit, which is used to prevent data from being shifted across document boundaries. Next, the compare instruction is used to determine if the first search term ("song") is present in each row. Each row in which the term is located is marked by setting another flip-flop located adjacent to each row, known as the match bit "M." Next, the M bits for all rows are shifted down and combined with the adjacent M bit with a logical "OR" function, except for those rows in which the Q bit has been set to indicate the top of the document. The shift and combine process is reiterated enough times to exceed the maximum possible number of rows in a document, after which the M bit of the last row of each document will contain an indication of whether the term has been found.

The last-row M bits are transferred to a first scratch bit in the scratch field. The M bits are cleared, and the process is repeated for each search term, resulting in additional scratch bits being set.

Next, the M bits are cleared again, and the scratch bits, including the top-of-document bit, can be searched with a mask to determine if all of the terms are present or not, as specified. In the case of complicated Boolean searches, it may be necessary to break down the search into parts, in which the result of each part is stored in a single scratch bit, and a final comparison is done on the scratch bits set by each of the several parts. The process may be longer but require the use of fewer scratch bits. Because any Boolean comparison can be expressed as the sum of simple Boolean products, the system can be generalized to any Boolean expression, however complex.

FIG. 19 illustrates a flowchart describing a sample program implementing a string search using the embodiment of the invention described in FIG. 17. A string search represents a database query in which the user wishes to locate a series of search terms in sequence. To accommodate a string search, it is useful to structure the memory so as to have each atom contain, besides the code representing the data word and the position indicator, a mark bit. Such a mark bit would be associated with each data word, therefore, not only with each row.

The program searches each atom, according to the methods and using the instructions described above, and sets the mark bit associated with each atom in which the data word matches the first search term. Next, the program searches for all instances in which a data word matches the second search term and in which the mark bit for the previous atom has been set. That search can be done with a single instruction, because of the device's ability to match any sequence of bits, without regard to whether the bits represent a data word or the associated data. The previous atom's mark bit is cleared, regardless of the outcome, but all instances in which the second search results in a match are marked by setting the mark bit for the atom in which the second search term has been found. Finally, the program repeats the process as described in the second search for the third and all remaining search terms, which results in mark bits being set only for the final data words of each instance in which the search string is located.

FIG. 20 illustrates a flowchart describing a sample program implementing a proximity search using the embodiment of the invention described in FIG. 17. In a proximity search, it is desired to query the database to locate all documents in which search terms are located within a specified distance from each other in the document.

For illustration, the scratch data fields of FIG. 17 are filled with numbers generated from the case in which the program in FIG. 20 operates on the data in FIG. 17 during an example proximity search, which seeks to identify all instances in which the search term "good" is located within two English words of the search term "song."

First, the program searches the rows of the memory for a match to the first search term, here "good," and places the positional indicator associated with a match in a scratch field, shown as the third column in the scratch data of FIG. 17. If no match is found, the first of a five-bit scratch field, shown in the fifth scratch column in FIG. 17, is set. The process is repeated for the second search term, here "song," and the result placed in another scratch field, shown as the fourth scratch column in FIG. 17. If no match is found, the second of the five scratch bits is set.

Next, a limit subprocedure is invoked, to do the mathematics of comparing the two addresses to the limit, which is in the example, two words. The two numbers are subtracted, the difference is compared to the limit, and the third of the five scratch bits is set if the difference is greater than the limit. Next the difference is compared to the negative of the limit, because the two terms can qualify for the search regardless of which one appears first in the document, and the fourth of the five scratch bits is set if the difference is less than the negative of the limit. Finally, if all four scratch bits are unset, a fifth bit is set indicating those rows in which the proximity search has been satisfied, rows two and five in FIG. 17.

It is desireable to check for cases in which the two terms are within the desired proximity across a row boundary, and the program in FIG. 20 accomplishes that function also. For all rows other than the top row of a document, which is indicated by a zero in the first scratch column in FIG. 17, the following operation is performed: The number of data words from the row above (col. 2) is added to the location of the first search term (col. 3), and the location of the second search term (col. 4) is shifted from the row above. For clarity, in FIG. 17, the results of that operation are shown in columns six and seven of data, although the program would likely reuse columns three and four. The limit test subroutine described above is then repeated, with the outcome shown in the five scratch bits shown in the last column of FIG. 17 (although the actual program would reuse column five). The search thus identifies the rows in which the terms are within the desired proximity but one of the terms is at or near the end of the previous row. In FIG. 17, an example is shown for row three, in which "song" at the end of row two is two words from the word "good" at the beginning of row three.

Finally, the flowchart of FIG. 20 includes a third routine in which the data are shifted up, to attempt to locate instances in which a document row contains the second search term within the desired proximity from the first search term in the previous row. A more complex program could shift the data more than one row in either direction, thus allowing proximity queries to use a larger separation distance. The program could use the knowledge of the number of atoms per line to determine the number of shifts needed in the worst case, and perform exactly that number of shifting operations.

The proximity search benefits from the layout rule specified above preventing the same data word from appearing twice on one row. That rule avoids any ambiguities and allows the program to calculate the distance between two words in a row with only one operation.

More complex proximity searches can contain a plurality of search terms, which would require the program to operate on each pair of terms separately. The complexity of a proximity search, therefore, increases as the combination of the number of terms.

The system of the invention, however, permits more efficient proximity searching by finding the search terms in data more efficiently and transferring the address to memory quickly, which can greatly reduce the search time, even if there were no improvement in the speed of the mathematics needed to calculate and examine the separation distances. Prior proximity searching systems spend most of the search time locating the search terms, rather than verifying that the located terms satisfy the proximity requirements. The ability of the invention to shift data matching a selectable criterion to a fixed non-data-filled memory location within the row allows uniform row-by-row calculation of desired results.

The system of the invention can handle combinations of proximity, string, and Boolean searches. For example, one may wish to look for all documents containing (a) "George Bush" and (b) "arms" within three words of "hostages" but (c) not dated after the year 1988 or before the year 1984.

The system illustrated in connection with FIG. 20 can be adjusted to perform an "inner product" search, in which a weighting factor is assigned to some defined characteristic of the data. For example, each atom may include a field containing a "weight code," designed to express the frequency or importance of the data word or some characteristic about it, such as its type (e.g., whether it is a verb, a noun, etc.). Then, any of the above-described searches is run, but a "hit" is weighted by some mathematical function of the weight codes of one or more search term. For example, locating word A near word B can result in three points each time, while locating word D at least once in the document results in two points. Then, a search might request retrieval of all documents that score more than a selected number of points (say, ten), or just a selected number of the highest-scoring, that is "most relevant," documents.

It is useful to store long associative memory words along a column of dynamic memory, which in a database application may constitute a grouping of similar data, rather than along a row of dynamic memory. Row-wise storage, although straight-forward, requires as many pins as there are bits in the associative memory word for the data (and possibly the mask) operand, whereas column-wise organization requires only eight pins for the operand. Much more importantly, the two storage systems differ in the manner in which the associative memory is "scanned." Only one data row at a time can be read into the refresh amplifiers in the row-wise organization, but each row that has to be searched must be read one after another. To avoid reading all rows requires a "page management" scheduler to read only rows that need to be searched.

Column-wise organization, on the other hand, permits associative memory word columns to be read or written and other associative memory word columns to be skipped over selectively, which allows the system to utilize the comparator logic more efficiently on the data. Each atom in the column is in the refresh amplifiers at the time the search term is put on the pins. If the search instruction does not need to reference the other columns, they can be skipped over and not be read into the refresh amplifiers. (Of course, they must be periodically refreshed.) The search instruction can be sped up, if each column is of the same width, by a factor of three.

The above word organization is particularly efficient in databases with common patterns of data. For example, in a telephone directory database, the first column may contain all last names, the second column, first names, the third column addresses, and the fourth column telephone numbers. The first word of associative memory, therefore, contains all last names, but each person remains in a single row of the memory. That sort of column-wise organization is more efficient because the memory can avoid searching columns that are not involved in the search term, in which there are only "don't care" matches. For example, searching a 100-row database for "Smith" requires operation only on one word, not all four columns, and not the 100 searches that would be required in a row-wise organization. The comparator hardware is used only to search data that must be searched and not wasted searching columns that have all "don't cares." The columns to be skipped can be directly determined by noting which instruction operand's columns have only "don't cares."

DAAM instructions usually scan columns of the associative memory, which are rows of the dynamic memory chip, sequentially (say from left to right), but start the scan at some fixed column number and continue the scan for a fixed number of columns. Some instructions scan in that manner and then jump to another collection of columns to scan them sequentially, and others scan in the reverse direction. It is possible to scan all columns, and it is necessary to do that periodically to refresh all of the memory. The typical instruction refreshes only part of the memory that is actually searched, output, or written.

The routines described above include certain arithmetic or Boolean logic operations, particularly within the associative memory word. For example, the proximity search described above in connection with FIGS. 17 and 20 requires subtraction to determine the distance between located search terms. It is advantageous to implement the following system of arithmetic operations, particularly in DAAMs that have been based on DRAMs.

To perform faster arithmetic operations, the preferred circuit can utilize the following instructions. First, the Compare ("C") instruction compares the data, d, with all words in the associative memory, in parallel, in a bitwise fashion. A value, m, represents a mask value for conditional comparing. For each bit that m is not set (not masked), the corresponding bit position of d is compared to the corresponding bit position of each associative memory word. A match flip-flop for each associate memory word is set if the compare was true, otherwise the match flip-flop is cleared. The data, d, and the mask, m, can be of any bit length up to the maximum word size but must be of equal length. Comparing starts from the left of the associative memory words and moves to the right until d (and m) are exhausted. An alternate form of this instruction (as will all instructions that have both data and mask) is to express only one opcode that is a combination of d and m. In this form, the opcode will show 'x' or '?' wherever the mask would be set (masked, and therefore, don't cares). For example, if d=10010110, and m=11000011, the combined opcode would be 10xxxx10.

Second, the Multiwrite ("MW") instruction writes the value of d into all associative memory words where the match flip-flop is set and then clears the match flip-flop. Again, m is a mask value that allows conditional bit writing. (The terms d and m are as defined as in the Compare instruction. The d and m values can also be collapsed into a single opcode as defined above. )

Third, the Compare-Not-And ("CNA") instruction works as defined for the Compare instruction with the following difference: The match flip-flop is set only if (a) the compare was successful and (b) the value of the match flip-flop was zero prior to the execution of the CNA instruction. In logical terms, Match flip-flop=success of compare AND NOT old Match flip-flop (where NOT means inverse). Again, as with all instruction, the CNA is performed for each associative memory word, in parallel.

Fourth, the Compare-Or ("CO") instruction works as defined for the Compare instruction except that the match flip-flop is set if it was set previously or if the compare is successful. In other words, the match flip-flop is not cleared if the match fails, provided that the match flip-flop was set prior to the execution of the CO instruction. If the compare fails and the match flip-flop was not set, the match flip-flop remains cleared.

The device performs arithmetic operations, such as addition, comparison, and shifting for multiplication and division, on numbers obtained from a search such as a proximity query or inner product query, in a manner that is more efficient, but less conventional, than normal binary arithmetic. A typical DRAM has a "page mode" read operation that permits the system to read a whole row from the bit array storage (which is a column of associative memory in the embodiment discussed above) into the sense amplifiers. Using that function allows the arithmetic operations to be speeded up by about a factor of four by searching and rewriting data while the data are in the sense amplifiers, rather than outputting the same data from the bit array each memory read operation, searching or modifying them, and then rewriting them back into the bit array storage.

However, to efficiently search and modify the data in the sense amplifiers, an associative memory word must have all the bits that will be searched or modified simultaneously available in the sense amplifiers associated with that word. It is preferrable, therefore, to arrange the data so a byte-wide column of the associative memory word is in the eight sense amplifiers. Although eight amplifiers are used for exemplary purposes, it is possible to use any number of amplifiers in each row, as long as there are at least two.

Consider adding two numbers, identified here as two nine-bit numbers a8, a7, a6, a5, a4, a3, a2, a1, a0 and b8, b7, b6, b5, b4, b3, b2, b1, b0, where for instance a3 is the third least significant bit of the number a. In the rightmost byte of scratch memory, the data are arranged so as to have, in order, a carry bit (c), an unused bit, then a2, a1, a0 and then b2, b1, b0. In the second rightmost byte of scratch memory, the bits are another carry bit, an unused bit, then a5, a4, a3 and then b5, b4, b3. In the third rightmost byte of scratch memory, the bits are another carry bit, a carry used during the addition of bit a7 to b7, which is called "mid carry" and is used to indicate a two's complement number overflow, then a8, a7, a6 and then b8, b7, b6. The least significant bit a0 is added to b0, and the result is put into carry c and b0, according to the series of operations in the program described in FIGS. 21a and b, which illustrates the special treatment of the least significant bit and most significant bit. The significance of this organization of data is that four of the instructions shown sequentially above can be executed in the time it takes to execute one such instruction if data are read from a row of the bit array into the sense amplifier, operated on, and then written back into the row of the bit array.

Any operation that can be defined in terms of a truth-table can be implemented using operations C, CO, CNA, and MW; the rows of the truth table where the result (number b) or the state (carry c) change are coded into a pair of instructions, a C instruction is used to identify the input pattern, and the MW instruction is used to write the changed pattern. To improve the program's efficiency, if patterns require the same change, the two instructions C MW and C MW can be replaced by the instruction sequence C CO MW.

Thus, the inventive memory circuit permits on-chip arithmetic through the appropriate programming of sequences of the above-described operations.

Another application in which the inventive circuits can find substantial use is the field of graphics rendering. Realtime display of computer-generated 3-D scenes (called 3-D rendering) requires considerable computational power and very high memory bandwidth. Current conventional rendering systems include pipelined "pixel processors" to calculate the data that should be displayed by each picture element, and "z-buffers" to identify the objects visible at each element. The calculated information is stored in a "frame buffer," which maps the results of the calculations and which is accessed to refresh a low-persistence screen, such as the cathode-ray tube displays commonly used as computer displays.

However, conventional systems have had difficulty achieving the computational power and high memory bandwidth needed for high-performance 3-D rendering. The ability of the preferred circuit to perform mathematical operations, through the techniques and apparatus described above, in a highly parallel fashion can be harnessed to achieve higher computational power that has application in graphics display systems. Rendering is done "on-the-fly" at video rates, even for complex scenes. Rendering efficiency is amplified by the use of very small processors embodied in the preferred circuit.

The preferred memory circuit and its comparator permits the efficient use of scan-line rendering, a technique that had become unpopular because non-parallel systems are ill-suited to the repetitive searching that the technique requires. Instead, conventional systems have moved towards z-buffering approaches, which store hidden objects behind visible ones in a memory map, and thus require large amounts of memory. Scan-line rendering techniques calculate which facet is visible from among all those facets that a ray from the eye would intersect. That problem is solved for all rays intersecting any position along a "scan line," which is the path the write beam follows as it moves across the screen of the display.

In addition, use of the preferred circuit in the below-described system: (1) eliminates the need for a frame buffer, by replacing it with a "span list buffer," which is well-suited to DRAMs, (2) reduces the overall number of calculations needed to render scenes containing a large number of objects through improved "culling" mechanisms, (3) permits the replacement of costly arithmetical and other circuitry with lower-cost memory devices that use associative table-lookup techniques, (4) allows for the automatic rasterization of visible objects as part of the resolution of hidden facets, thus permitting display of the calculated image on a screen of any resolution, while eliminating the need for a "z-buffer," and (5) can be upgraded for higher performance in a modular fashion and without redesign, with a linear cost-performance tradeoff. The advantages described above make the inventive system also well-suited for very low-cost applications that require a great deal of graphics power, such as games or consumer applications.

For all graphics-display applications, the host computer breaks down all displayed objects into "facets," or triangles that represent part of a viewable surface, as in standard graphics processing. The preferred memory circuit described in connection with FIGS. 3–10, above, is structured to store information about each facet in an associative memory word. The circuit's comparator is ideal for searching facets for those having a left edge at a particular point where the beam of the television or other display device intersects the screen. Arithmetic is performed using the same comparator, using the table look-up system described above in connection with FIG. 21. Alternatively, faster arithmetic can be performed using the hardware capabilities of the alternative embodiment of FIG. 26, described in detail below. The circuit can perform arithmetic simultaneously on each word, thus permitting parallel processing of the "single instruction, multiple data" type on the marked facets.

A generalized embodiment of the inventive system, which achieves the above-described and other advantages, is shown in the block diagram of FIG. 22. Memory bank "A," shown at numeral 100, includes one or more units of the preferred memory circuits (four are shown in the particular example). Span processor circuit 102 commands memory bank 100, resolves hidden facets (replacing the z-buffer approach), and feeds a span list buffer memory 108 with a list of "spans." Each span contains information about how to paint the screen across a scan line during a particular frame, specifically the color and location of the visible segment of the facet that intersects the scan line. When the "span list" is completed, buffer 108 contains an ordered list of spans for each visible facet along that scan line during that frame. After a span list is completed, it is passed to pixel processor 110, which can directly feed a display system-such as analog display 116 coupled with video DAC 114-without the need for a frame buffer.

Memory bank 100 uses its calculation capabilities (1) to cull the objects, to reduce the number of possibilities to those that may be in the field of view, (2) to load the facets of the remaining objects and to transform them to the frame of reference determined by the desired viewpoint, (3) to shade the object based on a light source, using techniques such as Gouraud shading, (4) to clip the remaining facets to eliminate portions beyond the boundaries of the "viewport," which will match the screen's boundaries, (5) to identify the position at which each scan line first intersects any remaining facet, and (6) to prepare the description of spans that is sent to span processor 102. Those functions are performed on all facets together, resulting in a series of spans, from among which span processor 102 will select the front-most at each position along the scan line.

The preferred memory circuits are controlled under the direction of a "foreground" memory-management program, which is started from a fixed location in SRAM of SP circuit 102. Because SRAM is faster than DRAM, one SP circuit such as circuit 102 or 106 can control several of the preferred memory circuits, which are implemented in DRAM-type memory. Thus, the four memories in bank "A" 100 in FIG. 22 can be controlled by a single SP circuit 102.

The foreground program supplies parameters to SP circuit 102 for each new scan line, enabling the direct memory access mechanism of the preferred memory circuit to transfer to SP circuit 102 the information representing each facet intersecting that scan line. The foreground program directs the preferred memory circuit to determine, from the information about the edges of each facet that is already in memory (see below), the facet's left edge at the point at which the new scan line intersects it. The foreground program accomplishes that calculation by first, comparing a "line counter" against the y-axis value for the vertices of the facet and using the result of that comparison to identify the edge of the facet that intersects the particular scan line, and second, adding the selected edge's incremental values—which represent the changes along that edge in horizontal position (x), depth (z), and color for a given change in y-value of the magnitude associated with movement from one scan line to the next—to the previous values stored for the edge in the memory word associated with the facet.

At every moment when the foreground program is not operating, the SP circuit runs a "background" facet-calculation program, which operates to tag the facets that will be needed by the next frame and to calculate the edges of that facet, for use by the foreground program. In conventional pixel processors, the most important resource is the time needed to read from, modify, and write to the frame buffer, so preferred systems of that sort are designed to reduce the calculation time by first performing extensive "clipping," through which operation the facets are cut to fit into the visible space. The Sutherland-Hodgeman clipping algorithm is one generally accepted technique for performing clipping efficiently. In a parallel-processing system such as this one, by contrast, the most important resource is memory (that is, number of words in the associative memory), and those resources must be committed before the clipping step is performed. Thus, the inventive system places a greater emphasis on "culling," the process by which facets are eliminated from consideration because they are placed in such as way that they cannot possibly be within the field of view. When the clipping operation is performed, later in the process, it must operate on fewer facets.

In the below-described 3-D rendering process performed by the background program, additional culling steps are performed, as compared to standard pixel processing techniques. Fortunately, however, the preferred memory is capable of identifying the important facets efficiently, because of its parallel processing and associative comparison capabilities. The process results in an added benefit, moreover, in that it is capable of determining whether two objects are close enough together that they should be tested to determine if they are touching.

FIG. 23 illustrates, in flowchart form, an example rendering process, including the steps used for culling and clipping. Alternative graphics processing techniques can be implemented, but the one described below is considered as suitable for use with, and as having taken suitable advantage of, the preferred memory circuit described above.

The background program must first determine which objects are within the field of view. To that end, SP circuit 102 transfers a data list of all objects from host computer 104 into memory bank 100. Each object represents a rigid body; in other words, an "object" is defined as a collection of facets having the same rules of motion. The data list includes the three-dimensional (x, y, z) coordinates of the center of the object and its radius, as well as an identifying tag number. An object's center and radius are defined as the center and radius of the sphere most tightly surrounding the object, in whatever coordinates host 104 prefers.

Under the control of the background program, the object list is then culled to eliminate non-viewable objects. Objects are eliminated if they are entirely behind the eye or if they are entirely outside the viewport. In physical terms, the object is eliminated if a hypothetical cube, tightly built around the sphere enclosing the object and oriented with a face parallel to the plane of the viewport, would not intersect any straight line connecting any part of the viewport (representing the screen) to the eye (representing the perspective from which the scene is viewed).

For culling, a coordinate system is used within the system that has the eye placed at the origin and the z-axis extending perpendicular to the plane of the viewport. In a preferred embodiment, the plane containing the viewport intersects the z-axis at the value equal to one along that axis.

The culling of objects is performed by the following sequence of steps: First, the coordinates of the center are updated if either the object, the eye, or the viewport has moved since the last frame, as identified by the host computer. Second, the updated coordinates are used to calculate the positions of the cube faces, by adding the radius to, or subtracting that value from, each of the three updated coordinates. Third, the objects entirely behind the eye are culled if z-axis value of the back face of the cube is less than a positive "hither" value. Fourth, objects in cubes that enclose the eye are retained. Fifth, if the z-axis does not pass through the cube containing the object, then the viewport is projected onto the plane of the back face of the cube, and the object is culled if the cube's bottom is above the projected viewport's top. Alternatively, the viewport is projected onto the plane of the cube's front face if the z-axis passes through the cube. The top edge of the viewport is projected onto the specified plane by multiplying the y-axis value of the top of the viewport and the z-axis value of the appropriate face of the cube, which is calculated by adding the radius of the sphere enclosing the object and the z-axis value of the center of the cube (or subtracting the radius from the center, if the front face is used). Sixth, an analogous process is repeated to cull objects for which the top of the cube is below the bottom of the projected viewport, the left side of the cube is to the right of the right edge of the projected viewport, or the right side of the cube is to the left of the left edge of the projected viewport.

Some objects will remain unculled even if they are not, strictly speaking, viewable. Those objects will be loaded and eliminated in subsequent steps. Therefore, it makes for better memory management to break down large objects into several small ones, because all facets of a large object will be loaded into memory if even a small part of the object—or even part of the surrounding cube, which may be much larger than the object—intersects the viewport. For example, imagine a large tree just to one side of the viewport. The sphere that encloses the whole tree could well intersect the viewport, even if the tree itself does not, or alternatively, the cube surrounding the sphere could overlap the viewport, and either would suffice to pass the culling screening. However, if the tree is broken down into a series of smaller connected portions, each portion, for example, representing groups of branches, plumes of foliage, or any other selected section of the tree, then neither the sphere surrounding each portion nor the cubes surrounding each sphere will project onto the viewport, and the tree's facets will not be loaded. In other cases, only some portions of the tree will project into the viewport, while other portions will not and will be culled. Note that it should take no longer to perform the culling tests on the tree represented as a collection of portions than it does to perform the tests on the whole tree represented as a single object, because of the parallel-calculation capability of the preferred memory.

The tags for objects that pass the culling screens are returned to SP circuit 102, which passes the tags to host computer 104, which returns the list of facets associated with the tagged objects. The facets can be loaded into the preferred memory circuits in any order, with one facet placed in every associative memory word. It is not necessary that the facets be link-listed together, as is common in conventional graphics systems. Rather, all facets associated with any particular object can be identified with a common tag number, and the preferred memory circuit can search and match those tags in parallel. The set of facets is partitioned into blocks, with the block size equivalent to the number of associative memory words controlled by one SP circuit 102. For instance, if each of the memories in bank "A" 100 contains 1024 words, and there are four memories in the bank, then the block size will be 4096 facets.

As part of the culling process, the system can identify whether two cubes enclosing different object spheres overlap, which provides a quick, parallel test to determine if objects touch. If the two cubes intersect, the facets can be tested in greater detail to determine if the objects in fact touch. An object can be tested against all other objects by testing the search cube's faces against all other cube's faces (in the same fashion as is done for the viewport), by using the center and radius of the objects' surrounding spheres. The use of the preferred memory can eliminate much of the detailed checking that would otherwise be performed by the host processor 104 to determine if objects touch, which is a timeconsuming housekeeping function that can otherwise slow the host processor's graphics rendering.

FIG. 24 illustrates the data structure of an associative memory word, which is duplicated for each facet. During the culling step, the above-described object-level information is loaded into field 140 only. Upon loading of the facets, field 141 contains a tag identifying the facet, field 142 contains the initial positions of each of the three vertices of the facet, and field 143 contains shading parameters and the light vector used for Gouraud shading. In addition, a homogeneous transform matrix (H) associated with each facet, which is calculated by host 104, is loaded into field 144. The background and foreground programs use fields 145, 146, and 147 to store temporary variables as those programs execute.

The background program applies the H matrix to transform the coordinates of the vertices to eye-space. Eye-space is defined as the coordinate system that has the eye placed at the origin and the z-axis extending toward the center of the viewport. When each vertex in 142 is matrix-multiplied with the transform matrix in 144, the result is the coordinate location in eye-space of that vertex. That result is stored in an appropriate place in temporary-variable fields 145 and 146. When an object moves relative to other objects, the transform matrix must be altered for all of that object's facets, but the altered matrix can be loaded for all such facets simultaneously. When the eye or the viewport move, the transform matrices for all objects and facets must be altered. That is achieved by multiplying the eye transform matrix by the various object transform matrices and loading the product matrices as the new object transform matrices. Such multiplication and loading can be done in parallel.

The colors of the vertices depend on whether the facet is Gouraud shaded or texture-mapped. Thus, the preferred system can implement a mixture of textured and Gouraud-shaded facets, but no facet can have both features. Gouraud-shaded facets require red, green, and blue values for each vertex, while texture-mapped facets contain two addresses, called s and t, and a denominator d, which is calculated as the reciprocal of the distance from the eye and is used to determine the scale of the texturing.

The background program next calculates the colors at all three vertices of Gouraud-shaded facets. The external processor in host 104 transforms the light source to a light vector expressed in local coordinates for each object, and the initial colors for each vertex are calculated by the preferred memory device from the dot product of the light vector and the vectors normal to the facets at each vertex. Words storing texture-mapped facets are tagged to disable the calculation. Such facets contain texture values directly loaded from host 104, as described below.

The background program next controls the "clipping" of the facets, which redefines them to cut off portions that extend beyond the viewport. A modification of the Sutherland-Hodgeman clipping algorithm can be used, but there is no need to clip off sections that extend below the bottom of the viewport, because those portions will never be intersected by the scan lines anyway. Optionally, the program may conduct a "yon" clip to limit the depth of field, which has the advantage of reducing the size of the numbers needed to store the z-axis value, which represents the distance from the eye. However, in the preferred embodiment, "yon" clipping is not implemented, because it results in extra steps and increases the number of edges that must be evaluated, which in turn increases the width of the memory required to handle the calculations.

The first clipping step is to eliminate portions of the facet that are behind the eye, called "hither" clipping. If one vertex has negative z-axis value, then an interpolation step is performed on each of the two edges connecting that vertex to the other ones, and the negative vertex is replaced with a pair of vertices, each having a zero z-axis value, representing the points at which the hither plane intersect the facet. If two vertexes have negative z-axis values, then an interpolation step is performed on each of the two edges connecting those vertices to the remaining one. If a non-zero hither value is used, then the above process is adjusted to account for the positive value.

After the hither clip, the resulting set of vertices (whether three or four) is then mapped to the viewport, using the perspective-division method described above in connection with the culling steps, and the mapped coordinates are stored, along with their associated colors, in temporary-variable fields 145 and 146. Because of the need for division in the steps above, it is preferred to store the values as floating-point values. After the vertices are mapped to the viewport, however, it is possible to simplify the arithmetic by converting to integer values.

A "top clip" is next executed, to eliminate any portions of the facet that extend above the top of the viewport. Similarly, left and right clips are performed. Each clipping operation requires a pair of interpolations and can add one more vertex. In total, a facet can end up with at most seven vertices, if all four clipping steps operate on it. If, at the end of the clipping process, all vertices are determined to be "out of bounds," then the facet is considered non-viewable, and the mark bit is tagged.

Thus, at the end of the clipping process, the background program has stored in temporary-variable fields 145 and 146 a vertex list of at most seven vertices, in which the values along the x-axis and y-axis have been converted to the points at which a ray between the eye and the vertex would intersect the plane of the viewport, and in which the z-axis value has been converted into a value representing the distance from the eye.

Next, the data in fields 145 and 146 are reorganized into an "edge list" describing the edges connecting the vertices. The edge list includes one or two initial vertices, that is, the vertex that will first be intersected by a scan line, that is, the vertex with the highest y-axis value. If there is an edge that is parallel to the scan lines, then there will be two initial vertices having equal y-axis values. The remainder of the edge list contains data representing the change in x, z, and color values that will occur when moving along each edge from one vertex to the next one for a y-axis distance equal to the distance between adjacent scan lines. The edges may be stored in any convenient order, say clockwise as seen from the visible surface.

After the reorganization, fields 145 and 146 contain the vertex list and the edge list for the facet in question. The eye-space coordinates originally stored in that area have been overwritten.

Preferably, external host 104 can mark particular facets as visible from both sides, such as if the object is a planar one. Other facets, such as for solid objects, can be stored in a particular ordering or their vertices, such as clockwise, thereby allowing the system to detect if the object has been turned relative to the eye so that a previously visible face is no longer visible. When the object is so rotated, the order of the vertices will change (in the example, so that they are no longer ordered clockwise), indicating that the facet is no longer visible. Facets facing in the wrong direction can be tagged by setting the mark bit of the associative memory word to prevent the facet from being loaded later into SP circuit 102.

Also, the background program calculates the changes in depth and color for a one-pixel movement along the x-axis. That depth increment is uniform across the facet, because the facet is in a single plane. Similarly, the color increment is uniform because Gouraud shading specifies uniform variation in color.

Finally, the background program transforms the edge list into a "left list" and ta "right list," each of which include (1) an initial point, taken from the initial vertices, specified in terms of x, y, z, and color, (2) incremental data representing the changes in x, z, and color along the edge connecting to the initial point, and (3) further incremental data, if necessary, along up to three more edges at the side of the facet. Thus, the "left list" represents the values at the edges that will be first touched by each scan line that intersects the facet, and the "right list" represents the values at the edges that will be last touched by each such scan line as it exits the facet moving from left to right. The incremental data for each value (position or color) are determined by dividing the difference in that value between the two vertices at the ends of that edge by the number of scan lines separating those two vertices. The two lists and the x-axis increments of depth and color are consolidated into field 146 in FIG. 24.

After the background program completes operations on all facets for a particular frame, it releases field 146 to the background program and begins operating on the next frame using temporary-variable fields 145 and 147, rather than 145 and 146. Thus, the foreground program can operate on the "left list" and "right list" data in field 146 without fear of the background program changing the data in that field while calculating the next frame during pauses in the foreground program. After the next frame is calculated, fields 146 and 147 are again swapped, and the foreground program can begin operating on field 147. Field 145 is used with both fields 146 and 147 because the background program requires more data width than the foreground program.

The foreground program can easily check the visible facets in parallel to determine which ones are intersected by a particular scan line. After the initial point in the left and right lists is encountered, the foreground program uses the incremental data to update the data in the two memory locations reserved for the left and right "initial points" to a "current point" in the left and right list. Thus, as each successive scan line intersects the facet, the current point in each list will have its x-axis position, its depth, and its color updated.

The left list therefore contains the information about the x-axis position, depth, and color at the start position of the span, and the right list contains the same information about the end position of the span. Thus, after the above-described sequence of operations, the foreground program can mark the spans that intersect the scan line, including each marked span's starting position, ending position, and the uniform horizontal incremental color and depth changes. The y-axis value is not needed, because it is implied by the scan line, and the colors and z-axis depth at the end of the span can be discarded once the increment is calculated.

Span processor circuit 102 in FIG. 22 uses DMA requests to load spans from bank 100. SP circuit 102 also contains circuitry to interface with host 104, allowing data regarding objects and facets to pass from host 104 to bank 100. Generally, SP circuit 102 contains circuitry for resolving hidden spans, thus allowing calculation of the span that is closest to the eye at any position along the scan line. That capability eliminates the need for z-buffering.

Although data are stored in preferred memory 100 in two-byte integer values, the data for each span may be passed to SP circuit 102 by discarding the low-order byte. That process allows for fractional calculations, which are rounded to the nearest values of color or position upon loading SP circuit 102. Alternatively, it is possible to store the data as quasi-floating-point numbers, using a scale factor and a base value.

As illustrated in FIG. 22, it is possible to add additional groupings of span processors and associated memory banks, such as SP circuit 106 (also coupled to host 104) and associated memory bank "B." Such additional circuits can improve the performance of the system, particularly in cases where the displayed scene contains large numbers of objects or facets.

Whenever SP circuit 102 determines that the front-most (visible) span originates from a different facet than before, SP circuit 102 outputs information about the new span to span list buffer 108, which contains principally memory, such as in the form of DRAM. Pixel processor 110, which also contains memory, such as SRAM, collects the spans for one scan line from SLB 108 while it translates and applies the spans from the previous scan line to control the display. Pixel processor 110 decodes the spans and sends a color to the display corresponding to each pixel in the scan line. Because that pixellization function is done at the very end of the process, it is simple to apply the data to a display having a different resolution, merely by altering the clock rate or the timing of pixel processor 110, and making small changes to the internal software to accommodate a different scaling factor.

If the span being displayed by pixel processor 110 contains a code indicating that texturing is desired, instead of Gouraud shading, pixel processor 110 accesses SRAM 112, which stores the texture maps, to select the appropriate color. If the span indicates the presence of Gouraud shading, however, the color is output with a delay to match the timing of the output from SRAM 112. Pixel processor 110 passes the resulting color to video digital-to-analog controller 114, which activates the write beam of display 116 as usual.

A more specific embodiment of the data path and circuits described briefly just above is shown in FIG. 25. That embodiment shows sample sizes for the storage areas and data paths in SP 102, SLB 108, pixel processor 110, and texture SRAM 112, although those sizes can be altered or buffered in alternative ways, depending on design needs and cost constraints. Also, the specific design can be altered as needed, without departing from the spirit of the invention.

Within SP circuit 102, SRAM 120 contains the background and foreground programs used for controlling memory 100, as explained above. As noted above, the foreground program first ensures that all visible spans along a particular scan line are tagged in memory 100. The following data from each tagged span will be passed from memory 100 to SP circuit 102: (1) the x-position from the left list, (2) the x-position from the right list, (3) a bit indicating whether the facet is Gouraud shaded or texture-mapped, (4) the color at the left position (for Gouraud-shaded spans; for textured spans, the initial texture-map coordinates and denominator are stored), (5) the color's slope, which indicates the change in red, green, and blue (or the change in texture-map coordinates and denominator) for an incremental change in x-position, (6) the z-value at the x-position from the left list, (7) the z-value's slope, which indicates the change in z-value for an incremental change in x-position, and (8) an identifier tag.

The tagged spans are selected and data from the tagged spans are retrieved in groups that are roughly ordered, such as by ignoring low-order bits in the x-axis values. The DMA system in each preferred memory circuit 100 contains an eight-bit hardware counter, which can count from 0 to 159 (in the case of 1280-pixel horizontal resolution) within each scan line. Upon receipt of an Output instruction from SP circuit 102, memory 100 compares the value of the counter against the x-position for each span stored in the associative memory words of memory 100, in field 146 or 147 (see FIG. 24). The mark bits are set for spans that match, indicating that the facet is one that begins, along the scan line in question, somewhere within the 1/160th of the line identified by the counter.

Each time four matching spans are detected (or when the counter reaches the right edge of the screen) and upon receipt of an Output instruction, the packet of identified spans is extracted from the memory bank 100 using a "page mode" DMA request, and the information is transferred into SP circuit 102, de-multiplexed, and stored in demux 127. If more than four spans are tagged for a particular segment, four spans are sent in response to each successive Output instruction. If fewer than four spans are tagged, then the counter in memory 100 will proceed until the fourth span is tagged (or the line ends), at which point the spans will be passed.

Upon receipt of packets of tagged spans from memory 100, they are retained in demux 127. Preferrably, demux 127 contains space for eight spans, although other numbers are possible. As space is available in SP cells 122, spans are extracted from demux 127 and transferred, freeing up space in demux 127. When demux 127 has enough space for four spans, it indicates to the associated memory circuit 100 its availability to load another package of spans by issuing an Output instruction, which activates the circuitry in memory 100 to fulfill DMA requests described above. The instruction may be issued at any time before the Match flip-flop in preferred memory circuit 100 is to be changed by an instruction emanating from program store 120. At such a time, demux 127 interrupts the execution of either the background program or the foreground program, so that the DMA request can be fulfilled. Afterwards, the program can resume without error, because the Match flip-flops will be reset by the very next instruction.

If SP circuit 102 controls more than one preferred memory circuit 100, such as the four memories 100 shown in FIG. 25, it is preferred to select among all of the spans received from any of the memories. In that case, each circuit in 100 has an associated demux 127 as described above, and each demux 127 can store eight spans. Minimum circuit 125 selects the left-most span from among the spans held in all of the demuxes 127.

Circuit 129 of SP circuit 102 controls transfer of spans from demux 127 to SP cells 122. Circuit 129 contains a clock that "ticks" each 15 nsecs., representing movement from pixel to pixel along the scan line. The clock is also coupled to the fifteen SP cells 122. At each tick, SP cells 122 update the spans for the next pixel along the scan line, by accumulating the slopes for z-value and color to the initial values. Also at each tick, if the clock in circuit 125 indicates a position beyond the x-position stored in the right edge-list for a particular facet, the SP cell 122 storing that facet sets a flip-flop tagging the cell as a free cell.

Whenever at least one SP cell 122 is free, circuit 129 loads into the highest-priority free cell the span having the left-most left edge from among those spans stored in demuxes 127, which has been determined by minimum circuit 125. If the left-most edge is before the pixel position indicated by the clock in circuit 129, indicating that no SP cells 122 were free at a time early enough to load that span before the clock passed the left-edge position, then the address of the span is loaded into overflow buffer 121 for processing as explained below.

After SP cells 122 update the information in the spans loaded in them, minimum circuit 124 selects from among those spans, determining which one has the minimum value along the z-axis, that is, the facet closest to the eye at the pixel corresponding to the clock. Minimum circuit 124 is set up as a tree structure, with the cells 122 as its leafs. At each branching point the z-values are compared and the lower z-value and the address of the cell containing it are passed toward the root. At the root, the address is used to recover the information from the "winning" span. If the front-most span comes from a different cell than before, the information about the new span is passed to the next free cell in SRAM 126, which (in the embodiment shown) contains space for 16 spans, although a different number (greater, smaller, or not a power of two) may be used.

Because the system contemplates the generation of spans somewhat in advance of their display, the data path from SP 102 through SLB 108 to SL 110 is preferably double-buffered. If SLB 108 is a DRAM, and it is desired to take advantage of the faster "page mode" transfer capability common in DRAMs, SP circuit 102 can contain a memory such as SRAM 126 shown, for collecting "front-most" spans across the scan line until there is a packet. To permit the continued examination of spans while a new packet is being transferred, SRAM 126 in SP circuit 102 can be double-buffered, as shown, with another set of sixteen words available for loading while the first sixteen are being transferred.

Either when a packet of sixteen spans in SRAM 126 is ready for transfer or when the scan line ends, the spans are transferred to SLB 108. Storage areas 130 and 132 in SLB 108 store information from the received spans. Those storage areas are buffered into two banks, so, as spans from SP circuit 102 are loaded into one bank of SLB 108, for example, spans in the other bank of SLB 108 can be extracted for transfer to SL 110. The position at which the span begins in the scan line, the color of the facet, and the change in color are written into storage area 130, while the associated depths (z-axis value and change in z-value) are written into storage area 132. Storage 130 is double-buffered, allowing passage to SL 110 of a completed span list representing a completed scan line while a new span list is being generated for the next scan line. The z-axis values are not needed by SL 110 but are saved in area 132 in case the span must be recirculated for further depth comparison, as explained below. The position at which each span ends in the scan line is no longer needed, because it can be determined by the start-position of the next span.

If there are more facets in a scan line (which are tagged in memory bank 100) than can fit at once in the fifteen SP cells 122 in SP circuit 102, or if a span reaches SP circuit 102 after the hardware counter in memory 100 has passed the segment in which that span begins, or if no SP cells 122 are free when the pixel counter in circuit 129 reaches the x-position of the left edge of a span, then the addresses of such "overflow" facets are saved in SRAM 121 for processing at the end of the line.

At the end of a scan line, the foreground program passes the addresses saved in SRAM 121 to memory 100, which sets a bit in a scratch field of the facets matching those addresses indicating that those facets have not been checked. It is also possible that so many facets will be identified or passed over so as to overflow the capacity of SRAM 121. In that case, the programs will be halted while the tagging operation is performed in the middle of processing the scan line, so that SRAM 121 can be cleared, after which the foreground program resumes processing the rest of the line. After emptying SRAM 121 at the end of the scan line, the foreground program then instructs memory 100 to examine the scratch bit to determine if all spans have been loaded for processing. If all spans have been processed, then the foreground program proceeds to the next scan line.

If, however, the scratch bits for some spans have been set to indicate that not all spans have been processed, the program repeats the operations described above for the same scan line until all spans are resolved. On the first pass, minimum circuit 124 will have resolved the closest spans from among the first 15 for each position along the scan line, which are fed to SLB 108. If further processing is needed, the spans identified as the closest on the first pass are transferred, in order, back from SLB 108 to SL cell 128 of SP circuit 102. SL cell 128 is similar to SP cells 122.

However, in SL cell 128, the circuitry in SP cells 122 to calculate the depth by adding an incremental z-value is not needed. Next, Output instructions are passed to memory 100, causing its DMA request mechanism to pass to SP circuit 102 the facets whose addresses were stored in SRAM 121 during the first pass, and up to 15 of those overflow spans are loaded into SP cells 122. Thus, on the second pass, minimum circuit 124 resolves the closest span from among the 15 SP cells 122 and the one SL cell 128, which results in identification of the closest spans from among all of the spans in either the first or the second pass. Those overall "winners" are passed to SLB 108. The process is repeated until SRAM 121 remains empty during an entire pass along the can line, indicating that all spans have been tested.

As noted above, the facets are loaded into memory bank 100 in blocks having a size equal to the number of associative memory words under the control of a SP circuit. If there are more facets in the objects that pass the culling steps than there are associative memory words, and if there is only one SP circuit 102 in the system, then the circuitry is programmed to operate on the blocks in sequence. SP circuit 102 will create a span list for the entire frame and store it in SLB circuit 108 using only the first block of facets. Then, the second block of facets is loaded into bank 100, and, as a second span list is calculated, the span list from the first block is recirculated from SLB circuit 108 by transferring each span, in order, back to SL cell 128 in SP circuit 102. If any facet from the new block is closer to the eye than the closest span from the old block, then the new span will replace the old one as the new span list is written into SLB 108.

The system permits simple expansion to include additional SP circuits and associated memory banks, such as SP circuit 106 shown in FIG. 25. On each pass, after the program resolves the closest span from among those evaluated in SP circuit 102, the resulting information is passed to the SL cell 128 of the second SP circuit, SP circuit 106. Thus, when the minimum circuit of SP circuit 106 resolves the closest spans, the results will be the minimums from among the spans loaded into either SP circuit 102 or 106. The result from the processing performed by SP circuit 106 is then passed to SLB 108. Virtually any number of additional SP circuits can be added subsidiary to SP circuit 106, without altering the circuitry. The addition of extra SP circuits and associated memory banks can reduce or eliminate the chance that the complexities of the scene will overload the memory banks or the SP cells and cause a need for recirculating the span list for a scan line. If recirculation is nevertheless needed, the spans saved in SLB 108 are returned, in order, to SL cell 128 of SP circuit 102, and the circulation described above is repeated.

Thus, extra circuitry allows higher performance without slowing down the rendering. Such performance increases come at a cost, but the modular nature of the system means that performance and cost can be linearly related, and that performance can be increased essentially without limit, both of which results are impossible with conventional systems.

In addition, for some simple rendering systems, such as low-end game systems, the scenes rendered by host 104 may be capped, upon the game being programmed, at a known maximum complexity level. In such cases, it is possible to dispense entirely with extra SP circuits, and even to eliminate SLB circuit 108, because it is certain that no scene will require recirculation of the span list because of either timing problems, facet overload, or span (SP cell) overload. In such simple systems, spans emerging from minimum circuit 124 can be passed directly to pixel processor 110, which controls the timing of application of the spans to the display. Even in more complex systems, where recirculation is necessary, the system is designed so that rendering speeds will decrease—in other words, the time between screen updates will increase—but there will be no visible degradation of performance.

In SLB circuit 108, storage areas 130 and 132 are treated as circular, so that, when the spans for a scan line are all resolved and written into SLB circuit 108, that circuit begins writing the spans for the scan line at the very next memory location. After any recirculation is completed, the half of area 130 (area 130 contains the information about the spans relevant to pixel processor 110) storing the information about the completed scan line is disconnected from SP circuit 102 and connected to pixel processor 110, and the x-position and color pairs from those spans are loaded into one of SRAMs 134 on pixel processor 110.

SL circuit 110 contains dual SRAMs 134, one of which is loaded with spans for the next scan line while the other is used to clock the pixels in the current scan line. The memory connections are swapped after each scan line is displayed. Spans for the current scan line are loaded one at a time into pixel cell 136, a cell which is similar to SL cell 128 except without room for the z-depth. Pixel cell 136 updates the changes in color as the x-value changes.

Timing circuit 138 examines the starting x-position of the next span and loads it into pixel cell 136 at the appropriate time. The color from the loaded span is applied to video DAC 114 each time period equivalent to a pixel on the display. For example, in a SVGA display, which has a horizontal resolution of 1280 pixels and 1024 scan lines, a screen refresh rate of 60 frames per second will require about 13 μsec. per scan line, or about 7 nsec. per pixel. The correct color can be applied to the display each 7 nsec. in that system by retaining a particular span in pixel cell 136 for the period of time equal to the x-axis difference between adjacent spans divided by the x-distance represented by one pixel times 7 nsecs. The color may change, also, as pixel cell 136 updates the color for a given span extending across several pixels.

For use with spans that are flagged as being texture-mapped, SRAM 112 stores up to six texture maps, each of which is stored in a 128×128 pixel array as well as a 64×64 array, a 32×32 array, and a 16×16 array. The texture mapping package contains a field to determine which map is used, initial and final location values (s and t), and a denominator value (d) calculated as the reciprocal of the distance from the eye, which also contains high-order bits indicating which precision (array size) to select. The address in the map is determined by the ratios s/d and t/d, which are calculated by pipelined divider 139 in pixel processor 110. Throughout the pipeline, the data for each facet carries a bit identifying the facet as either Gouraud shaded or texture-mapped. That bit is applied to switch the input to video DAC 114 to either the pipelined divider 139 or directly to pixel cell 136.

FIG. 26 shows a more complex but more functional design of the associative memory discussed above in connection with FIG. 7. Like FIG. 7, FIG. 26 shows one of the "word cells" of the preferred memory. Each of the word cells includes eight "bit cells," one of which is circumscribed by box 215. Generally, the top two thirds of FIG. 26 show the word cells, with four-input wire-OR (comparator) gates shown along two comparator lines 219. The bottom third of FIG. 26 contains a schematic representation of the word-cell circuitry of the disclosed embodiment, which contains a comparator and a serial adder. However, the logic shown schematically at the bottom of FIG. 26 is preferably physically distributed throughout the pitch of the eight "bit cells."

An advantage of the embodiment of FIG. 26 is that the arithmetic operations required by the "search and retrieval" or graphics systems disclosed above may be performed more quickly if the associative memory has a hardware adder implemented in the word cell logic itself. Thus, the operations disclosed above as being performed by sequences of operation on the data stored in the associative memory may alternatively be performed by controlling the hardware, in the embodiment of FIG. 26.

The embodiment of FIG. 26 includes a certain amount of additional hardware than the embodiment of FIG. 7, so the more complex design is a bit more expensive and would be more suited to specialized applications such as graphics and searching designs. FIG. 26's circuitry includes—aside from the circuitry in ordinary DRAMs—about 120 transistors per word cell and about 10 transistors per bit cell, which would require an increase in chip area of about 25% over DRAMs. Sixteen control lines are needed. Nevertheless, the benefits achieved in exchange for the extra overhead are large, as discussed below.

Bit cell 215 shown in FIG. 26 is shown separately in FIG. 27. The design of FIG. 27 has two sense amplifiers 211, one on the left and one on the right, in the same bit cell, although alternative numbers of sense amplifiers on each side are possible, with the addition of additional control lines.

A preferred way of storing data for the purposes disclosed here is to use the bit array connected to the left sense amp 211 to hold bytes from evennumbered columns in each associative memory word and to use the bit array connected to the right sense amp to hold odd-numbered columns. In the bit cell of FIG. 27, one control line, LLo or RLo, is enabled to connect the left or right sense amp to the bit-cell logic, shown near the center of FIG. 27. In each word cell, the lines LLo or RLo control the low-order nibble of the bytes, and separate lines LHi or RHi control the high-order nibble of the bytes. The row address bus in the left bit array can have a different value than the row address bus in the right bit array, and the control lines can be cycled out-of-phase to speed up searches that scan bytes in consecutive order. When they are cycled in-phase or are not accessing the memory bit arrays, lines LLo or RLo and LHi or RHi can be so asserted as to connect to the bit-cell logic to any of the following possible combinations: (a) both high and low nibble of the left sense amps, (b) both high and low nibble of the right sense amps, (c) high nibble of the left sense amp and low nibble of the right sense amp, or (d) high nibble of the right sense amp and low nibble of the left sense amp.

In any Write or Output operation, LLo and LHi are enabled to access an odd byte in each word, or else RLo and RHi are enabled to access an even byte. In bit cell 215, a selected sense amp can be connected to a data bit line if the two write transistors 223 are activated. One transistor 223 is gated by the write-enable line (FIG. 27), which emanates from a four-input AND gate 217 in each word cell (see FIG. 26). The signal from AND gate 217 determines which associative memory words are written or outputted. Qualify line 213 enables writing in the bit cells by the connection to one input of AND gate 217.

The other transistor 223 is gated by a mask bit associated with the data bit, which is received from the appropriate line of the MaskBus. Eight pairs of wires, representing a Data-Bus and a MaskBus, are shown in FIG. 26. Note that the eight pairs of data and mask lines transmit the same byte of data to or from each bit cell in the word cell and broadcast the same mask byte to each word cell. The mask transmitted on the MaskBus therefore selects which bits are accessed.

The embodiment of FIG. 26 achieves the advantage of faster arithmetic through the substitution of two four-bit comparators for the single eight-bit comparator of FIG. 7, which dual comparators are operated as multiplexers in arithmetic operations but which are also used for the associative comparison operations discussed above. The use of two comparators allows comparison operations on the high nibble and separately on the low nibble, and also allows the adder to have two separate inputs within each word cell.

The portion of the circuitry in the bit cells useful for comparisons is shown in FIG. 28. Illustrated is one of the two four-bit comparators, the one for the high nibble. Issuing from each pair of wires in the DataBus and MaskBus are signals such as D1 and M1, shown only for the top bit cell in FIG. 28. In each bit position, to check for a zero in the sense amp signal, assert D1 and negate M1; to check for a one, assert M1 and negate D1. If the sense amp has a one and D1 is one, or if the sense amp has a zero and M1 is one, then comparison line 219 goes high to indicate a mismatch. If none of the four bit cells in the nibble cause mismatch comparison line 219 to go high, a transistor pulls comparison line 219 low to indicate a match. Thus, line 219 will be asserted high if, for any bit, D1 and M1 are both asserted, and will be asserted low if all bits like D1 and M1 in the nibble are negated, which resulting signal is here called a "mismatch" signal.

The mismatch signals from two copies of FIG. 28, now called Lo_mismatch and Hi_mismatch, are inverted (to Lo_match and Hi_match) and used as inputs to the adder logic shown in FIG. 29. When control signal CCk is asserted, the carry FF shown in FIG. 29 is set if Lo_match and Hi_match are both one, or cleared if they are both zero. The three-input exclusive-OR gate 233 generates the sum of Lo_match, Hi_match, and the carry from the previous step. FIG. 30 illustrates a sample implementation of gate 233.

FIG. 31 illustrates the comparator logic at the word cell level. A set/clear flip-flop called "Master" (shown at the center of FIG. 31) comprises a pair of three-input NOR gates, which are controlled by four control lines, labeled A, B, C, and D. Master has three slaves, the match flip-flop (M), the qualification flip-flop (Q), and a request flip-flop (R). M stores the M bit in each word cell. The functions of the M bit are discussed extensively above. Also discussed above is Q, which is used to enable shifting and writing in each word separately. R is used for DMA transfers, as discussed in detail below. Boxes M, R, and Q in FIGS. 29 and 31 are each implemented as D-type flip-flops.

The output of Master can be loaded into M when MCk is asserted. The M bit in each word cell is sent to its neighbor cells above and below it. Thus, the signal from the cell above the one depicted in FIG. 31 is shown as signal $M_{i-1}$ and the signal from the cell below the one depicted is shown as signal $Mi_{+1}$. Alternatively, the output of Master can be loaded into Q (shown in FIG. 29), if the control signal QCk is asserted, or into R, if RCk is asserted.

The logical OR of Q and the control signal IgQ is a signal 213 called "Qualify," which can be used to permit output and inter-cell communication. Whenever Q is zero, shifting of bits between words and writing in words, either in the sense amps or in the bit array, will be inhibited, but control signal IgQ can be asserted to override this Q state during some memory cycles. Qualify signal 231 also enables the dual two-input AND gates 235, which delimit propagation of M bits between word cells.

Multiplexer QMux, also shown in FIG. 29, is used in an add microinstruction to output the sum obtained from three-input exclusive-OR gate 233, if Q is one, otherwise Lo_match and Hi_match, which are generated by inverters 231, are output on the two output lines of QMux. This permits add-and-shift or shift operations in the multiplication routine, and a similar operation, switch, in the division routine. Multiplexer LMux can pass the same sum (from 233) or the OR of the mismatch signals to the LinkOut line, subject to Q being asserted.

Multiplexer PMux issues requests to the priority circuit from either M, R, or the inverted Q. The priority circuit asserts a Deny signal in all cells below any cell that has a request.

The Master flip-flop, which feeds M, R, or Q, is fed by logic including a nine-input multiplexer called InMux, which may select from among the following alternatives: (1) M from the same cell, (2) M from the cell above (ANDed with Qualify at one of gates 235), (3) M from the cell below (also ANDed with Qualify), (4) R, (5) Q, (6) the priority circuit's Deny signal NANDed with a control signal E, (7) the OR of the mismatch signals, or (8) and (9) either of the two QMux outputs. InMux outputs a signal, identified in FIGS. 26 and 31 as "Y," and an inverter sends the complement of Y to some AND gates that feed Master. If control signal A is asserted, Master is set if Y is negated, if control signal B is asserted, Master is set if Y is asserted, if control signal C is asserted, Master is cleared if Y is negated, if control signal D is asserted, Master is cleared if Y is asserted. To load Y, InMux's output signal, into Master, it is necessary to assert control signals B and C; to load the complement of Y into Master, assert A and D.

Four-input AND gate 217, which controls writing or outputting in the word cell, has inputs from Qualify, M, and the priority circuit's Deny NANDed with control signal E. (Control signal E is the same as one of the InMux control signals.) Gate 217 is enabled when a control signal called "Write/Output" is asserted.

FIG. 32 summarizes the settings of control lines E through I needed to switch multiplexers LMux, PMux, and InMux.

FIG. 33 (FIG. 26 with all logic removed that is extraneous when LLo and LHi are asserted, and RLo and RHi are negated) illustrates simple associative comparison. A similar diagram could be shown for when LLo and LHi are negated, or when RLo and RHi are asserted. The two-input OR gate 241 outputs a high OrMismatch signal if either of the four-input comparators along lines 219 detects a mismatch (as in FIG. 28 above). InMux control lines H and I are asserted to pass OrMismatch to Master. For single-byte comparison, the complemented OrMismatch should be loaded into Master and then M, which is done by asserting control signals A, D, and MCk. For multiple-byte comparison, M should be set if and only if all bytes match; for the first byte, assert control signals A and D, and as each successive byte is compared, assert only D. In the final byte comparison, assert MCk to copy Master into M.

The Compare Or operation sets M if several bytes all match, or if M was set before. To implement that operation, Master is loaded with the result of the comparison, as described above. InMux selects the output of M, and control line B is asserted to set Master if M is set. Master is then copied into M by asserting MCk.

The Compare Not And instruction compares (possibly many) bytes, and if they all match, and if M was not set before, then M is left in the set condition. To implement that instruction, the same procedure is used as for Compare Or, except control line D is asserted (instead of B), to clear Master if M is set.

FIG. 34 (similarly a subset of FIG. 26) illustrates the usefulness of the embodiment of FIG. 26 for passing data out of the word cell, using any Output-type instruction, or to write data into a cell, using any Write-type operation, such as Write or Multiwrite.

The circuit in the embodiment of FIG. 26 is suited to perform a modification to the Output instruction that is also useful with applications such as search-and-retrieval or graphics, which is called Output_Unique. That instruction allows the associative memory circuit to output only words that are unique, i.e., without duplication. The ordinary Output instruction outputs words, eight bits at a time, until all words that have their match bits (M) set are output. Output_Unique works in much the same way, except that when the first tagged word is being output, the circuit is capable of comparing that word to all remaining words that are tagged for output, that is, all other words with M set. If there is a match, then the duplicate word awaiting output is removed from the output list by resetting its M bit. As each subsequent word is outputted, the procedure is repeated.

The circuit implements the Output_Unique instruction as follows: As a word with M set is outputted, each cell's Master is loaded then cleared, readying it for setting if the cell's word matches the outputted word. Then, the complement of M is ORed with Master by asserting B, and the result is inverted and loaded into both Master and M by asserting MCk, followed by B and C together, followed by MCk.

All output instructions use the priority circuit. The topmost word cell that has M set will output through the write/output transistors 223 of FIG. 27, as in standard DRAMs. When a word cell such as that shown in FIGS. 26 or 33 has topmost priority, the signal "NOT(E AND Deny)" will be high. As the data are outputted, the M bit is cleared by the following sequence: M is copied into Master, and the signal NOT(E AND Deny) clears Master, which is copied into M. Note that this logic and the M bit replaces the column decoder of standard DRAMs, which therefore can be, and preferably should be, omitted.

The preferred circuit can also be controlled to continuously output data whenever the bus is free, and to wait, if it is busy-a function usually handled by DMA requests overseen by the CPU. Such maximal bus utilization is accomplished using an instruction called Output_DMA. The instruction allows the CPU to off-load the DMA chores to the preferred circuit, and allows for CPU utilization of what would otherwise be interrupt response time and polling response time. Also, the preferred circuit makes maximum use of other bus-idle times for outputting data.

Immediately upon receipt of the Output_DMA instruction, each word cell is "armed" for automatic DMA by transferring a copy of the match bit to the R bit, shown in FIG. 34. That is accomplished by copying M into Master and then asserting RCk. The host CPU can now continue issuing a sequence of other instructions to the memory circuit. At any time thereafter, the CPU may request that data output continue by asserting a DMA_Req signal on a pin of the memory circuit. As long as DMA_Req is asserted and more data remains for output, as indicated by words with R set, data will be outputted whenever the bus is idle. Those conditions will be reflected by the memory circuit asserting a signal on its DMA_Grant pin asserted, asserting a signal on its OR_match pin (which indicates that there is at least one byte remaining for output), and placing valid output data on the output bus. This process will continue until no more data remains for output, as indicated by the absence of words with R remaining set.

The preferred circuitry and the associated Output_DMA instruction allows output of data as soon as possible without disturbing a main instruction sequence performed by the memory. No longer need the CPU stop the memory for an arbitrary number of cycles just to get data from it.

That operation is particularly useful in the graphics application. There, words representing facets must be passed from the memory circuits to the span processor circuitry repeatedly, but the processors must use the memory circuits intensively for calculation as well, such as the background and foreground programs discussed above. Using the circuitry illustrated in FIG. 25 together with the preferred memory of FIG. 26, the Output_DMA instruction can be issued, allowing the memory circuit to pass to SP circuit 102 of FIG. 25 a group of facets that begin along the scan line in question within the 1/160th of the line identified by the counter, which facets will be tagged with the R bit.

The circuitry illustrated in FIG. 34 can also be used to perform transfer operations. A bit can be transferred to the same side (left or right), or to the other side of the word cell. To transfer one bit between bytes in each qualified cell, three procedures must be accomplished: pre-clearing the destination bit, reading the source bit into Master, and writing Master into the destination bit. The circuit is controlled as discussed above in connection with Output-type instructions to read the source bit into Master.

The destination bit in qualified cells is pre-cleared by the following procedure: First, set Master by asserting both A and B control signals, and assert MCk. Asserting Write/ Output with a mask bit of one and a data bit of zero at the destination bit position will clear it.

Master may be written into the destination bit by using a logical OR between Master and the pre-cleared destination bit, as follows: Master is copied into M by asserting MCk, and the control signal Write/Output is asserted, with a mask bit and a data bit set to one in the destination-bit position.

The reading and writing operations can be overlapped in two microsteps. In the first, while the source bit propagates through the comparator logic, Master is set and copied into M, and then MCk is negated. The source bit is then copied into Master as above. In the second microstep, in qualified cells, the destination bit is cleared in the first half of the microstep using the previously set M, then Master is copied into M, setting it to the source bit.

It is also possible to transfer a full byte in the same physical column. A byte can be read from the DRAM storage cells into sense amplifiers 211 and refreshed back into its place. Then, if the cell is qualified, it is possible to write the same byte into another location, so long as it is connected to the same sense amps. Cells not qualified should not write the data into the second byte; each cell's writing is individually controlled.

As noted briefly above, one of the principle benefits of the preferred circuit is that it can perform arithmetic operations as part of the hardware design, rather than through the use of an algorithm of memory operations. FIG. 35 (FIG. 26 with all extraneous logic removed when LLo and RHi are asserted and RLo and LHi are not asserted) illustrates the circuitry used for arithmetic operations.

The hardware adder consists of the set-clear flip-flop called "Carry" and its inputs, and the three-input exclusive-OR gate 233. The two groups of four comparators 221 act as multiplexers selecting particular bits to pass on upper and lower lines 219, which become the two inputs of the adder. For example, in the bottom group of comparators 221, exactly one of the bits MaskBus[3 to 0] or DataBus[3 to 0] is asserted to cause the inputting of one of the bits from the low nibble of the byte that is stored in the sense amplifiers 211 shown on the right side of FIG. 35. Asserting a DataBus bit (such as signal D1 in FIG. 28) will input the sense amplifier's value, while asserting a MaskBus bit (such as signal M1 in FIG. 28) will input the complement of the sense amplifier's value to the adder. Note also that asserting both DataBus and MaskBus of the same bit will force a zero on the input to the adder, and not asserting any of the bits MaskBus[3 to 0] or DataBus[3 to 0] will force a one on the input. The upper comparators 221 of FIG. 35 use MaskBus[7 to 4] and DataBus[7 to 4] analogously.

To add the top bit stored in the left sense amplifiers to the top bit stored in the right sense amplifiers of FIG. 35—where, say, the byte in the left sense amplifiers is in natural format and the byte in the right sense amplifiers is in the swapped format—the following process is used: First, clear Carry by forcing the adder inputs low and asserting CCk. At this point, it is assumed that Q has been asserted by previous operations, so that QMux is switched to select the output of exclusive-OR gate 233. Second, the bits are selected, in this example by asserting DataBus[0] and DataBus[4]. At the same time, control variables B and C are asserted, which causes Master to act as a D-latch. The output of gate 233 contains the sum of the two data bits (at this point Carry is zero). That sum passes through QMux and InMux and is latched into Master. Third, B and C are negated, and Carry may then be updated with the remainder value of this pair of bits, to be carried over to the next pair. Fourth, CCk is asserted, which clears Carry if both data bits are negated and sets Carry if both data bits are asserted. Carry remains unchanged if the two data bits are opposite. Also, MCk is asserted, to load the sum into M. In the next microstep, M can be written into the lowest bit of the nibble stored in the right sense amplifiers 211, using the process for writing to a single bit described above.

Addition described above is executed in two microsteps per bit. The first step reads in the two bits to be added, and the second step writes back the sum. The process can be repeated three more times to add the next three bits of the byte stored in the left sense amplifiers to the next three bits of the byte stored in the right sense amplifiers. Then by asserting RLo and LHi, the nibble below that shown on the left of FIG. 35 can be added to the nibble above that shown on the right of that figure, and the process above is repeated for those nibbles.

The entire process can be repeated to add multiple-byte numbers. Addition of N bits takes 2N microsteps. If each microstep takes a quarter of a refresh operation, two bits can be added in each refresh operation.

Note that the adder's architecture is such that it is not possible to get two numbers located in even column numbers into the same sense amps at the same time so their bits can be put into the adder in a single microstep. That restriction means that one nibble must use the high (whether left or right) sense amps and the other nibble use the low sense amps, so they can both be fed to the two inputs of the adder by means of the two separate lines 219. For example, the least significant bit of one number may be in bit position 0 and the least significant bit of the other number be in bit position 4.

Thus it is convenient to use a swapped format for arithmetic, in addition to the "natural" format where a number's bits are stored in consecutive order. For example, if a natural-ordered number is (in hexadecimal C notation) 0x76543210, that same number is 0x67452301 if each byte is in fully swapped order, just swapping the nibbles in each byte.

Alternatively or additionally, a pair of numbers to be added together can be misaligned, so that one begins in an even column number and the other in an odd column number and all bytes stored in an odd column number are stored in swapped format while all bytes stored in an even column are in natural order. For instance, the natural-order number above, beginning on an odd byte, is added to another natural-order number (say, 0xFEDCBA98), beginning on an even byte. In that case, the two numbers would be physically stored as 0x67542310 beginning on an odd byte and 0xFECDBA89 beginning on an even byte.

Thus, it is possible to configure the hardware so that all data stored in odd bytes will be automatically swapped, whether used in addition or not. That approach can make the need for an offset transparent to the user.

In processing consecutive bits of the number, it is usually convenient to access the low nibble of an even byte in the left sense amps while accessing the high nibble on an odd byte in the right sense amps, or vice versa, while adding consecutive nibbles. For example, the circuitry might be controlled to add nibble 0, stored as the low nibble in the left sense amps, to nibble 8, stored as the high nibble in the right sense amps. Then, the circuitry adds nibble 1, stored as the high nibble in the left sense amps, to nibble 9, stored as the low nibble in the right sense amps. Next, the circuit adds nibble 2 to nibble A, nibble 3 to nibble B, and so on.

Twos-complement subtraction can be performed in place of addition by the following procedure: preset Carry, input the complement of the subtrahend bits, and assert MaskBus in place of DataBus lines. The two separate four-bit comparators are also able to complement one or the other input to the adder to effect subtraction.

Greater-than comparison between two numbers can be executed by subtracting and testing the final value of Carry. This value can be moved to Master after all bits are compared by negating both adder inputs and executing an add microstep. Note that for comparison, the difference obtained from the subtraction is not put back into memory. Omission of the write microstep allows execution of a magnitude-comparison operation in a single microstep per bit.

To add, subtract, or compare the magnitude of a constant to all words, the corresponding operation is done for addition, subtraction, or comparison of two variables in each word as discussed above. However, the constant is defined by the following method: For each bit equal to one, none of the DataBus or MaskBus lines is asserted, and for each bit equal to zero, both the DataBus and the MaskBus line in the same bit position are asserted.

The multiplication routine uses addition and another operation, shift right, in which the bit passed to Master during the addition operation is written into the bit position immediately to the right of its origin. If a word is just being shifted and not being added, then its Q must be zero, rather than a one, so that the low four-bit input being added can be put into Master. Whether the sum is put into Master or the unmodified low-nibble input is put there, the value in Master can be written one bit to the right. Thus, both add-and-shift and shift operations can be performed in two microsteps, just like the simple add.

However, when operating on the least significant bit of each byte, an extra pair of refresh instructions is required, to access the most significant bit of the next-least-significant byte, to write out the shifted bit, and then to resume the operation on the remaining seven bits of the current byte. To avoid that additional overhead, it is possible to move the multiplier into a double-width field with the partial product, so that consecutive multiplier nibbles occupy the high nibble of consecutive bytes and the cleared partial product occupies the low nibbles of the double-width field. For example, if the (natural order) multiplier is 0xFEDCBA98, it is stored in such a field as 0xF0E0D0C0B0A09080. Such initialization requires only moving a whole byte from the multiplier to the field and swapping bits between left and right sense amps in neighboring bytes. The partial product and multiplicand remain in this format. Multiplication's many add-and-shift or shift operations can be executed on the partial product without unswapping or moving the partial product. The product can be returned to a natural-order field by swapping bytes in alternate bytes and moving bytes, reversing the initialization steps.

Division, however, does not permit simultaneous addition and shifting because the shifted bit overwrites one of the bits about to be added. Division may be done with a double-width field, nevertheless, because the long-division algorithm is not significantly slowed by doing arithmetic in such a field, and the alternative, performing the addition step of division using the swapped format requires more cell hardware.

To implement non-restoring division, the partial product bit or its complement are conditionally written one bit position to the left. FIG. 35's cell design achieves that result by using the three-input exclusive-OR gate 233 as an inverter, so that QMux can select either the output of the lower comparator or its complement. Carry is cleared. The high-nibble comparator outputs a one by negating both mask and data lines. The low nibble's complement is output from gate 233.

It is understood by those skilled in the art that numerous alternate forms and embodiments of the invention can be devised without departing from its spirit and scope.

We claim:

1. A graphics apparatus suitable for rendering, on a display driven by display signals, a scene in at least three dimensions containing multiple objects, comprising:

(a) memory means for storing a plurality of multiple-bit words in multiple-bit word storage locations, each of which words contains data identifying the multi-axis location of the vertices of a polygonal facet of an object in a scene; and (b) control means, electronically coupled to the memory means and to the display, for (1) controlling the selection and the outputting from the memory means of a word that contains data representing the select facet at least a portion of which is visible at a selected pixel of the display, regardless of the order in which the facet data are stored in the words of the memory means, and regardless of the numbers of pixels to which the facet will be displayed, (2) generating display signals corresponding to the select facet, and (3) controlling the transmittal of the display signals to drive the display.

2. The apparatus of claim 1 wherein the memory means comprises at least one content-searchable memory on an integrated circuit.

3. The apparatus of claim 2 wherein the memory means comprises at least one associative memory on an integrated circuit.

4. The apparatus of claim 2 wherein the memory means includes means controllable for mathematically manipulating the vertices data, in parallel, to effect at least one of the following graphical operations: rotation, magnification, translation, and projection onto a two-dimensional view port.

5. The apparatus of claim 1 wherein the memory means includes means for indicating all memory locations containing a match between a comparand and the data.

6. The apparatus of claim 1 wherein the memory means includes refresh means integrated on a single semiconductor chip for periodically refreshing the data at each location of the memory means, and wherein the control means operates to command operations of the memory means while the refresh means is refreshing the data.

7. The apparatus of claim 1 wherein the control means includes at least an integrated processor circuit having a program store containing at least one sequence of instructions for the processor circuit to control the memory means to select the word.

8. The apparatus of claim 7 wherein the control means includes means for repeatedly identifying the visible facet at all pixels along a scan line extending across the display.

9. The apparatus of claim 8 wherein the sequence of instructions causes the word representing the selected facet to be maintained as the selected word until another facet becomes visible at a particular point along the line, and then causes the other word to replace the selected word.

10. The apparatus of claim 1 wherein the display signals generated by the control means includes a color representing the color of the selected facet.

11. The apparatus of claim 10 wherein the color is determined by Gouraud shading.

12. The apparatus of claim 1 wherein:

(a) the memory means comprises a plurality of banks, each comprising at least one solid state memory device;

(b) the control means includes means for selecting the word containing data representing the visible facet from among words stored in the device of each bank; and (c) the control means further comprises means for swapping banks, so that data can be placed into one of the banks while the means for selecting the visible facet examines the words stored in the device of another of the banks.

13. The apparatus of claim 1 wherein the control means further comprises means for selecting the facet from among a subset of words that are marked.

14. The apparatus of claim 13 wherein the control means further comprises means for unmarking words associated with objects that do not overlap any point in the display.

15. The apparatus of claim 1 wherein the control means further comprises means for clipping facets that overlap the edge of the display.

16. A graphics apparatus suitable for rendering, on a display device displaying a image, which is responsive to electronic display signals, a scene containing multiple objects in at least three dimensions comprising:

(a) an integrated circuit implementing a content-searchable memory, which memory contains a plurality of multiple-bit storage locations organized as words, each of which words being structured so as to be capable of containing data representing the multi-axis location of the vertices of a polygonal facet of an object in the scene and display information concerning the facet; and (b) a span processor, electronically coupled to the memory and to the display device, structured to produce, for each part of a scan line of the image, display signals in accordance with the display information data from the select word representing the particular facet of an object that is visible at that part, regardless of the order in which the facet data are stored in the words of the memory and regardless of how many pixels along the scan line the visible facet covers.

17. The apparatus of claim 16 wherein the content-searchable memory is integrated on a single semiconductor chip that requires refreshing to retain data and further includes:

(a) an addressing circuit integrated on the chip structured to periodically address each of the storage locations; and (b) a plurality of sense amplifiers integrated on the chip, one of which is associated with each of said locations and is connectable thereto by said addressing circuit.

18. The apparatus of claim 17 wherein the memory is structured to store a plurality of multiple-bit words, each in a row of a bit array, and further comprising a refresh circuit coupled to the sense amplifiers and structured to refresh at least one column of the bit array at a time, and wherein the span processor is structured to control the memory and cause the memory to output data from the select word while said refresh circuit is refreshing the bit array.

19. The apparatus of claim 16 further comprising another integrated circuit implementing a content-searchable memory and wherein said span processor is coupled to both memories and structured to produce display signals from the select word regardless of which integrated circuit stores the select word.

20. A method of rendering, on a two-dimensional rasterized display, a scene in at least three dimensions containing multiple objects, comprising:

(a) storing a plurality of multiple-bit words in multiple-bit word storage locations of a memory circuit, each of which words contains data identifying the multi-axis location of the vertices of a polygonal facet of an object in the scene;

(b) in parallel for at least a plurality of words, altering the location data stored therein to represent the locations at which the associated facets would be projected onto a view port when viewed from a selected multi-axis location representing a viewpoint;

(c) in parallel, identifying all words associated with projected facets that overlap a select location along a scan line across the view port, regardless of the order in which the facet data are stored in the words of the memory circuit, and regardless of the numbers of locations along the scan line to which the facet would be projected;

(d) selecting, from among the identified words, the word associated with the facet that is closest to the viewpoint and generating corresponding display signals;

(e) repeating parts (c) and (d) for a series of adjacent locations along the scan line and for a plurality of scan lines; and (f) applying the resulting sequence of display signals to electronically display on a screen a two-dimensional image of the scene visible from the viewpoint through the view port.

21. The method of claim 20 further comprising, in parallel, searching for and marking in the memory circuit all words associated with facets that overlap any of a group of selected locations and extracting those marked facets from the memory circuit for performance of parts (c) and (d).

22. The method of claim 20 wherein parts (c) through (e) include:

(a) repeatedly incrementing a location along a scan line extending across the view port;

(b) loading words into a selection circuit when the location being incremented crosses an edge of the projected facets stored in those words;

(c) removing words from the selection circuit when the location being incremented crosses another edge of the projected facets stored in those words; and (d) operating the selection circuit at each increment.

23. The method of claim 20 further comprising selecting the plurality of words identified in part (b) by, in parallel, searching for those words associated with objects that do not overlap any portion of the view port and marking the remaining words in the memory circuit for selection.

24. The method of claim 23 further comprising unmarking any word associated with a facet that, when projected onto a viewplane containing the view port, falls outside the view port, and unmarking any word associated with a facet that, with respect to the viewpoint, is hidden by other facets associated with the facet's object.

25. A graphics apparatus suitable for rendering into a frame buffer structured to store pixels for use by a display device in displaying a representation of a scene containing multiple objects in at least three dimensions comprising:

(a) an integrated circuit implementing a content-searchable memory, which memory contains a plurality of multiple-bit storage locations that are organized as words, each of which words being structured so as to be capable of containing data representing the multi-axis location of the vertices of a polygonal facet of an object in the scene and display information concerning the facet;

(b) at least one processing circuit element coupled to each multiple-bit storage location of the memory, which circuit elements are integrated on the integrated circuit and structured to search the words in parallel; and (c) a span processor, electronically coupled to the processing circuit elements of the memory and to the frame buffer, structured to produce, for each portion of a scan line across the frame buffer, pixels in accordance with the display information data from a select word representing the particular facet of an object that is there visible, regardless of the order in which the facet data are stored in the words of the memory and regardless of the number of pixels along the scan line to which the visible facet will be rendered.

\* \* \* \* \*